United States Patent
Park et al.

(10) Patent No.: US 12,448,566 B2
(45) Date of Patent: Oct. 21, 2025

(54) QUANTUM DOT-CONTAINING MATERIAL, AND COMPOSITION AND ELECTRONIC DEVICE INCLUDING THE SAME

(71) Applicant: Samsung Display Co., Ltd., Yongin-si (KR)

(72) Inventors: Chulsoon Park, Yongin-si (KR); Donghee Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 972 days.

(21) Appl. No.: 17/560,951

(22) Filed: Dec. 23, 2021

(65) Prior Publication Data

US 2022/0228052 A1    Jul. 21, 2022

(30) Foreign Application Priority Data

Jan. 8, 2021    (KR) .......................... 10-2021-0002580

(51) Int. Cl.
| | |
|---|---|
| *C09K 11/70* | (2006.01) |
| *B82Y 20/00* | (2011.01) |
| *B82Y 30/00* | (2011.01) |
| *B82Y 40/00* | (2011.01) |
| *C01G 15/00* | (2006.01) |
| *C09K 11/02* | (2006.01) |
| *H10K 50/11* | (2023.01) |
| *H10K 50/115* | (2023.01) |
| *H10K 59/12* | (2023.01) |

(Continued)

(52) U.S. Cl.
CPC .............. *C09K 11/70* (2013.01); *C01G 15/00* (2013.01); *C09K 11/025* (2013.01); *B82Y 20/00* (2013.01); *B82Y 30/00* (2013.01); *B82Y 40/00* (2013.01); *C01P 2004/64* (2013.01); *C01P 2006/60* (2013.01); *H10K 50/11* (2023.02); *H10K 50/115* (2023.02); *H10K 59/12* (2023.02); *H10K 2101/10* (2023.02); *H10K 2102/00* (2023.02)

(58) Field of Classification Search
CPC ..................................................... C09K 11/025
See application file for complete search history.

(56) References Cited

U.S. PATENT DOCUMENTS

| | | | |
|---|---|---|---|
| 8,470,442 B2 * | 6/2013 | Lee .......................... | B22F 1/16 428/407 |
| 9,139,670 B2 | 9/2015 | Joly et al. | |
| 10,011,674 B2 * | 7/2018 | Viswanath ............ | C08F 292/00 |

(Continued)

FOREIGN PATENT DOCUMENTS

| | | |
|---|---|---|
| CN | 105733557 A | 7/2016 |
| CN | 108102640 A | 6/2018 |

(Continued)

OTHER PUBLICATIONS

Guan et al., Macromol. Chem. Phys. 2016, 217, 664-671.*

(Continued)

*Primary Examiner* — Vu A Nguyen
(74) *Attorney, Agent, or Firm* — Womble Bond Dickinson (US) LLP

(57) ABSTRACT

A quantum dot-containing material includes: a quantum dot; and at least one ligand chemically bonded to the surface of the quantum dot and represented by a certain formula. A composition and an electronic apparatus, each include the quantum dot-containing material.

20 Claims, 5 Drawing Sheets

(51) Int. Cl.
*H10K 101/10* (2023.01)
*H10K 102/00* (2023.01)

(56) References Cited

U.S. PATENT DOCUMENTS

| | | | |
|---|---|---|---|
| 2010/0317175 A1 | 12/2010 | Sargent et al. | |
| 2015/0185381 A1* | 7/2015 | Wu .................. | G02F 1/133617 977/774 |
| 2015/0232756 A1 | 8/2015 | Guo et al. | |
| 2018/0079868 A1 | 3/2018 | Yamada et al. | |
| 2018/0079960 A1 | 3/2018 | Lan | |
| 2018/0148638 A1 | 5/2018 | Ahn et al. | |
| 2020/0231871 A1* | 7/2020 | Kim .................. | C08F 292/00 |
| 2020/0332181 A1* | 10/2020 | Zhang ................ | C09D 11/50 |

FOREIGN PATENT DOCUMENTS

| | | |
|---|---|---|
| CN | 111320981 A | 6/2020 |
| EP | 2414278 B1 | 11/2019 |
| KR | 10-2013-0132547 A | 12/2013 |
| KR | 10-2018-0002716 A | 1/2018 |
| KR | 10-1898746 B1 | 9/2018 |
| KR | 10-2020-0072856 A | 6/2020 |
| KR | 10-2020-0073982 A | 6/2020 |

OTHER PUBLICATIONS

Sigma-Aldrich's article entitled "Quantum Dots", available at https://www.sigmaaldrich.com/us/en/technical-documents/technical-article/materials-science-and-engineering/biosensors-and-imaging/quantum-dots.*

Andrea L. Rodarte et al., "Tuning Quantum-Dot Organization in Liquid Crystals for Robust Photonic Applications", ChemPhysChem, 2014, 10 pages, Wiley-VCH Verlag GmbH & Co. KGaA, Weinheim.

Chinese Office Action dated May 22, 2024, issued in corresponding Chinese Patent Application No. 202111646231.6, 5 pages.

Lior Verbitsky et al., A Clear Solution: Semiconductor Nanocrystals as Photoinitiators in Solvent Free Polymerization, Nanoscale Accepted Manuscript, May 27, 2019, pp. 1-20, Royal Society of Chemistry. (DOI: 10.1039/C9NR03086G).

Fabien Dubois et al., A Versatile Strategy for Quantum Dot Ligand Exchange, JACS Communications, Dec. 23, 2006, pp. 482-483, vol. 129, No. 3, Journal of American Chemical Society.

* cited by examiner

QUANTUM DOT-CONTAINING MATERIAL, AND COMPOSITION AND ELECTRONIC DEVICE INCLUDING THE SAME

CROSS-REFERENCE TO RELATED APPLICATION

This application claims priority to and the benefit of Korean Patent Application No. 10-2021-0002580, filed on Jan. 8, 2021, in the Korean Intellectual Property Office, the disclosure of which is incorporated by reference herein in its entirety.

BACKGROUND

1. Field

One or more embodiments relate to a quantum dot-containing material, and a composition and an electronic apparatus, each including the quantum dot-containing material.

2. Description of the Related Art

Quantum dots are nanocrystals of semiconductor materials and exhibit a quantum confinement effect. When quantum dots reach an excited energy state by receiving light from an excitation source, they emit energy according to a corresponding energy band gap by themselves. In this regard, even in the same material, the wavelength varies depending on the particle size, and accordingly, by adjusting the size of quantum dots, light having the desired wavelength range may be obtained, and desired (e.g., excellent) color purity and high luminescence efficiency may be obtained. Thus, quantum dots may be applicable to various suitable devices.

In addition, a quantum dot can be utilized as a material that performs various suitable optical functions (for example, a photo-conversion function) in optical members. Quantum dots, as nano-sized semiconductor nanocrystals, may have different energy band gaps by adjusting the size and composition of the nanocrystals, and thus may emit light of various suitable emission wavelengths.

An optical member including such quantum dots may have the form of a thin film, for example, a thin film patterned for each subpixel. Such an optical member may be utilized as a color conversion member of a device including various suitable light sources.

SUMMARY

Aspects according to one or more embodiments are directed toward a quantum dot-containing material, of which stability is enhanced by introducing an initiator moiety to a ligand chemically bonded to the surface of the quantum dot. Aspects according to one or more embodiments are directed toward a composition and an electronic apparatus, for each of which the quantum yield is increased by employing the quantum dot-containing material.

Additional aspects will be set forth in part in the description, which follows and, in part, will be apparent from the description, or may be learned by practice of the presented embodiments of the disclosure.

In one or more embodiments, a quantum dot-containing material includes a quantum dot, and at least one ligand chemically bonded to the surface of the quantum dot, and represented by Formula 1.

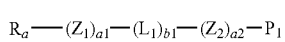

Formula 1

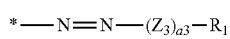

Formula 2-1

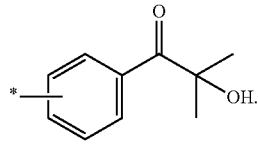

Formula 2-2

In Formulae 1, 2-1, and 2-2, $R_a$ may be an anchoring group including a moiety represented by —COOH, —PO$_3$H, a dithiolane group, or —SH, $L_1$ may be *—(CH$_2$)$_{n1}$—*' or *—(O—CH$_2$—CH$_2$)$_{n1}$—O—*', b1 may be an integer from 1 to 5, $P_1$ may be a group represented by Formula 2-1 or 2-2, $Z_1$ to $Z_3$ may each independently be selected from *—O—*', *—C(=O)—*', *—C(=O)O—*', *—OC(=O)—*', *—O—C(=O)—O—*', *—OCH$_2$—*', *—SCH$_2$—*', *—CH$_2$S—*', *—CF$_2$O—*', *—OCF$_2$—*', *—CF$_2$S*', *—SCF$_2$—*', *—(CH$_2$)$_{n1}$*', *—CF$_2$CH$_2$—*', *—CH$_2$CF$_2$—*', *—(CF$_2$)$_{n1}$*', *—C(CH$_3$)CN—*', *—CH=CH—*', *—CF=CF—*', *—C≡C—*', *—CH=CH—C(=O)O—*', *—OC(=O)—CH=CH*', *—C(Q$_1$)(Q$_2$)-*', and *—O—(CH$_2$)—O(C=O)—(CH$_2$)$_{n2}$—*', n1 may be an integer from 1 to 6, and n2 may be an integer from 0 to 2, a1 to a3 may each independently be an integer from 0 to 6, $R_1$ may be *—(CH$_2$)$_{n3}$—CH$_3$, or *—(O—CH$_2$—CH$_2$)$_{n1}$—OH, and n3 may be an integer from 0 to 5, wherein $Q_1$ and $Q_2$ may each independently be selected from hydrogen, deuterium, —F, —Cl, —Br, —I, a hydroxyl group, a cyano group, a nitro group, an amino group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group, and

* and *' may each indicate a binding site to a neighboring atom.

In one or more embodiments, a composition includes the quantum dot-containing material, and at least one solvent.

In one or more embodiments, an electronic apparatus includes the quantum dot-containing material.

In one or more embodiments, the electronic apparatus may further include a light-emitting device including a first electrode, a second electrode facing the first electrode, an emission layer between the first electrode and the second electrode, wherein the quantum dot-containing material may be included in the emission layer.

In one or more embodiments, the electronic apparatus may further include a light source, and the quantum dot-containing material may be located on (e.g., to cross) the path of light emitted from the light source.

In one or more embodiments, the quantum dot-containing material may be included in a color conversion layer.

In one or more embodiments, the light source may be an organic light-emitting device (OLED) or a light emitting diode (LED).

BRIEF DESCRIPTION OF THE DRAWINGS

The above and other aspects, features, and enhancements of certain embodiments of the disclosure will be more apparent from the following description taken in conjunction with the accompanying drawings, in which.

DETAILED DESCRIPTION

Figure 1:
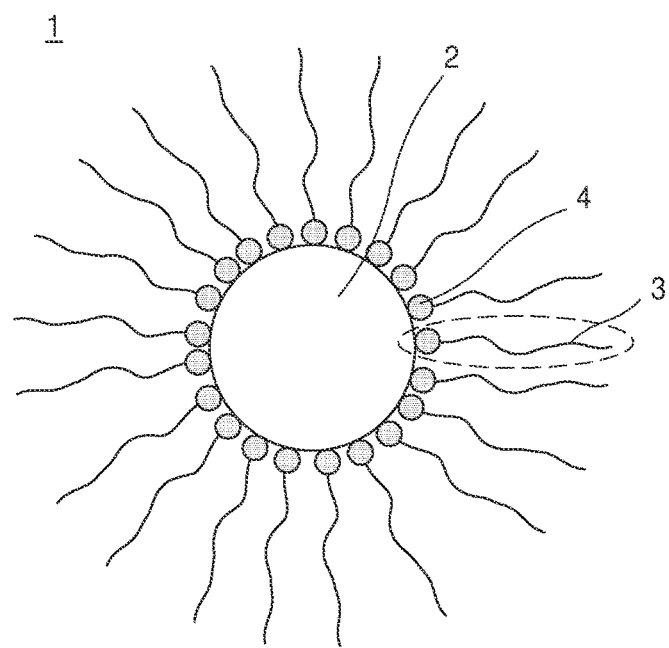
FIG. 1 is a diagram schematically illustrating the structure of a quantum dot-containing material according to an embodiment.

Reference will now be made in more detail to embodiments, examples of which are illustrated in the accompanying drawings, wherein like reference numerals refer to like elements throughout the specification. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Because the disclosure may have diverse modified embodiments, embodiments are illustrated in the drawings and are described in the detailed description. An effect and a characteristic of the disclosure, and a method of accomplishing these will be apparent when referring to embodiments described with reference to the drawings. The disclosure may, however, be embodied in many different forms and should not be construed as limited to the embodiments set forth herein.

One or more embodiments of the disclosure will be described below in more detail with reference to the accompanying drawings. Those components that are the same (or substantially similar) or are in correspondence with each other are rendered the same (or substantially similar) reference numeral regardless of the figure number, and redundant explanations are omitted (not provided).

It will be understood that although the terms "first," "second," etc. may be used herein to describe various suitable components, these components should not be limited by these terms. These components are only used to distinguish one component from another.

An expression used in the singular encompasses the expression of the plural, unless it has a clearly different meaning in the context.

It will be further understood that the terms "comprises" and/or "comprising" as used herein specify the presence of stated features or elements, but do not preclude the presence or addition of one or more other features or elements.

In the following embodiments, when various suitable components such as layers, films, regions, plates, etc. are said to be "on" another component, this may include not only a case in which other components are "immediately on" the layers, films, regions, or plates (e.g., without any intervening elements therebetween), but also a case in which other components may be placed therebetween. Sizes of elements in the drawings may be exaggerated for convenience of explanation. In other words, because sizes and thicknesses of components in the drawings are arbitrarily illustrated for convenience of explanation, the following embodiments are not limited thereto.

Quantum Dot-Containing Material

FIG. 1 is a diagram schematically illustrating the structure of a quantum dot-containing material according to an embodiment of the present disclosure.

Referring to FIG. 1, a quantum dot-containing material 1 includes: a quantum dot 2; and at least one ligand 3 chemically bonded to the surface of the quantum dot 2 and represented by Formula 1:

$$R_a-(Z_1)_{a1}-(L_1)_{b1}-(Z_2)_{a2}-P_1 \qquad \text{Formula 1}$$

wherein, in Formula 1, $R_a$ may be an anchoring group 4 including a moiety represented by —COOH, —PO$_3$H, a dithiolane group, or —SH.

In this regard, the anchoring group 4 is a binding group that allows the ligand 3 to be attached (e.g., adsorbed) onto the quantum dot 2 when the ligand 3 binds to the quantum dot 2.

In one or more embodiments, $R_a$ may be selected from —COOH, —PO$_3$H, —SH, or a group represented by one of Formulae 3-1 to 3-4:

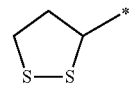

3-1

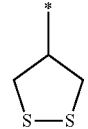

3-2

-continued

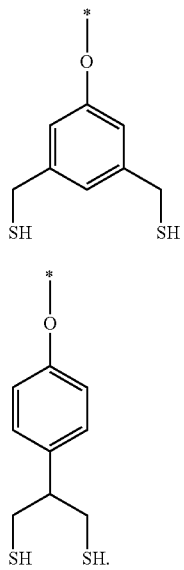

In Formulae 3-1 to 3-4,
* indicates a binding site to a neighboring atom.
For example, $R_a$ may be —SH.
$L_1$ in Formula 1 may be *—$(CH_2)_{n1}$—*', or *—(O—$CH_2$—$CH_2)_{n1}$—O—*'.

When $L_1$ is *—$(CH_2)_{n1}$—*', the polarity of the quantum dot-containing material may be decreased, and when $L_1$ is *—(O—$CH_2$—$CH_2)_{n1}$—O—*', the polarity of the quantum dot-containing material may be increased.

b1 in Formula 1 may be an integer from 1 to 5.

b1 indicates the number of Li(s), wherein when b1 is 2 or more, two or more of $L_1$(s) may be identical to or different from each other.

$P_1$ in Formula 1 may be a group represented by Formula 2-1 or 2-2.

Formula 2-1

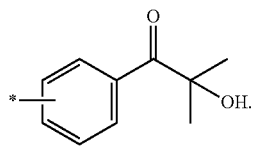

Formula 2-2

$P_1$ is a group that is decomposed by exposure (hv) (e.g., exposure to light) or heat to form a radical.

For example, a group represented by Formula 2-1 may be decomposed by heat to form two radicals while releasing $N_2$.

For example, a group represented by Formula 2-2 may be decomposed by exposure (hv) (e.g., exposure to light) to form radicals based on the following mechanism.

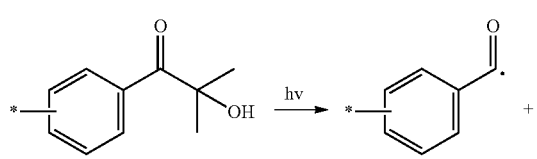

wherein, in Formulae 1, 2-1, and 2-2, $Z_1$ to $Z_3$ may each independently be selected from *—O—*', *—C(=O)—*', *—C(=O)O—*', *—OC(=O)—*', *—O—C(=O)—O—*', *—$OCH_2$—*', *—$SCH_2$—*', *—$CH_2S$—*', *—$CF_2O$—*', *—$OCF_2$—*', *—$CF_2S$*', *—$SCF_2$—*', *—$(CH_2)_{n1}$*', *—$CF_2CH_2$—*', *—$CH_2CF_2$—*', *—$(CF_2)_{n1}$*', *—$C(CH_3)CN$—*', *—CH=CH—*', *—CF=CF—*', *—C≡C—*', *—CH=CH—C(=O)O—*', *—OC(=O)—CH=CH*', *—$C(Q_1)(Q_2)$-*', and *—O—$(CH_2)$—O(C=O)—$(CH_2)_{n2}$—*'.

In one or more embodiments, $Z_1$ may be *—$(CH_2)_{n1}$—*'.

In one or more embodiments, $Z_2$ and $Z_3$ may each independently be *—O*', *—C(=O)O—*', *—OC(=O)—*', *—$(CH_2)_{n1}$*', or *—$C(CH_3)CN$—*'.

In one or more embodiments, *—$(Z_2)_{a2}$—*' and *—$(Z_3)_{a3}$—*' may each independently be a group represented by one of Formulae 4-1 to 4-4:

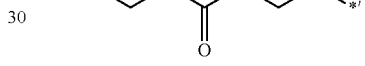

4-1

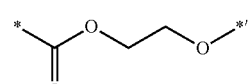

4-2

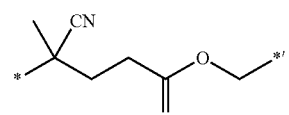

4-3

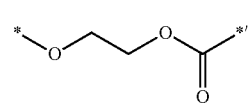

4-4

In Formulae 4-1 to 4-4,
* and *' each indicate a binding site to a neighboring atom.

In Formulae 1 and 2-1 to 2-2, n1 may be an integer from 1 to 6, and n2 may be an integer from 0 to 2, and a1 to a3 may each independently be an integer from 0 to 6.

a1 to a3 indicate numbers of $Z_1$ to $Z_3$, respectively, and when a1 is 2 or more, the two or more of $Z_1$(s) may be identical to or different from each other, when a2 is 2 or more, the two or more of $Z_2$(s) may be identical to or different from each other, when a3 is 2 or more, the two or more of $Z_3$(s) may be identical to or different from each other, when a1 is 0, —$(Z_1)_{a1}$— may be a single bond, when a2 is 0, —$(Z_2)_{a2}$— may be a single bond, and when a3 is 0, —$(Z_3)_{a3}$— may be a single bond.

In Formula 2-1, $R_1$ may be *—$(CH_2)_{n3}$—$CH_3$, or *—(O—$CH_2$—$CH_2)_{n1}$—OH, and n3 may be an integer from 0 to 5.

When $R_1$ is *—$(CH_2)_{n3}$—$CH_3$, the polarity of the quantum dot-containing material may be decreased, and when $R_1$ is *—(O—CH$_2$—CH$_2$)$_{n1}$—OH, the polarity of the quantum dot-containing material may be increased.

Q$_1$ and Q$_2$ may each independently be selected from hydrogen, deuterium, —F, —Cl, —Br, —I, a hydroxyl group, a cyano group, a nitro group, an amino group, an amidino group, a hydrazine group, a hydrazone group, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_1$-C$_{60}$ heteroaryl group, a monovalent non-aromatic condensed polycyclic group, a monovalent non-aromatic condensed heteropolycyclic group, a biphenyl group, and a terphenyl group, and * and *' may each indicate a binding site to a neighboring atom.

d1 in Formula 1 may be an integer from 0 to 4.

In one or more embodiments, the ligand 3 may be represented by Formula 1A or 1B:

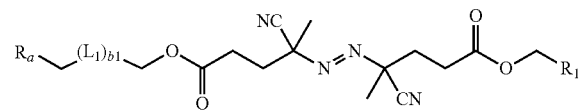

Formula 1A

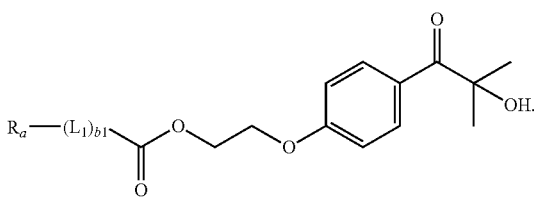

Formula 1B

In Formulae 1A and 1B,

R$_a$, L$_1$, b1, and R$_1$ are the same as described above.

In one or more embodiments, the ligand 3 may include two or more ligands, and the two or more ligands included in the ligand 3 may be identical to or different from each other.

In some embodiments, the ligand 3 may be chemically bonded to the surface of the quantum dot 2 through the anchoring group 4.

In one or more embodiments, the quantum dot 2 may be: a semiconductor nanoparticle; a particle having a core-shell structure including a core including a first semiconductor and a shell including a second semiconductor; or a perovskite compound.

In some embodiments, the quantum dot 2 may be a semiconductor nanoparticle or a core-shell structure particle.

In some embodiments, the semiconductor nanoparticle, the first semiconductor and the second semiconductor may each independently include a Group 10 compound, a Group 11 compound, a Group 12-16 compound, a Group 13-15 compound, a Group 14-16 compound, a Group 14 compound, a Group 11-13-16 compound, a Group 11-12-13-16 compound, or any combination thereof.

In some embodiments, the semiconductor nanoparticle, the first semiconductor, and the second semiconductor may each independently include:

Au, Pd, or Ag;

CdS, CdSe, CdTe, ZnS, ZnSe, ZnTe, ZnO, HgS, HgSe, HgTe, MgS, MgSe; CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnS, MgZnSe; CdZnSeS, CdZnSeTe, CdZnSTe, CdHgSeS, CdHgSeTe, CdHgSTe, HgZnSeS, HgZnSeTe, or HgZnSTe;

GaN, GaP, GaAs, GaSb, AlN, AlP, AlAs, AlSb, InN, InP, InAs, InSb; GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP; GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or InZnP;

SnS, SnSe, SnTe, PbS, PbSe, PbTe; SnSeS, SnSeTe, SnSTe, PbSeS, PbSeTe, PbSTe, SnPbS, SnPbSe, SnPbTe; SnPbSSe, SnPbSeTe, or SnPbSTe;

Si, Ge, SiC, or SiGe;

AgInS, AgInS$_2$, CuInS, CuInS$_2$, CuGaO$_2$, AgGaO$_2$, or AgAlO$_2$; or any combination thereof.

In one or more embodiments, the first semiconductor may include CdS, CdSe, CdTe, ZnS, ZnSe, ZnTe, ZnO, HgS, HgSe, HgTe, MgS, MgSe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnS, MgZnSe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof, and the second semiconductor may include CdS, CdSe, CdTe, ZnS, ZnSe, ZnTe, ZnO, HgS, HgSe, HgTe, MgS, MgSe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnS, MgZnSe, CdZnSeS, CdZnSeTe, CdZnSTe, CdHgSeS, CdHgSeTe, CdHgSTe, HgZnSeS, HgZnSeTe, HgZnSTe, or a combination thereof.

In one or more embodiments, the average particle diameter (D50) of the quantum dot 2 may be from about 2 nm to about 10 nm. As used herein, unless otherwise defined, the average particle diameter (D50) refers to a diameter of particles having a cumulative volume of 50% by volume in the particle size distribution. The average particle size (D50) may be measured by a suitable technique, e.g., utilizing a particle size analyzer, transmission electron microscope photography, and/or scanning electron microscope photography. Another method may be performed by utilizing a measuring device with dynamic light scattering, analyzing data to count a number of particles relative to each particle size, and then calculating to obtain an average particle diameter (D50).

An average diameter (D50) of the quantum dot-containing material 1 may be from 40 nm to 1000 nm, for example, from 50 nm to 1000 nm, or from 100 nm to 500 nm. In one or more embodiments, D50 of the quantum dot-containing material 1 may be from 100 nm to 200 nm. When the D50 of the quantum dot-containing material 1 satisfies these ranges, the quantum dot-containing material 1 may have a desired (e.g., excellent) dispersion degree while having a relatively large amount of quantum dot 2.

In the related art, in forming a thin film utilizing a composition containing quantum dots, a composition containing an initiator, a radical scavenger, a reactive monomer, a dispersant, and a ligand substituted quantum dot were utilized. In the thin film formation process utilizing such a composition, the miscibility of the initiator and the solvent is taken into consideration. In this regard, when the dispersion state of the quantum dot and the initiator are non-uniform, the pattern formed by utilizing a thin film may be uneven (e.g., the thin film pattern formed utilizing such composition may be uneven in thickness and/or composition). In addition, the efficiency of quantum dots may be degraded by free radicals.

In the quantum dot-containing material 1, the ligand 3 containing an initiator moiety is placed on the surface of the quantum dot 2 to induce the growth of a polymer on the surface of the quantum dot 2, and at the same time, to protect the quantum dot 2 from the attack by a free radical.

In addition, due to the inclusion of the initiator moiety in the ligand 3, a scavenger or initiator (e.g., a separate scavenger or initiator) is not required, which leads to a reduction in costs and a simplification of the process. Also, because the quantum dot 2 and the initiator moiety are included in the quantum dot-containing material 1, the quantum dot 2 and the initiator moiety may be uniformly distributed.

Accordingly, during the formation of the resulting composition and thin film, the efficiency of the quantum dot-containing material 1 may be retained, and the stability of the quantum dot-containing material 1 may be improved.

In some embodiments, the perovskite compound is a material having a three-dimensional crystal structure associated with the crystal structure of $CaTiO_3$.

In some embodiments, the perovskite may be represented by Formula 4:

$$[A][B_m][X]_3 \qquad \text{Formula 4}$$

wherein, in Formula 4,

A may be at least one of a monovalent organic-cation, a monovalent inorganic-cation, or any combination thereof, B may be at least one divalent inorganic-cation, m is a real number satisfying the condition of $0<m<1$, and X may be at least one monovalent anion.

Composition

According to another embodiment, a composition including the quantum dot-containing material and at least one solvent is provided.

The amount of the quantum dot-containing material in the composition may be from about 0.1 wt % or more to about 20 wt % or less, or from about 0.2 wt % or more to about 10 wt % or less, based on the total weight of the composition. However, the amount of the quantum dot-containing material is not limited thereto. Within these ranges, the composition may be suitable for usage in manufacturing a light-emitting device having sufficient luminescence efficiency in a soluble process (e.g., in a process utilizing a solution of the quantum dot-containing material).

The light-emitting device containing the quantum dot-containing material may provide sufficient luminescence efficiency and/or a long lifespan, due to improved film uniformity, improved charge injection balance, improved quantum dot efficiency affected by a transport layer, and/or improvement in blocking direct contact between an electron-transporting layer (e.g., electron-transport layer) and a hole-transporting layer (e.g., hole-transport layer) due to pores of (e.g., gaps between) the quantum dots.

The kind (e.g., type) of the solvent is not limited as long as the solvent is capable of properly (or suitably) dispersing the quantum dot-containing material.

For example, the solvent may be an organic solvent.

For example, the solvent may include a solvent having a boiling point of about 100° C. or higher and about 180° C. or lower.

In one or more embodiments, the solvent may be selected from a chlorine-based solvent, an ether-based solvent, an ester-based solvent, a ketone-based solvent, an aliphatic hydrocarbon-based solvent, and an aromatic hydrocarbon-based solvent, but embodiments of the present disclosure are not limited thereto.

In one or more embodiments, the solvent may include dichloromethane, 1,2-dichloroethane, 1,1,2-trichloroethane, chlorobenzene, o-dichlorobenzene, cyclohexylbenzene, tetrahydrofuran, dioxane, anisole, 4-methylanisole, butyl phenyl ether, toluene, xylene, mesitylene, ethylbenzene, n-hexylbenzene, cyclohexylbenzene, trimethylbenzene, tetrahydronaphthalene, cyclohexane, methylcyclohexane, n-pentane, n-hexane, n-heptane, n-octane, n-nonane, n-decane, dodecane, hexadecane, oxadecane, acetone, methylethylketone, cyclohexanone, acetophenone, ethyl acetate, butyl acetate, methyl acetate, ethyl acetate, methyl benzoate, ethyl benzoate, butyl benzoate, 3-phenoxy benzoate, or any combination thereof, but embodiments of the present disclosure are not limited thereto.

The amount of the solvent in the composition may be from about 80 wt % or more to about 99.9 wt % or less, or from about 90 wt % or more to about 99.8 wt % or less, based on the total weight of the composition, but embodiments of the present disclosure are not limited thereto. Within these ranges, the quantum dot-containing material may be properly dispersed in the composition (e.g., the ink composition), and a solid content concentration suitable for a soluble process (e.g., a process utilizing a solution of the quantum dot-containing material) may be obtained.

In one or more embodiments, the composition may further include a monomer containing at least one double bond.

The monomer may be an acrylic monomer or a styrene monomer.

In one or more embodiments, the monomer may be methyl methacrylate, styrene, methacrylic acid, or a combination thereof.

As described above, in the quantum dot-containing material of the present disclosure, a ligand containing an initiator moiety is bonded on, that is, anchored to, the surface of the quantum dot, and thus radicals may be formed on the surface of the quantum dot by exposure (hv) (e.g., exposure to light) or heating.

Through the radicals formed in this manner, the monomer may be polymerized. As a result, the growth of the polymer may be induced on the surface of the quantum dot.

In some embodiments, the composition may not include an initiator.

In some embodiments, the composition may not include a scavenger.

The composition may further include a hole-transporting compound or an electron-transporting compound.

The hole-transporting compound may be the same as the hole-transporting compound in connection with a hole-transporting region, to be described later.

The electron-transporting compound may be the same as the electron-transporting compound in connection with an electron-transporting region, to be described later.

The amount of the hole-transporting compound or the electron-transporting compound in the composition may be from about 0.5 wt % or more to about 20 wt % or less, or from about 0.5 wt % or more to from about 15 wt % or less based on the total weight of the composition. However, embodiments of the present disclosure are not limited thereto.

The viscosity of the composition may be from about 1 centipoise (cP) to about 10 cPs. A composition that satisfies this viscosity range may be suitable for manufacturing a quantum dot-containing layer of a light-emitting device by utilizing a soluble process (e.g., a process utilizing a solution of the quantum dot-containing material).

The surface tension of the composition may be from about 10 dynes/cm to about 40 dynes/cm. A composition that satisfies this surface tension range may be suitable for manufacturing a quantum dot-containing layer of a light-emitting device by utilizing a soluble process (e.g., in a process utilizing a solution of the quantum dot-containing material).

Light-emitting device

Figure 2:
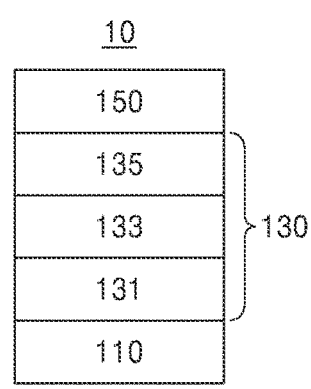
FIG. 2 is a schematic view of the structure of a light-emitting device included in an electronic apparatus according to an embodiment of the present disclosure.

FIG. 2 schematically illustrates a cross-sectional view of a light-emitting device 10, which is included in an electronic apparatus according to an embodiment.

The light-emitting device 10 includes a first electrode 110, an interlayer 130, and a second electrode 150.

Hereinafter, the structure of the light-emitting device 10 according to an embodiment and a method of manufacturing the light-emitting device 10 will be described in connection with FIG. 2.

First Electrode 110

In FIG. 2, a substrate may be additionally located under the first electrode 110 or above the second electrode 150. As the substrate, a glass substrate or a plastic substrate may be utilized. In one or more embodiments, the substrate may be a flexible substrate, and may include plastics with desired (e.g., excellent) heat resistance and durability, such as polyimide, polyethylene terephthalate (PET), polycarbonate, polyethylene naphthalate, polyarylate (PAR), polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high work function material that facilitates injection of holes.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or any combinations thereof. In one or more embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combinations thereof may be utilized as a material for forming the first electrode.

The first electrode 110 may have a single layer consisting of a single-layered structure or a multilayer structure including a plurality of layers. For example, the first electrode 110 may have a three-layered structure of ITO/Ag/ITO.

Interlayer 130

The interlayer 130 may be located on the first electrode 110. The interlayer 130 may include an emission layer 133.

The interlayer 130 may further include a hole-transporting region 131 located between the first electrode 110 and the emission layer 133 and an electron-transporting region 135 located between the emission layer 133 and the second electrode 150.

The interlayer 130 may further include, in addition to various suitable organic materials, metal-containing compounds such as organometallic compounds, inorganic materials such as quantum dots, and/or the like.

In one or more embodiments, the interlayer 130 may include, i) two or more emitting units sequentially stacked between the first electrode 110 and the second electrode 150 and ii) a charge generation layer located between the two emitting units.

When the interlayer 130 includes the emitting unit and the charge generation layer as described above, the light-emitting device 10 may be a tandem light-emitting device.

Hole-Transporting Region 131 in Interlayer 130

The hole-transporting region 131 may have: i) a single-layered structure consisting of a single layer consisting of a single material, ii) a single-layered structure including (e.g., consisting of) a single layer including (e.g., consisting of) a plurality of different materials, or iii) a multi-layered structure including a plurality of layers including different materials.

The hole-transporting region 131 may include a hole injection layer (HIL), a hole-transporting layer (HTL), an emission auxiliary layer, an electron-blocking layer (EBL), or any combination thereof.

For example, the hole-transporting region 131 may have a multi-layered structure including a hole injection layer/hole-transporting layer structure, a hole injection layer/hole-transporting layer/emission auxiliary layer structure, a hole injection layer/emission auxiliary layer structure, a hole-transporting layer/emission auxiliary layer structure, or a hole injection layer/hole-transporting layer/electron-blocking layer structure, wherein, in each structure, layers are stacked sequentially from the first electrode 110 in the respective stated order.

The hole-transporting region 131 may include a compound represented by Formula 201, a compound represented by Formula 202, or any combination thereof:

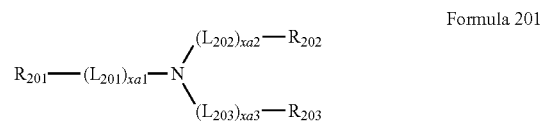

Formula 201

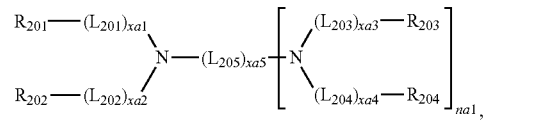

Formula 202 wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group and/or the like) unsubstituted or substituted with at least one $R_{10a}$ (for example, Compound HT16), $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

In one or more embodiments, each of Formulae 201 and 202 may include at least one of the groups represented by Formulae CY201 to CY217.

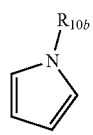

CY201

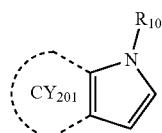

CY202

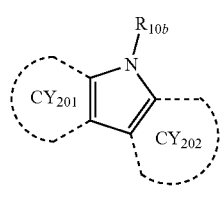

CY203

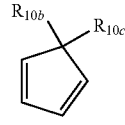

CY204

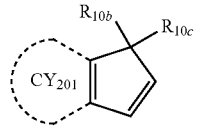

CY205

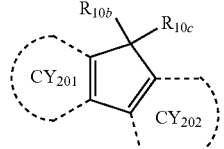

CY206

-continued

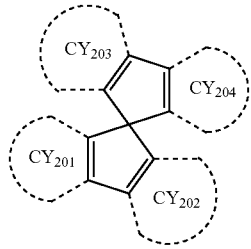

CY207

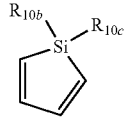

CY208

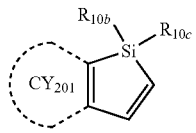

CY209

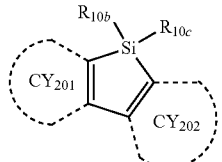

CY210

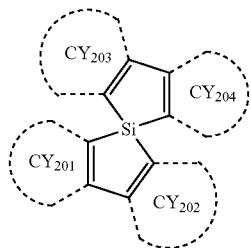

CY211

CY212

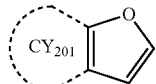

CY213

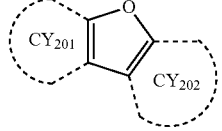

CY214

CY215

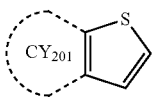
CY216

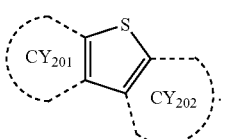
CY217

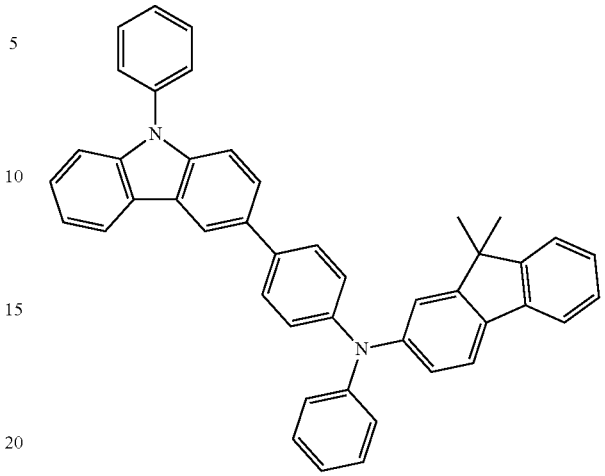
HT1

$R_{10b}$ and $R_{10c}$ in Formulae CY201 to CY217 are the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In one or more embodiments, ring $CY_{201}$ to ring $CY_{204}$ in Formulae CY201 to CY217 may each independently be a benzene group, a naphthalene group, a phenanthrene group, or an anthracene group.

In one or more embodiments, each of Formulae 201 and 202 may include at least one of the groups represented by Formulae CY201 to CY203.

In one or more embodiments, Formula 201 may include at least one of the groups represented by Formulae CY201 to CY203 and at least one of the groups represented by Formulae CY204 to CY217.

In one or more embodiments, xa1 in Formula 201 may be 1, $R_{201}$ may be a group represented by one of Formulae CY201 to CY203, xa2 may be 0, and $R_{202}$ may be a group represented by one of Formulae CY204 to CY207.

In one or more embodiments, each of Formulae 201 and 202 may not include at least one of the groups represented by Formulae CY201 to CY203.

In one or more embodiments, each of Formulae 201 and 202 may not include at least one of the groups represented by Formulae CY201 to CY203, and may include at least one of the groups represented by Formulae CY204 to CY217.

In one or more embodiments, each of Formulae 201 and 202 may not include at least one of the groups represented by Formulae CY201 to CY217.

In one or more embodiments, the hole-transporting region 131 may include one of Compounds HT1 to HT46, m-MTDATA, TDATA, 2-TNATA, NPB(NPD), p-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

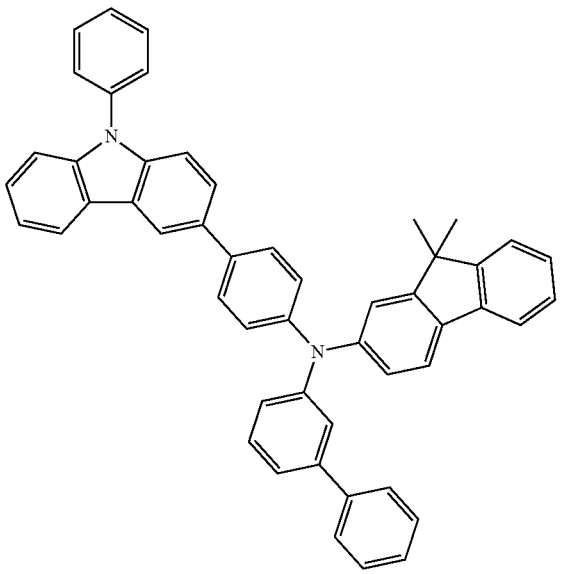
HT2

HT3
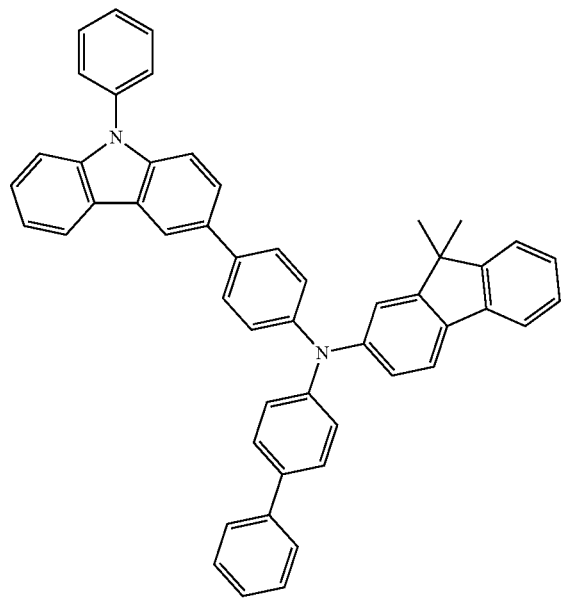
HT4
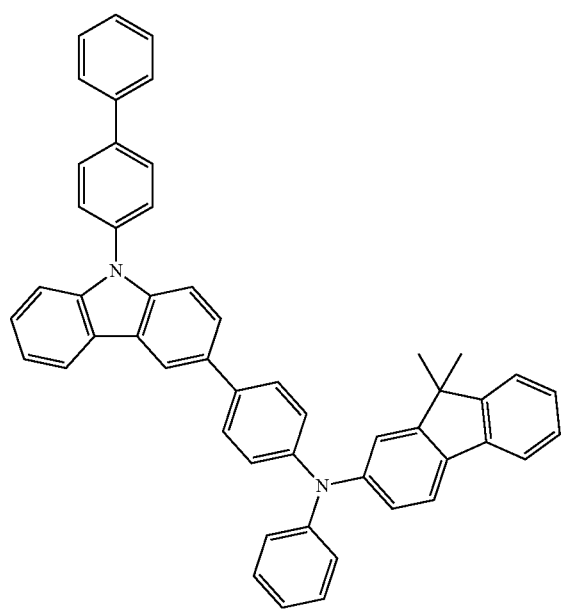
HT5
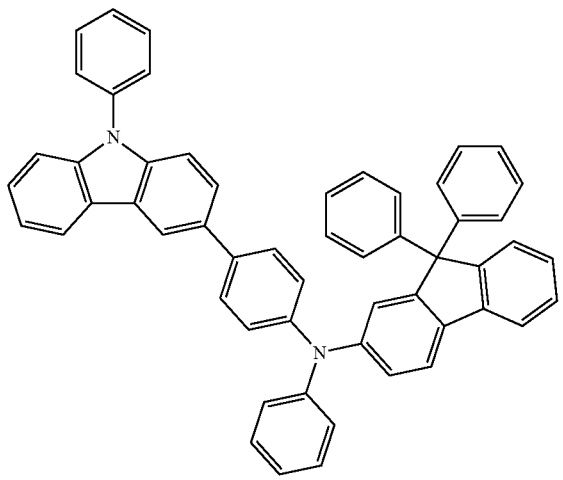
HT6

HT7
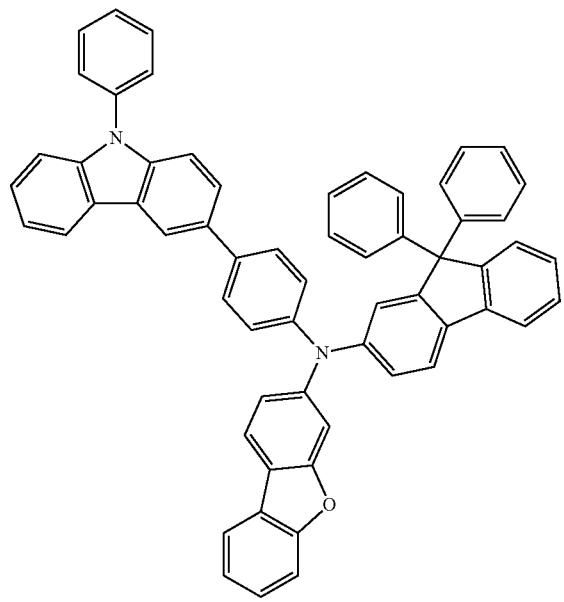
HT8
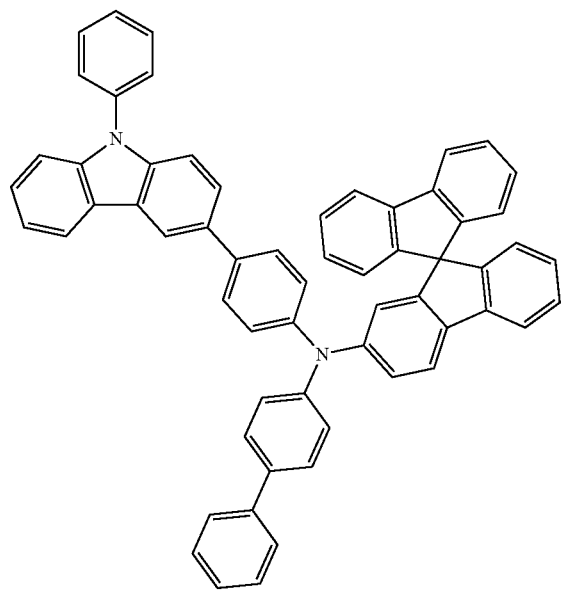
HT9
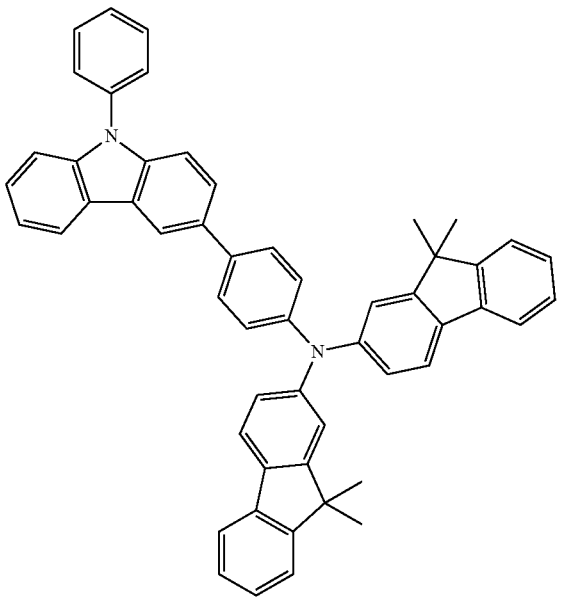
HT10
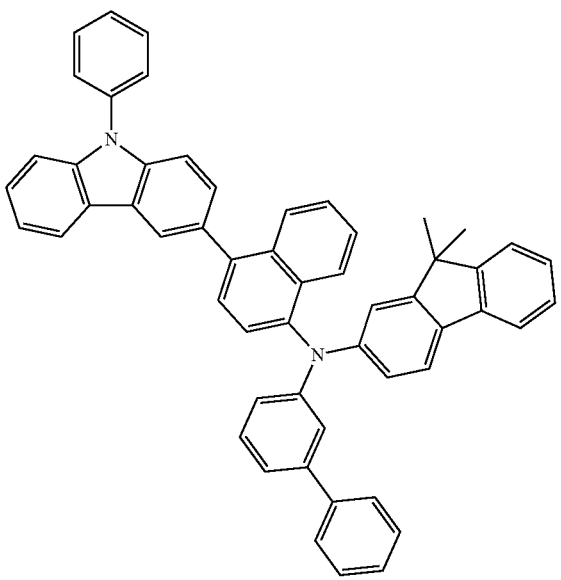

HT11
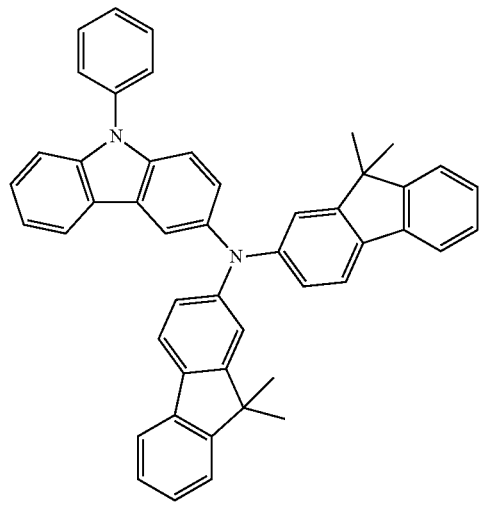
HT12
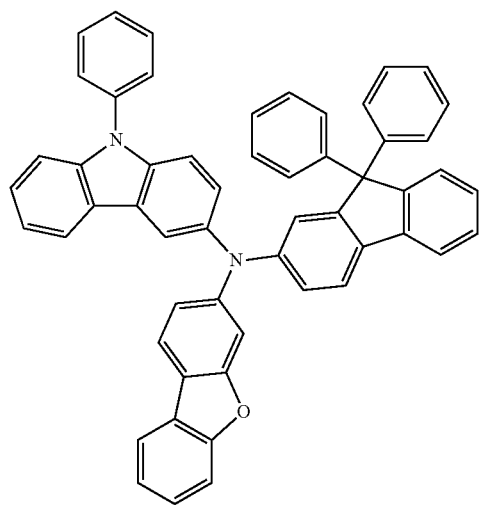
HT13
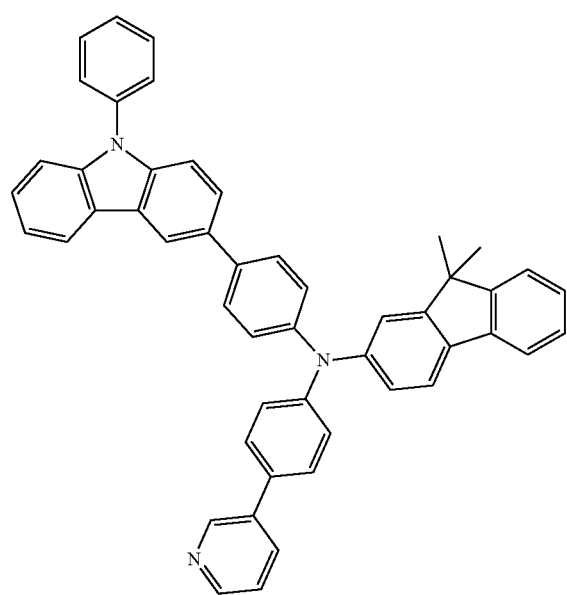
HT14
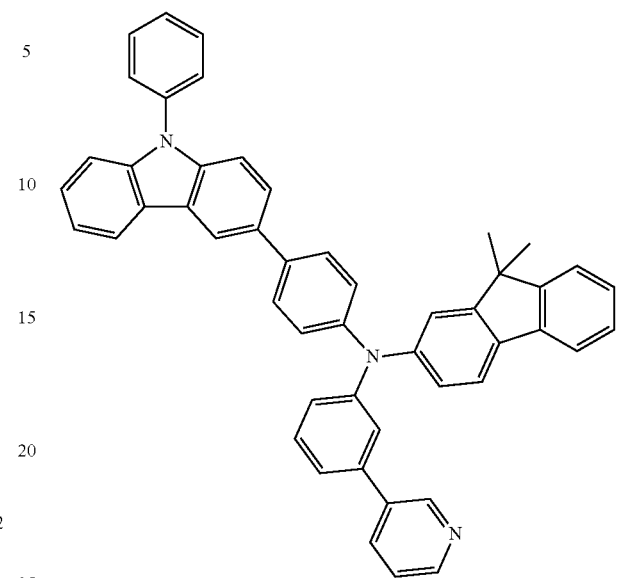
HT15
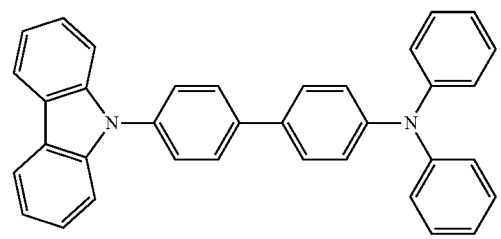
HT16

HT17
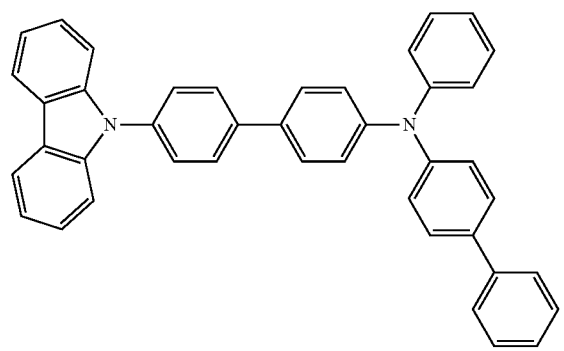
HT18
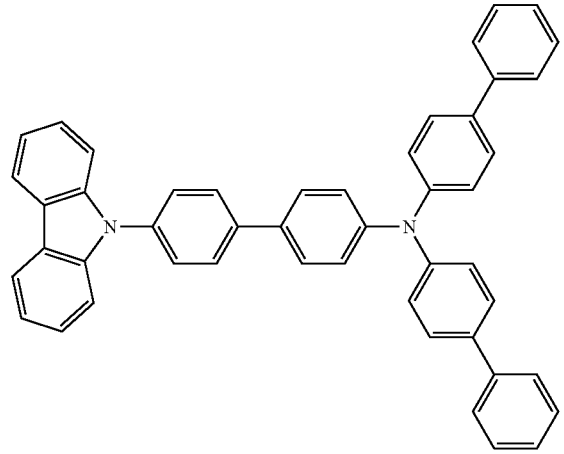
HT19
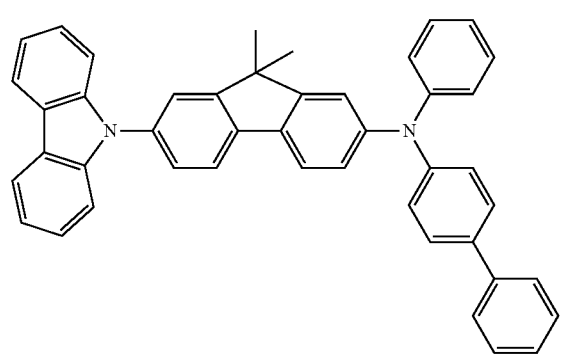
HT20
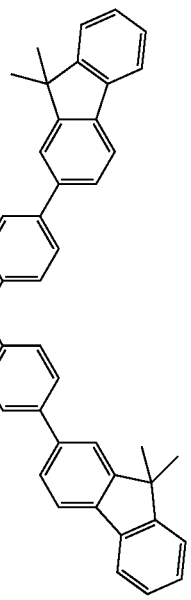
HT21
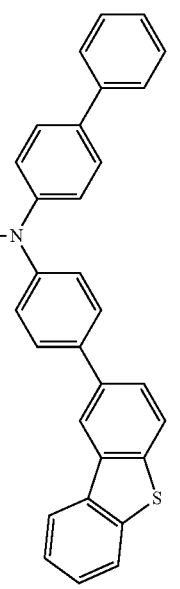
HT22
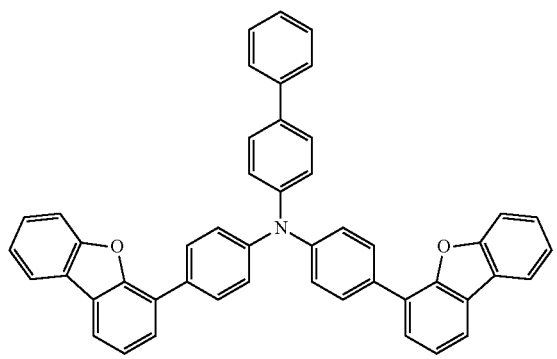

HT23
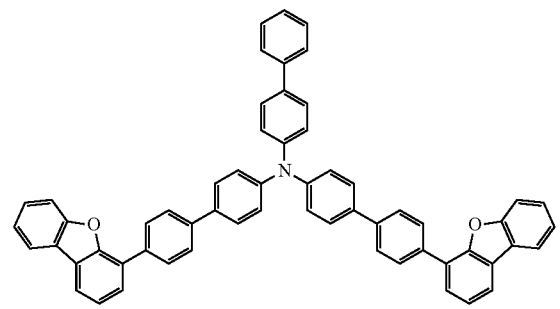
HT24
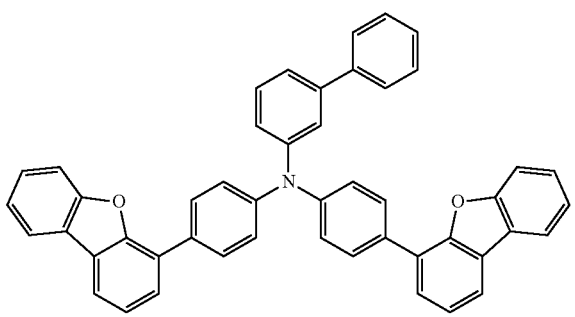
HT25
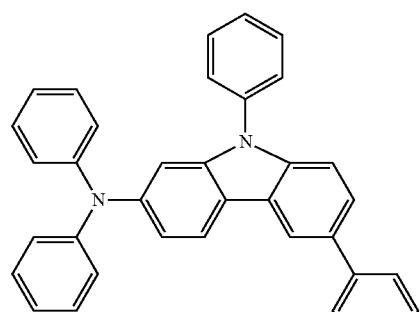
HT26
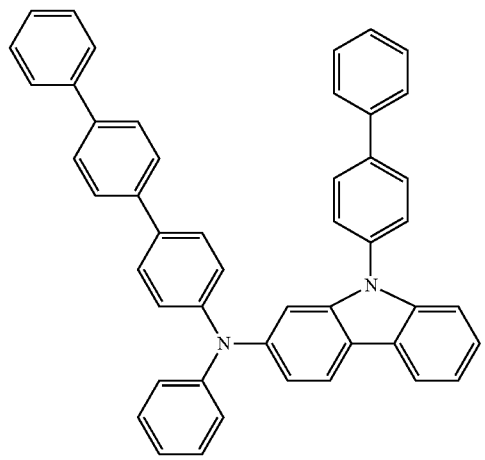
HT27
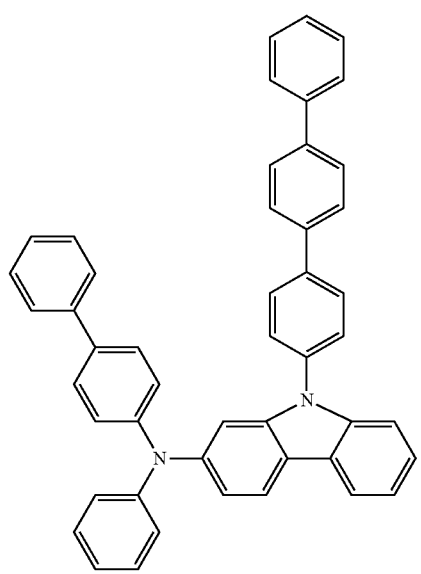
HT28
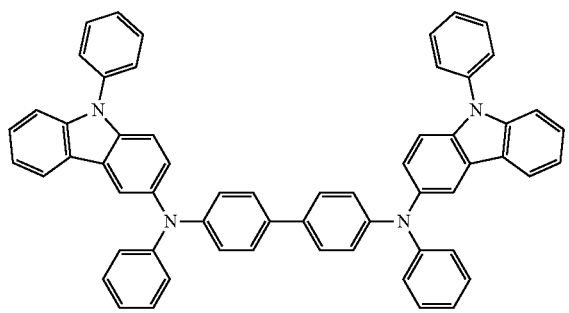

HT29
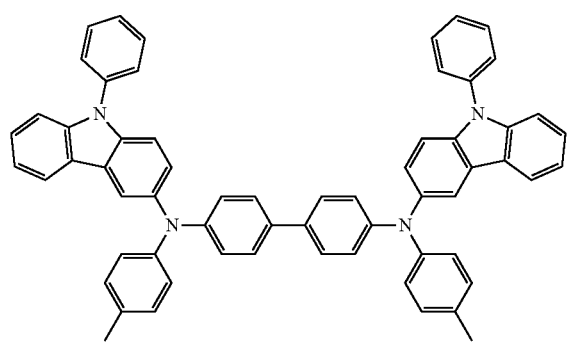
HT30
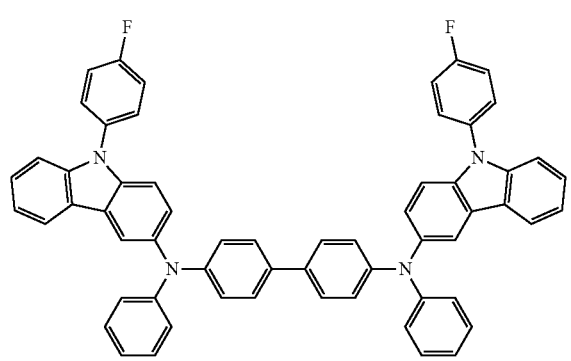
HT31
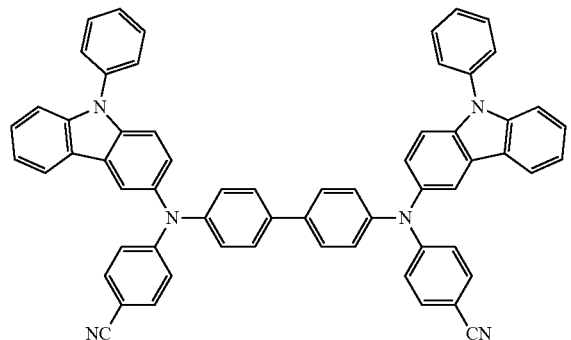
HT33
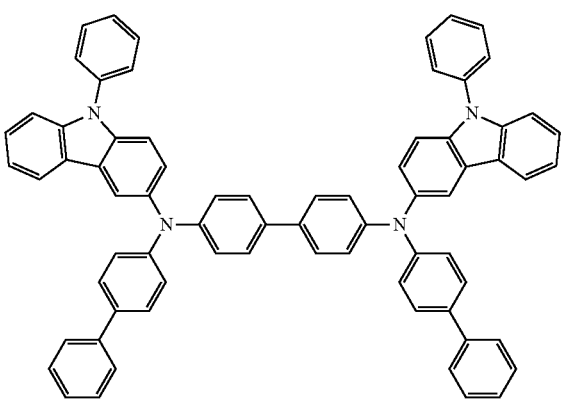
HT34
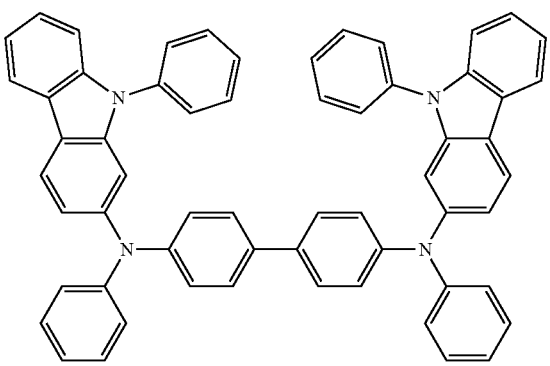
HT35
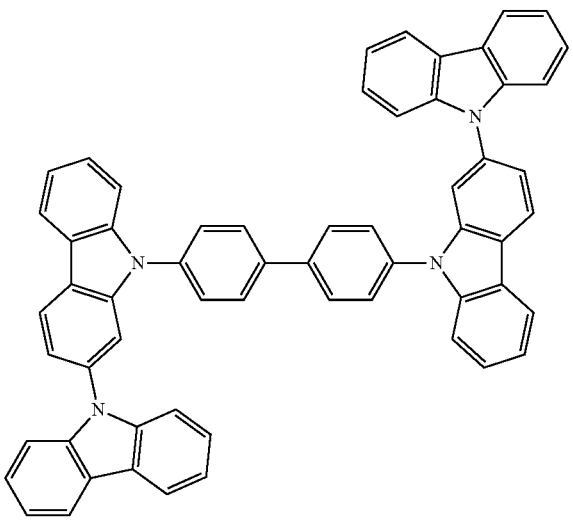
HT32

HT36
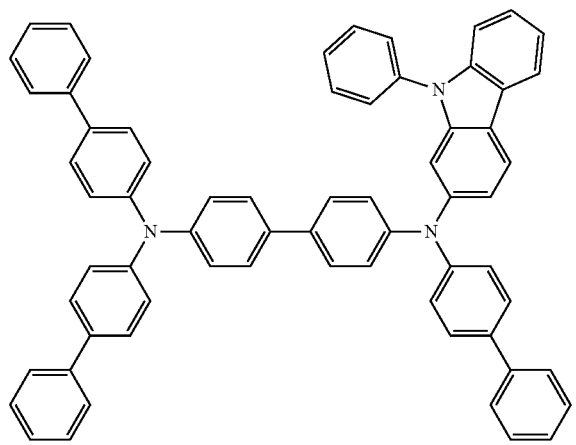
HT37
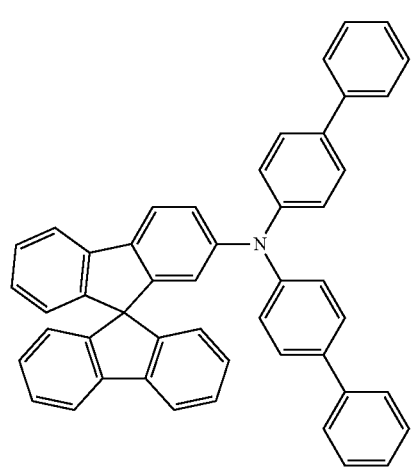
HT38
HT39
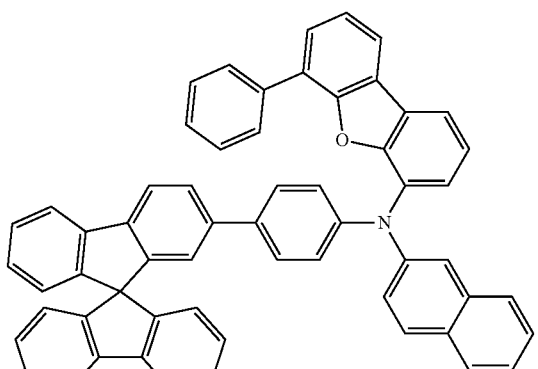
HT40
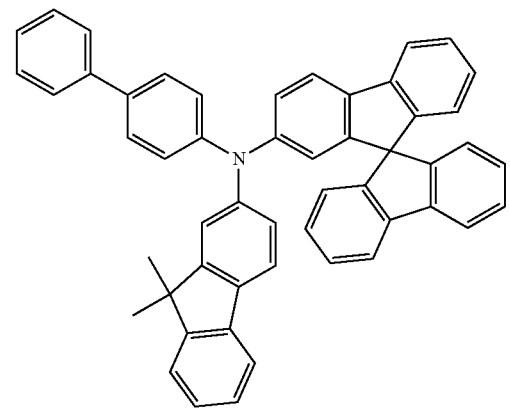
HT41
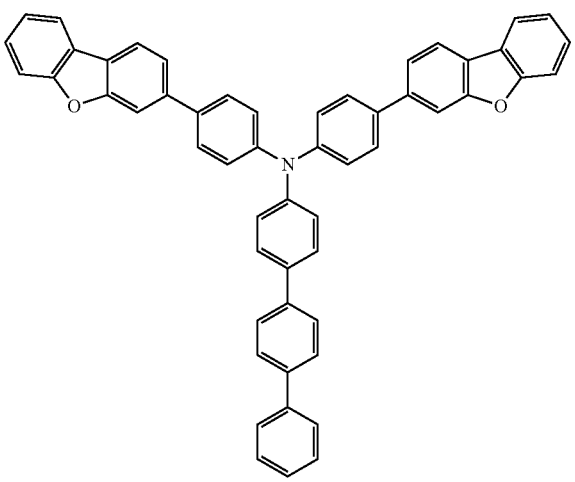
HT42
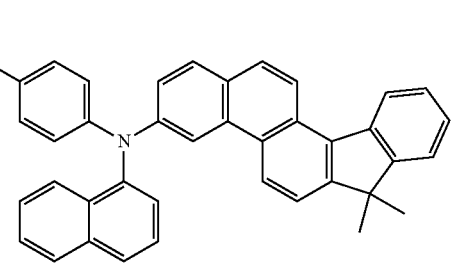

HT43
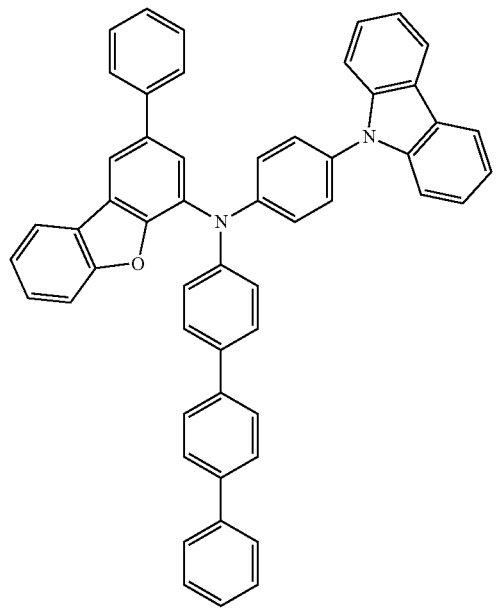
HT44
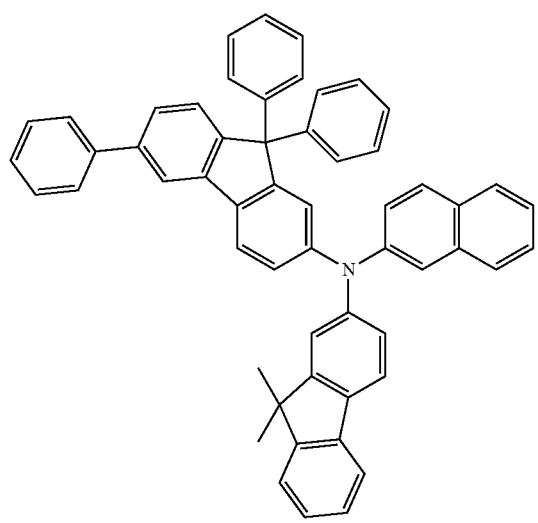
HT45
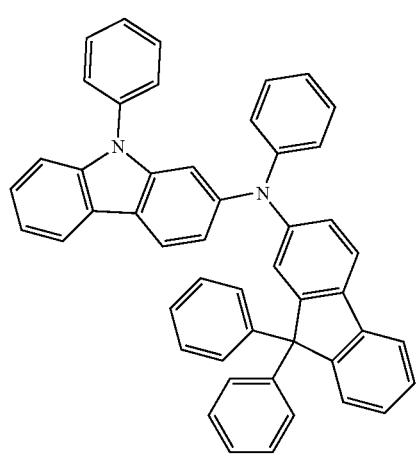
HT46
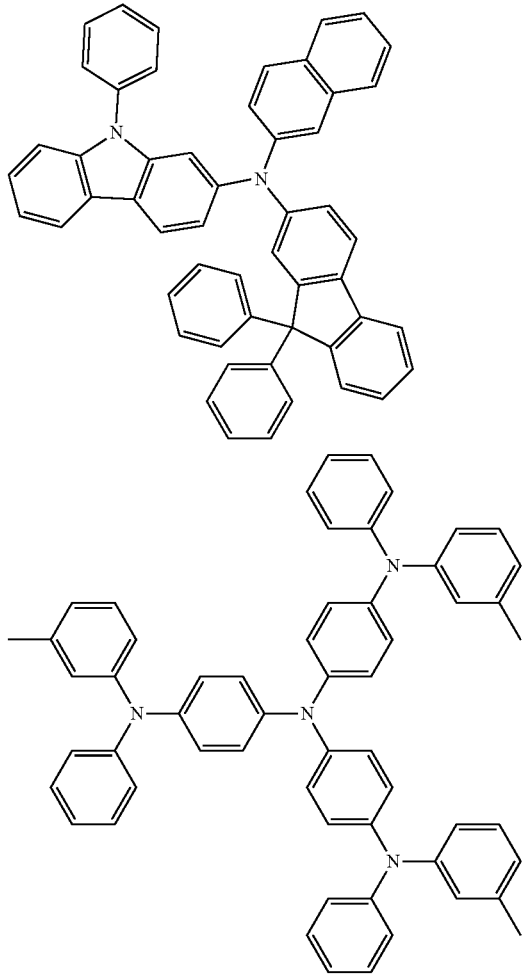
m-MTDATA
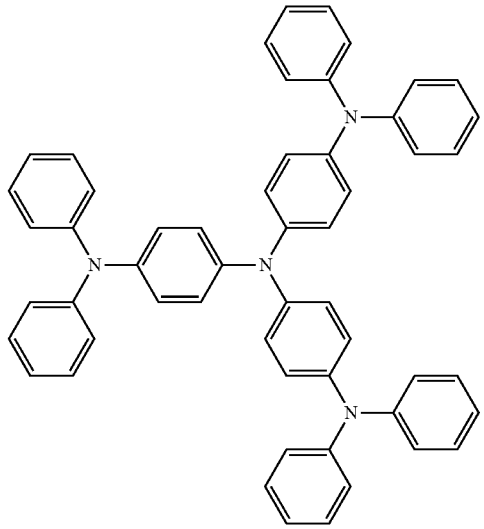
TDATA

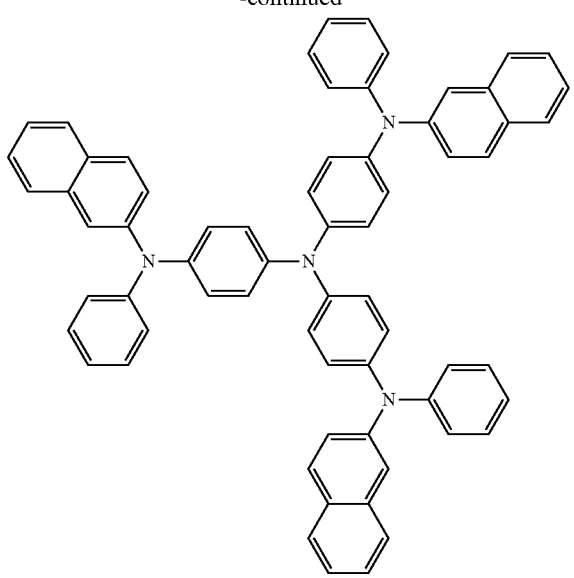
2-TNATA
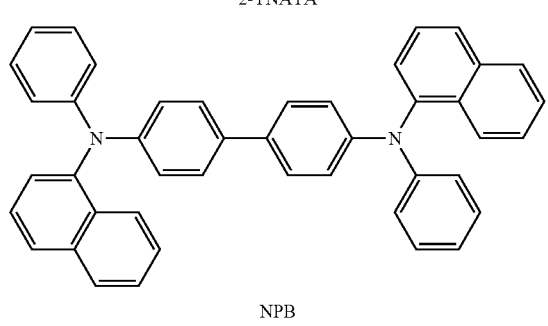
NPB
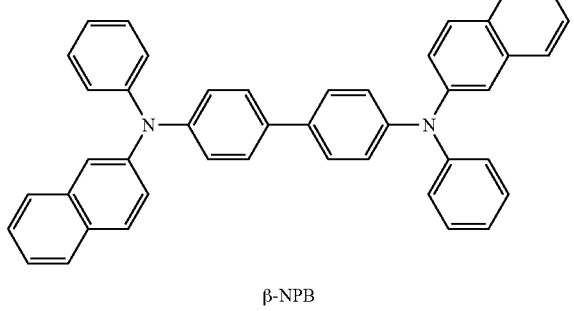
β-NPB
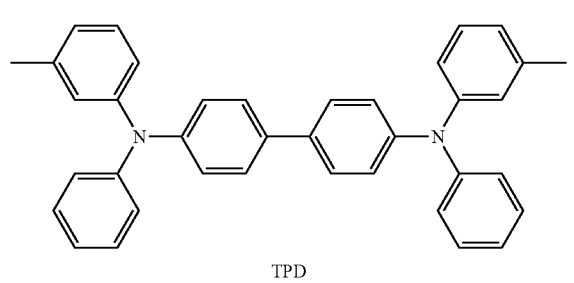
TPD
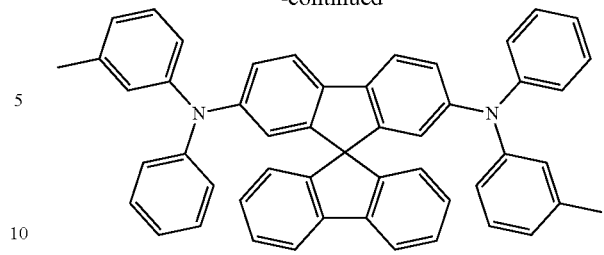
Spiro-TPD
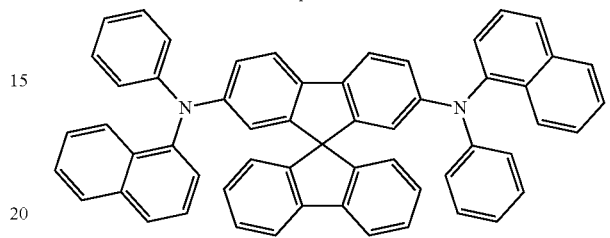
Spiro-NPB
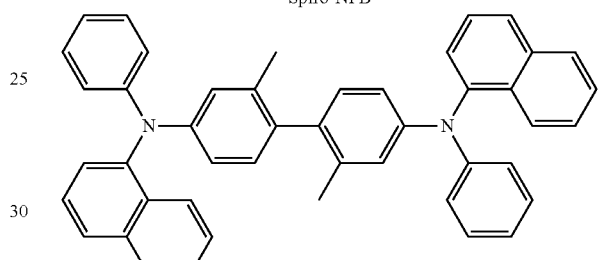
methylated-NPB
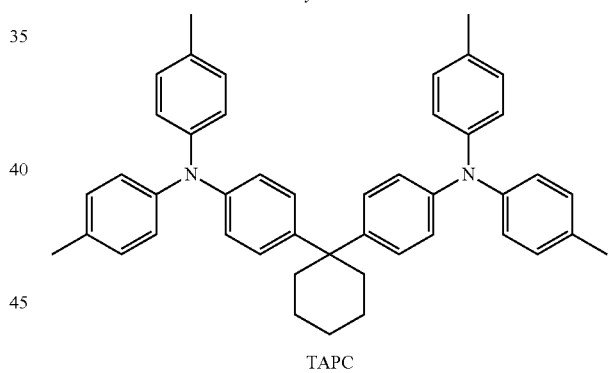
TAPC
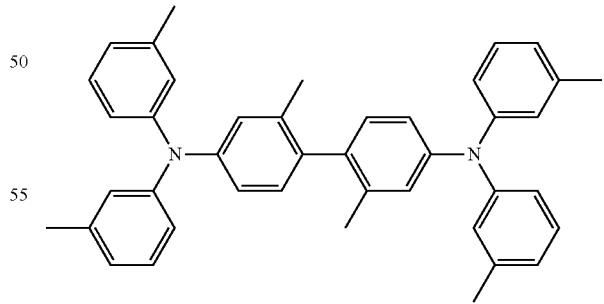
HMTPD
A thickness of the hole-transporting region 131 may be in a range of about 50 Å to about 10,000 Å, for example, about 100 Å to about 4,000 Å. When the hole-transporting region 131 includes a hole injection layer, a hole-transporting layer, or any combination thereof, a thickness of the hole injection layer may be in a range of about 100 Å to about 9,000 Å, for example, about 100 Å to about 1,000 Å, and a thickness of the hole-transporting layer may be in a range of about 50 Å to about 2,000 Å, for example, about 100 Å to about 1,500 Å. When the thicknesses of the hole-transporting region 131, the hole injection layer and the hole-transporting layer are within their respective ranges, satisfactory hole transporting characteristics may be obtained without a substantial increase in driving voltage.

The emission auxiliary layer may increase light-emission efficiency by compensating for an optical resonance distance according to the wavelength of light emitted by the emission layer 133, and the electron blocking layer may block or reduce the flow of electrons from the electron-transporting region 135. The emission auxiliary layer and the electron blocking layer may include the materials as described above.

p-Dopant

The hole-transporting region 131 may further include, in addition to the materials described above, a charge-generation material for the improvement of conductive properties. The charge-generation material may be uniformly or non-uniformly dispersed in the hole-transporting region 131 (for example, in the form of a single layer including (e.g., consisting of) a charge-generation material).

The charge-generation material may be, for example, a p-dopant.

In one or more embodiments, the lowest unoccupied molecular orbital (LUMO) energy level of the p-dopant may be −3.5 eV or less.

In one or more embodiments, the p-dopant may include a quinone derivative, a cyano group-containing compound, a compound containing element EL1 and element EL2, or any combination thereof.

Examples of the quinone derivative may include TCNQ, F4-TCNQ, etc.

Examples of the cyano group-containing compound may include HAT-CN, and a compound represented by Formula 221 below.

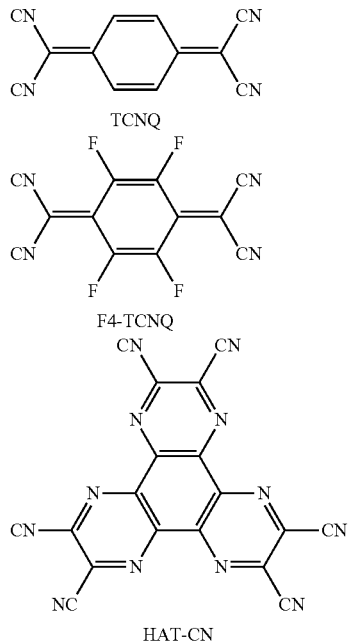

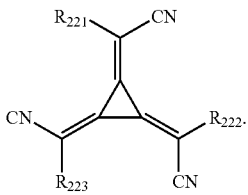

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with a cyano group; —F; —Cl; —Br; —I; a $C_1$-$C_{20}$ alkyl group substituted with a cyano group, —F, —Cl, —Br, —I, or any combination thereof; or any combination thereof.

In the compound containing element EL1 and element EL2, element EL1 may be metal, metalloid, or a combination thereof, and element EL2 may be non-metal, metalloid, or a combination thereof.

Examples of the metal may include an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); post-transition metal (for example, zinc (Zn), indium (In), tin (Sn), etc.); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid may include silicon (Si), antimony (Sb), and tellurium (Te).

Examples of the non-metal may include oxygen (O) and halogen (for example, F, Cl, Br, I, etc.).

In one or more embodiments, examples of the compound containing element EL1 and element EL2 may include metal oxide, metal halide (for example, metal fluoride, metal chloride, metal bromide, or metal iodide), metalloid halide (for example, metalloid fluoride, metalloid chloride, metalloid bromide, and/or metalloid iodide), metal telluride, or any combination thereof.

Examples of the metal oxide may include tungsten oxide (for example, WO, $W_2O_3$, $WO_2$, $WO_3$, $W_2O_5$, etc.), vanadium oxide (for example, VO, $V_2O_3$, $VO_2$, $V_2O_5$, etc.), molybdenum oxide (MoO, $Mo_2O_3$, $MoO_2$, $MoO_3$, $Mo_2O_5$, etc.), and rhenium oxide (for example, $ReO_3$, etc.).

Examples of the metal halide may include alkali metal halide, alkaline earth metal halide, transition metal halide, post-transition metal halide, and lanthanide metal halide.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide may include $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide may include titanium halide (for example, $TiF_4$, $TiCl_4$, $TiBr_4$, $TiI_4$, etc.), zirconium halide (for example, $ZrF_4$, $ZrCl_4$, $ZrBr_4$, $ZrI_4$, etc.), hafnium halide (for example, $HfF_4$, $HfCl_4$, $HfBr_4$, $HfI_4$, etc.), vanadium halide (for example, $VF_3$, $VCl_3$, $VBr_3$, $VI_3$, etc.), niobium halide (for example, $NbF_3$, $NbCl_3$, $NbBr_3$, $NbI_3$, etc.), tantalum halide (for example, $TaF_3$, $TaCl_3$, $TaBr_3$, $TaI_3$, etc.), chromium halide (for example, $CrF_3$, $CrCl_3$, $CrBr_3$, $CrI_3$, etc.), molybdenum halide (for example, $MoF_3$, $MoCl_3$, $MoBr_3$, $MoI_3$, etc.), tungsten halide (for example, $WF_3$, $WCl_3$, $WBr_3$, $WI_3$, etc.), manganese halide (for example, $MnF_2$, $MnCl_2$, $MnBr_2$, $MnI_2$, etc.), technetium halide (for example, $TcF_2$, $TcCl_2$, $TcBr_2$, $TcI_2$, etc.), rhenium halide (for example, $ReF_2$, $ReCl_2$, $ReBr_2$, $ReI_2$, etc.), iron halide (for example, $FeF_2$, $FeCl_2$, $FeBr_2$, $FeI_2$, etc.), ruthenium halide (for example, $RuF_2$, $RuCl_2$, $RuBr_2$, $RuI_2$, etc.), osmium halide (for example, $OsF_2$, $OsCl_2$, $OsBr_2$, $OsI_2$, etc.), cobalt halide (for example, $CoF_2$, $CoCl_2$, $CoBr_2$, $CoI_2$, etc.), rhodium halide (for example, $RhF_2$, $RhCl_2$, $RhBr_2$, $RhI_2$, etc.), iridium halide (for example, $IrF_2$, $IrCl_2$, $IrBr_2$, $IrI_2$, etc.), nickel halide (for example, $NiF_2$, $NiCl_2$, $NiBr_2$, $NiI_2$, etc.), palladium halide (for example, $PdF_2$, $PdCl_2$, $PdBr_2$, $PdI_2$, etc.), platinum halide (for example, $PtF_2$, $PtCl_2$, $PtBr_2$, $PtI_2$, etc.), copper halide (for example, $CuF$, $CuCl$, $CuBr$, $CuI$, etc.), silver halide (for example, $AgF$, $AgCl$, $AgBr$, $AgI$, etc.), and gold halide (for example, $AuF$, $AuCl$, $AuBr$, $AuI$, etc.).

Examples of the post-transition metal halide may include zinc halide (for example, $ZnF_2$, $ZnCl_2$, $ZnBr_2$, $Zn_{12}$, etc.), indium halide (for example, $InI_3$, etc.), and tin halide (for example, $SnI_2$, etc.).

Examples of the lanthanide metal halide may include $YbF$, $YbF_2$, $YbF_3$, $SmF_3$, $YbCl$, $YbCl_2$, $YbCl_3$ $SmCl_3$, $YbBr$, $YbBr_2$, $YbBr_3$ $SmBr_3$, $YbI$, $YbI_2$, $YbI_3$, and $Sm_{13}$.

An example of the metalloid halide may include antimony halide (for example, $SbCl_5$, etc.).

Examples of the metal telluride may include alkali metal telluride (for example, $Li_2Te$, $Na_2Te$, $K_2Te$, $Rb_2Te$, $Cs_2Te$, etc.), alkaline earth metal telluride (for example, BeTe, MgTe, CaTe, SrTe, BaTe, etc.), transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), post-transition metal telluride (for example, ZnTe, etc.), and lanthanide metal telluride (for example, LaTe, CeTe, PrTe, NdTe, PmTe, EuTe, GdTe, TbTe, DyTe, HoTe, ErTe, TmTe, YbTe, LuTe, etc.).

Emission Layer 133 in Interlayer 130

When the light-emitting device 10 is a full-color light-emitting device, the emission layer 133 may be patterned into a red emission layer, a green emission layer, and/or a blue emission layer, according to a subpixel. In one or more embodiments, the emission layer 133 may have a stacked structure of two or more layers of a red emission layer, a green emission layer, and a blue emission layer, in which the two or more layers contact each other or are separated from each other. In one or more embodiments, the emission layer may include two or more materials of a red light-emitting material, a green light-emitting material, and a blue light-emitting material, in which the two or more materials are mixed with each other in a single layer to emit white light.

The emission layer 133 may include a host and a dopant. The dopant may include a phosphorescent dopant, a fluorescent dopant, or any combination thereof.

The amount of the dopant in the emission layer 133 may be from about 0.01 to about 15 parts by weight based on 100 parts by weight of the host.

In one or more embodiments, the emission layer 133 may include a quantum dot.

In one or more embodiments, the emission layer 133 may include a delayed fluorescence material. The delayed fluorescence material may act as a host or a dopant in the emission layer 133.

A thickness of the emission layer 133 may be in a range of about 100 Å to about 1,000 Å, for example, about 200 Å to about 600 Å. When the thickness of the emission layer 133 is within these ranges, desired (e.g., excellent) light-emission characteristics may be obtained without a substantial increase in driving voltage.

Host

In one or more embodiments, the host may include a compound represented by Formula 301 below:

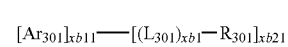

Formula 301

In Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be an integer from 1 to 5, and $Q_{301}$ to $Q_{303}$ are the same as described in connection with $Q_1$.

In one or more embodiments, when xb11 in Formula 301 is 2 or more, two or more of $Ar_{301}$(s) may be linked to each other via a single bond.

In one or more embodiments, the host may include a compound represented by Formula 301-1, a compound represented by Formula 301-2, or any combination thereof:

Formula 301-1

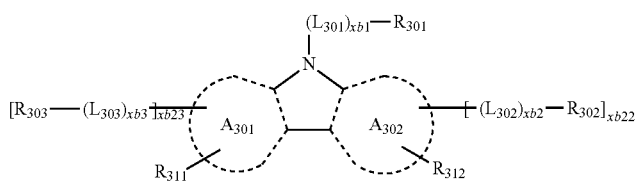

Formula 301-2

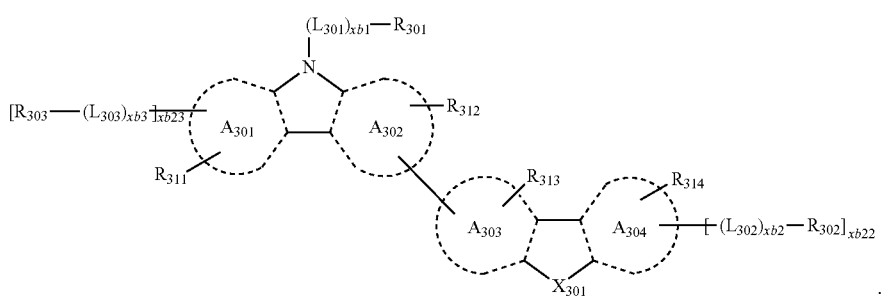

In Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[$(L_{304})_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ are the same as described in the present specification, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ may each independently be the same as described in connection with $R_{301}$.

In one or more embodiments, the host may include an alkali earth metal complex, a post-transition metal complex, or a combination thereof. In one or more embodiments, the host may include a Be complex (for example, Compound H55), an Mg complex, a Zn complex, or a combination thereof.

In one or more embodiments, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), 3,3-di(9H-carbazol-9-yl)biphenyl (mCBP), or any combination thereof:

H1

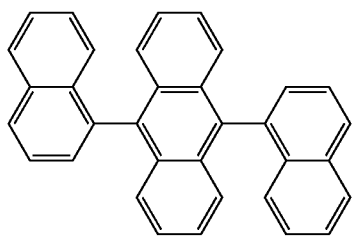

-continued

H2

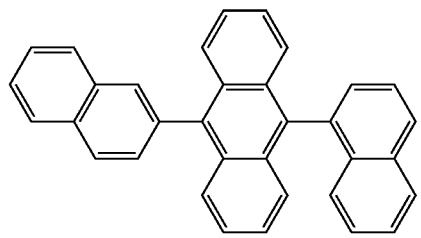

H3

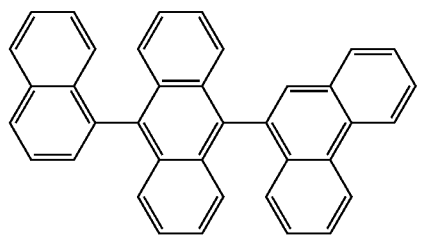

H4

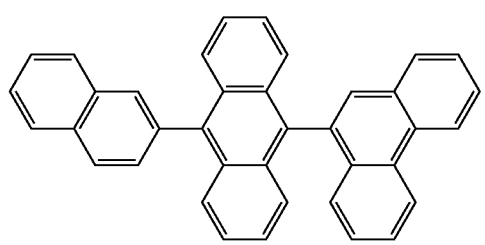

H5

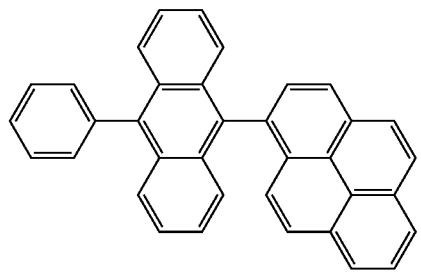

H6
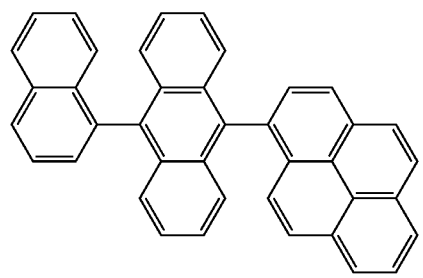
H7
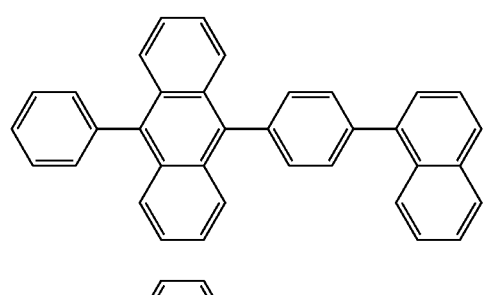
H8
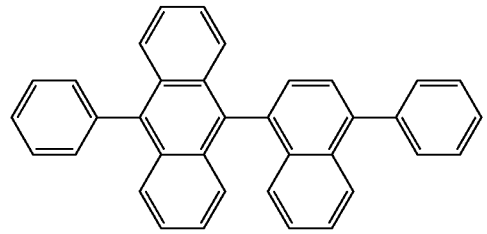
H9
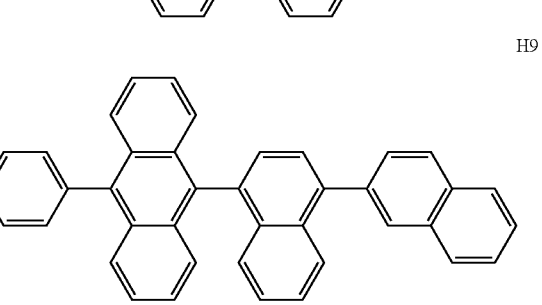
H10
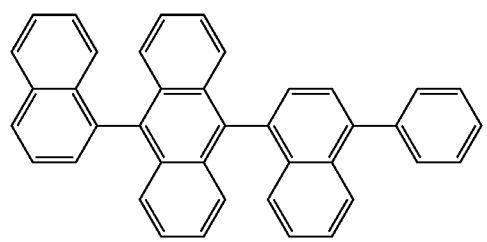
H11
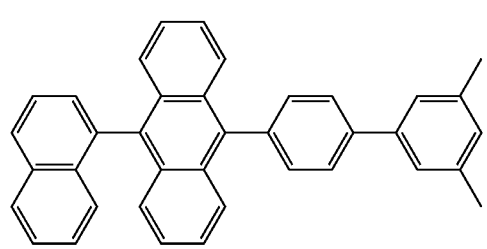
H12
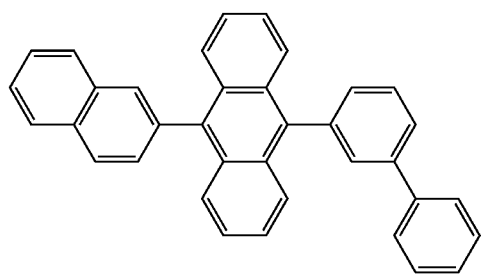
H13
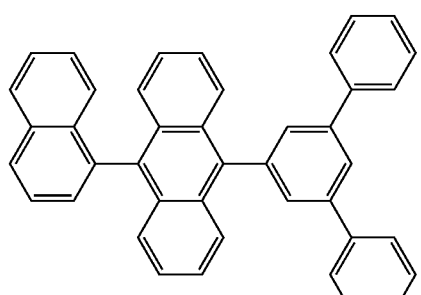
H14
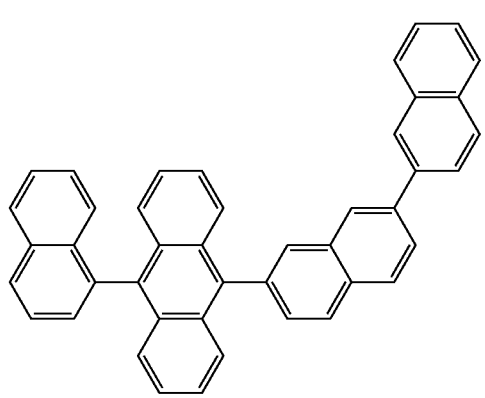
H15
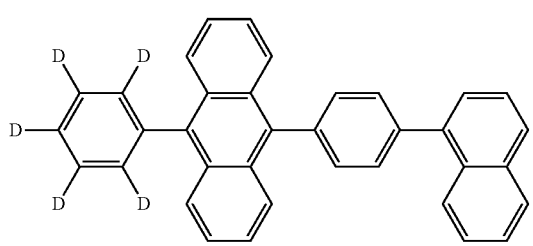
H16
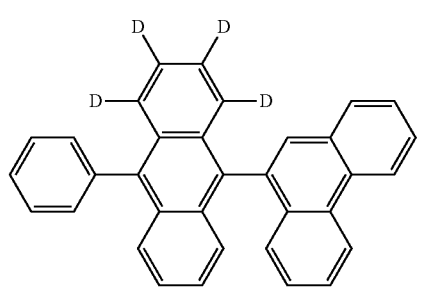

H17
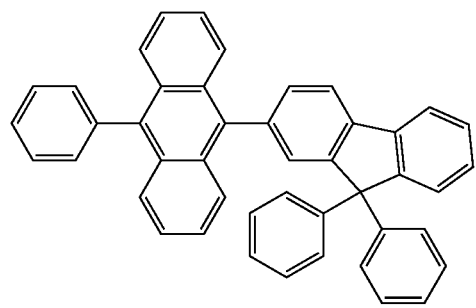
H18
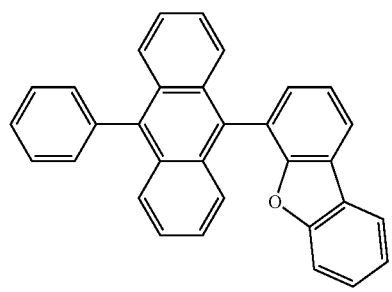
H19
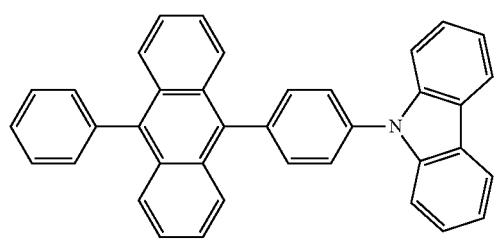
H20
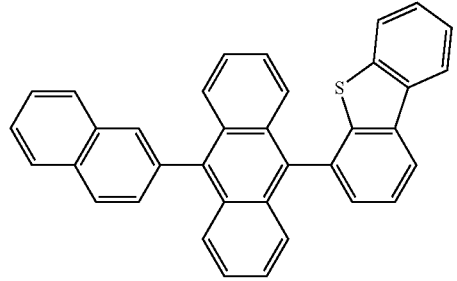
H21
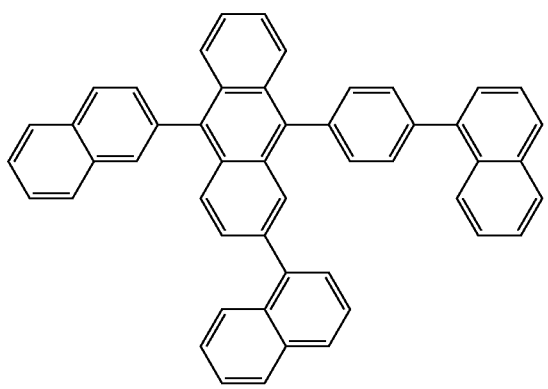
H22
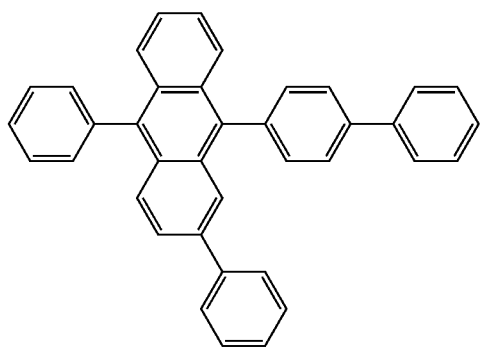
H23
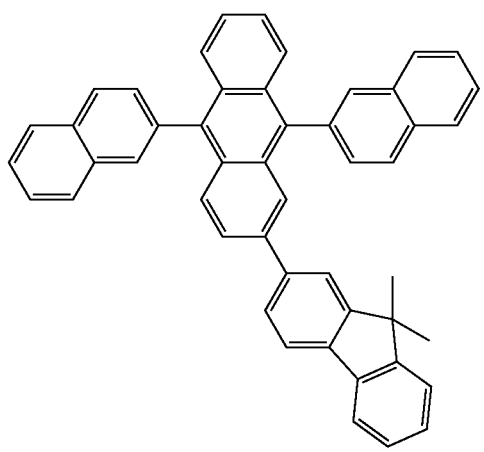
H24
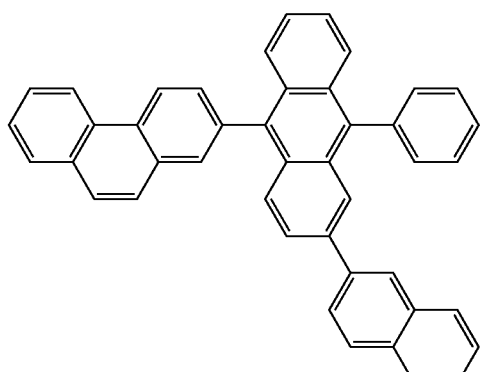

H25
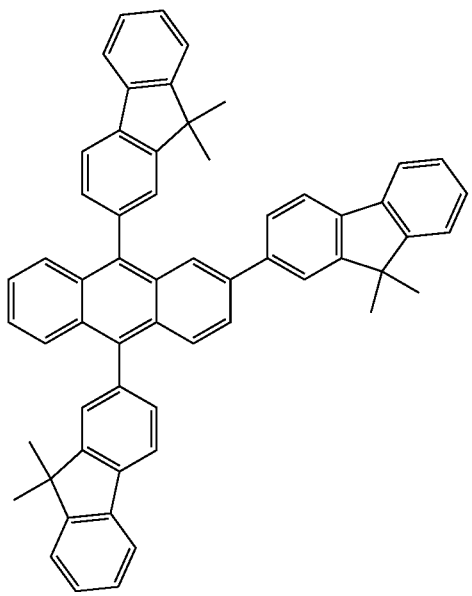
H26
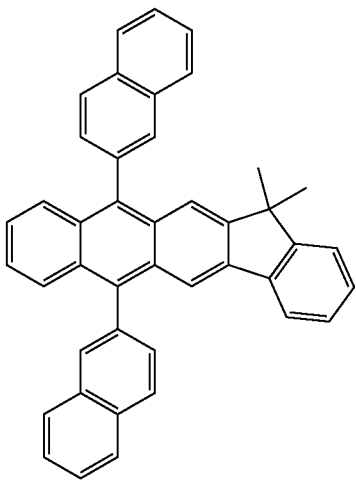
H27
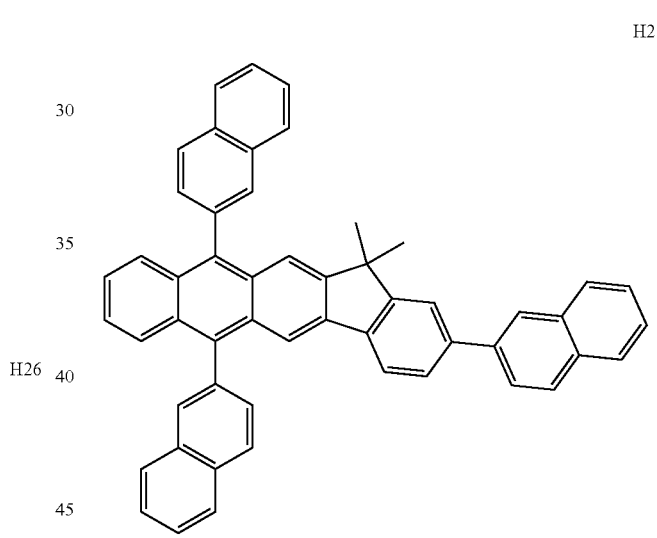
H28
H29
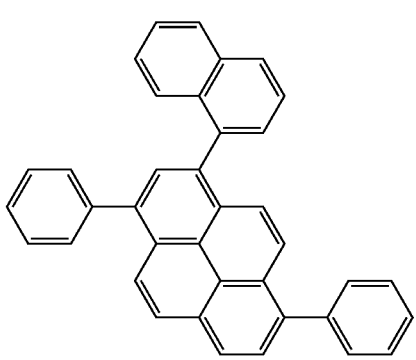

H30
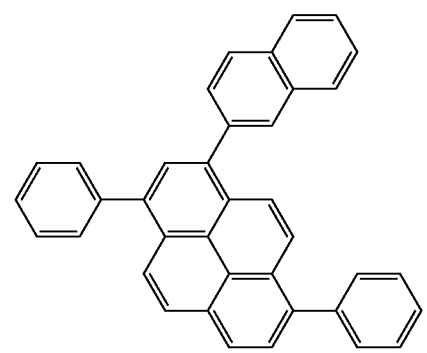
H31
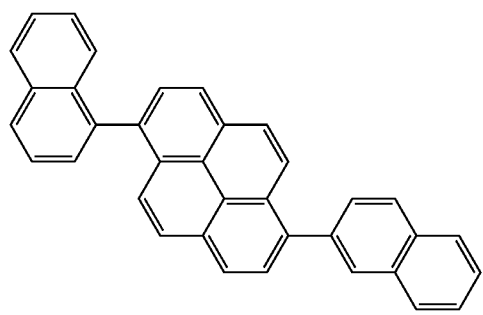
H32
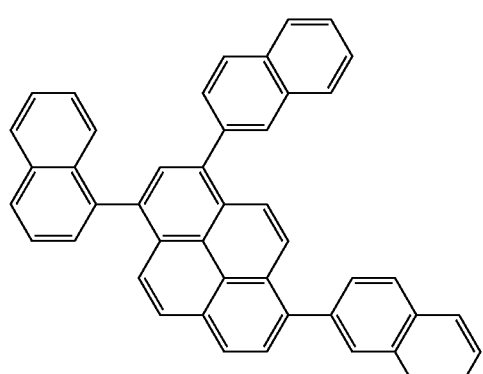
H33
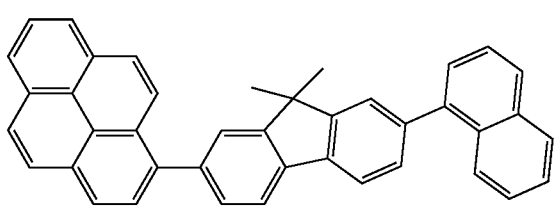
H34
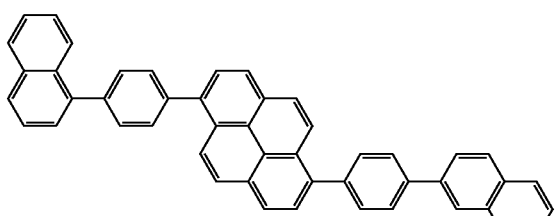
H35
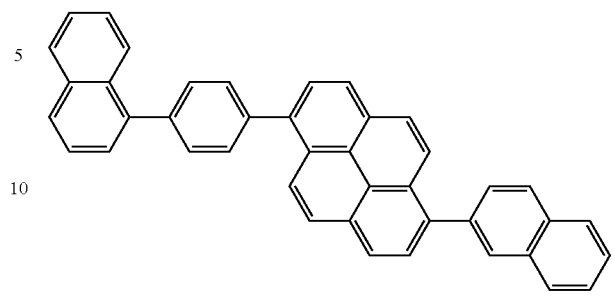
H36
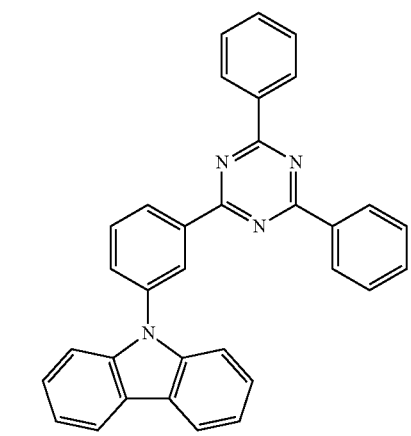
H37
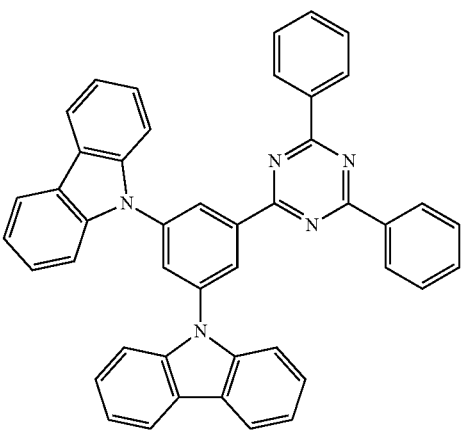
H38
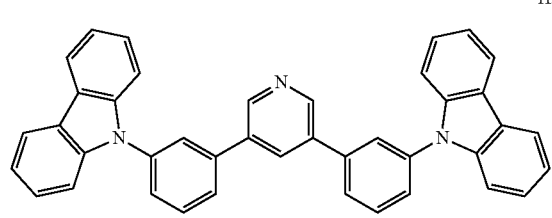

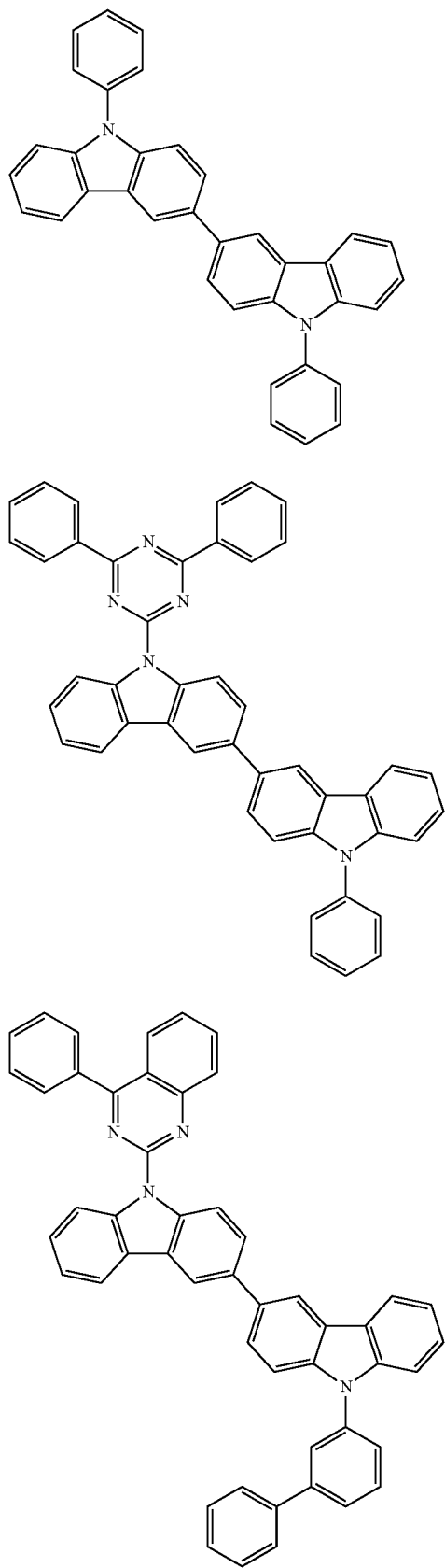
H39
H40
H41
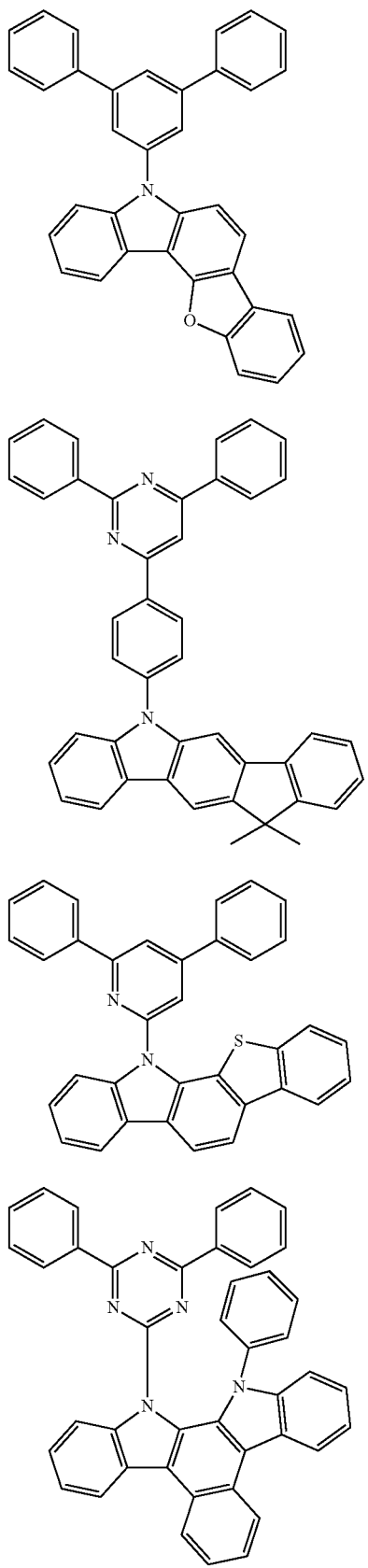
H42
H43
H44
H45

H46
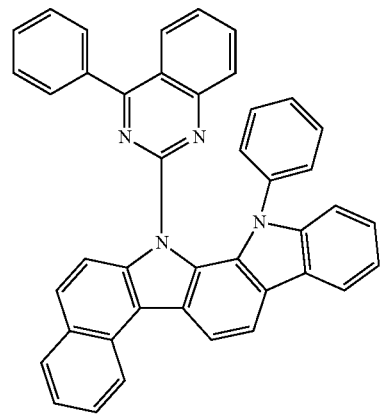
H47
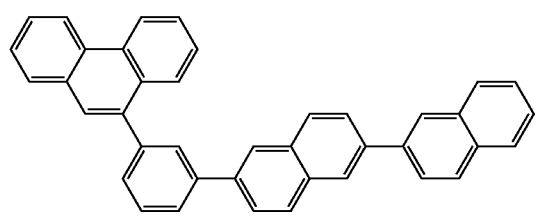
H48
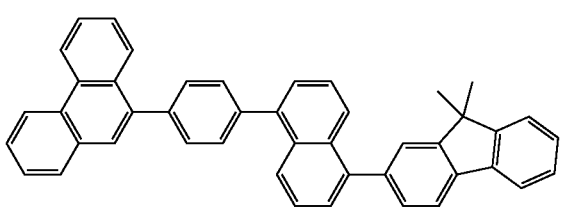
H49
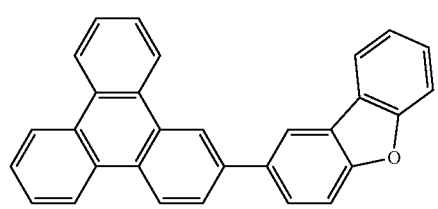
H50
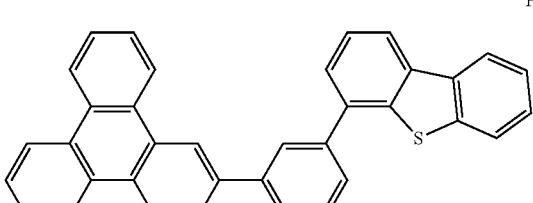
H51
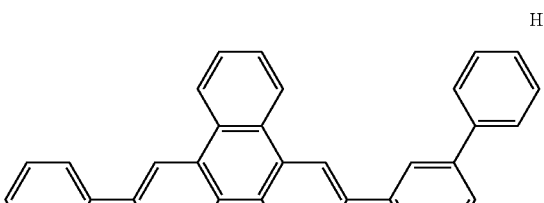
H52
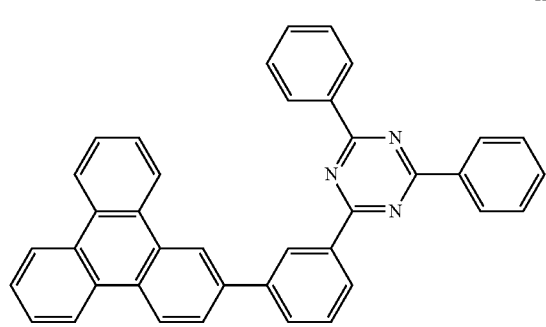
H53
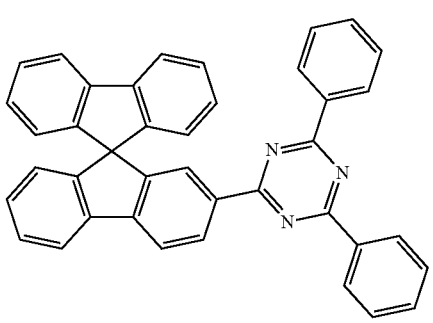
H54
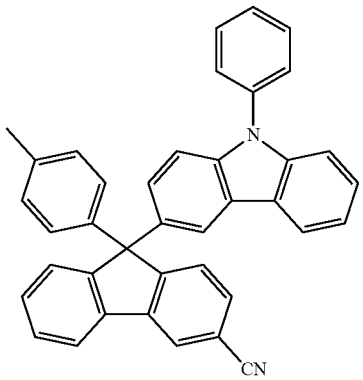
H55
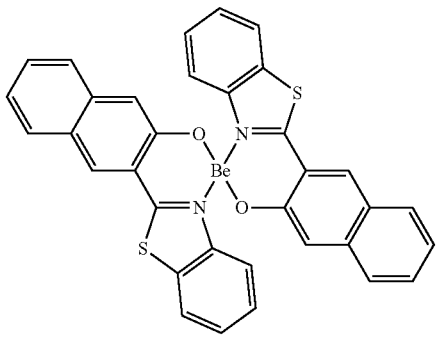

H56
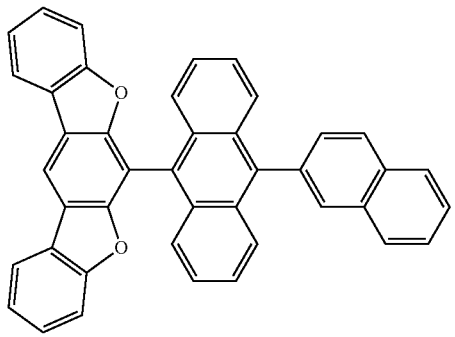
H57
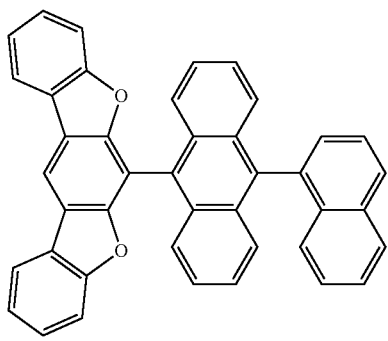
H58
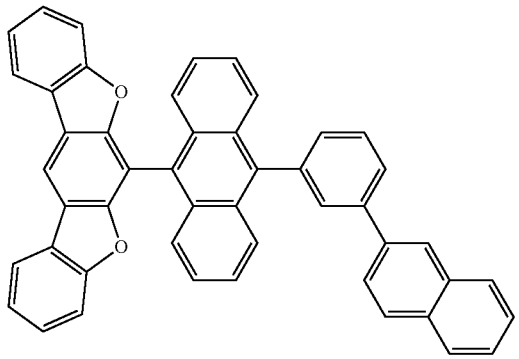
H59
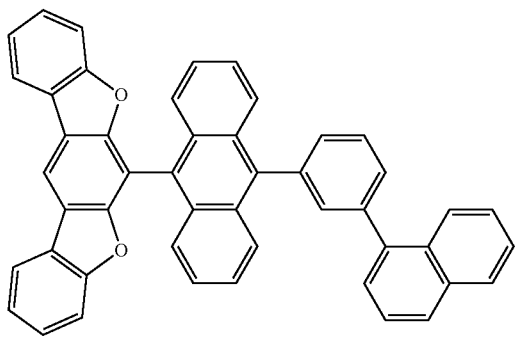
H60
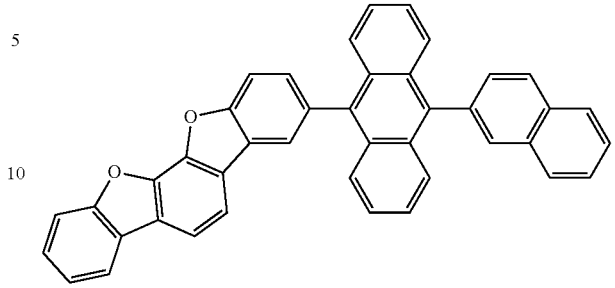
H61
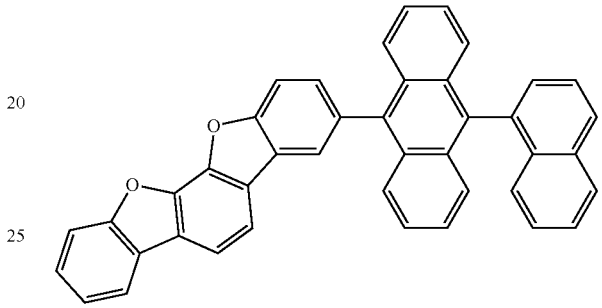
H62
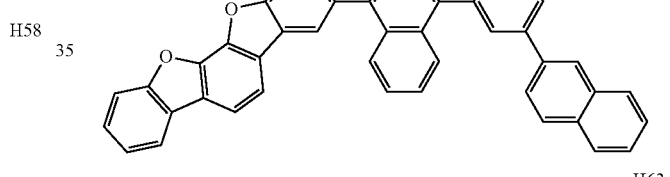
H63
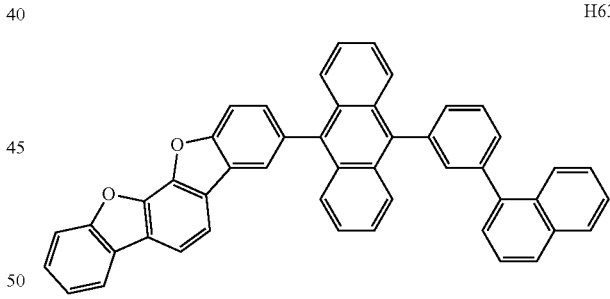
H64
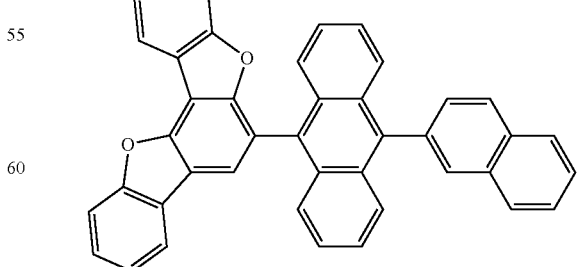

H65
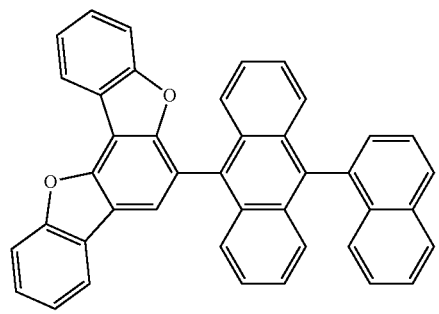
H66
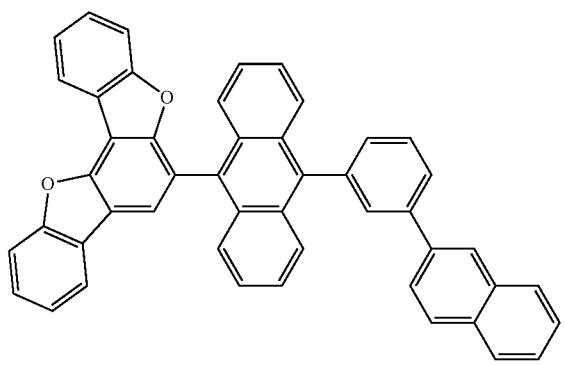
H67
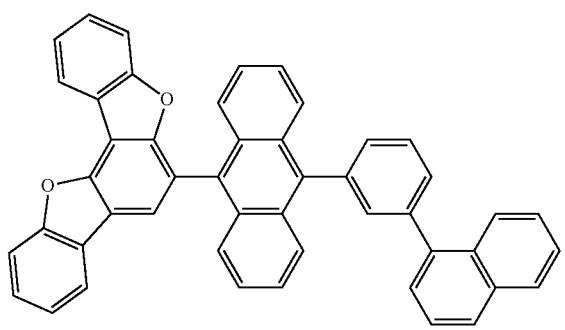
H68
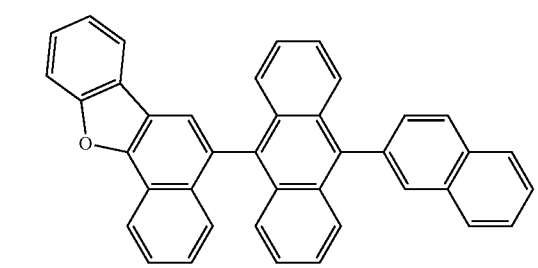
H69
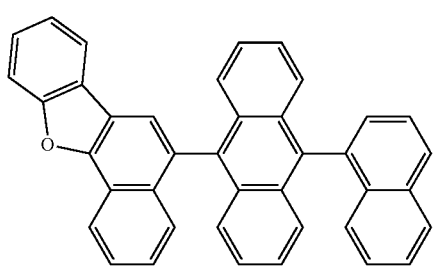
H70
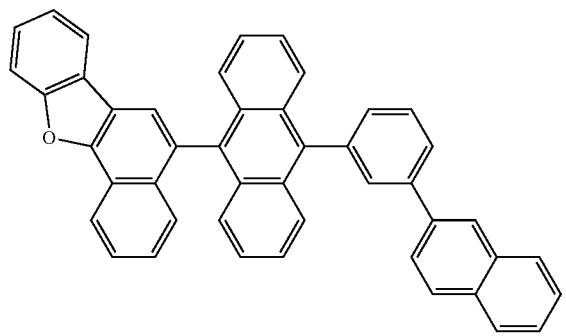
H71
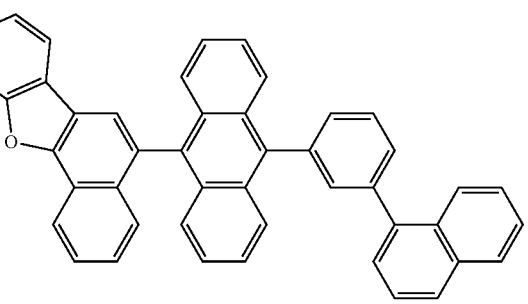
H72
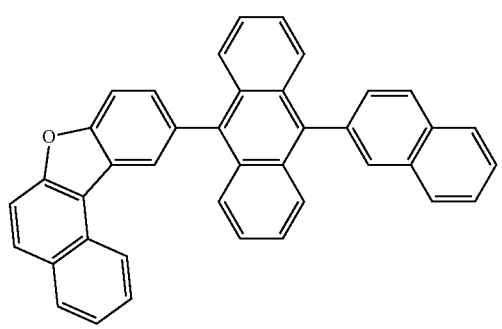
H73
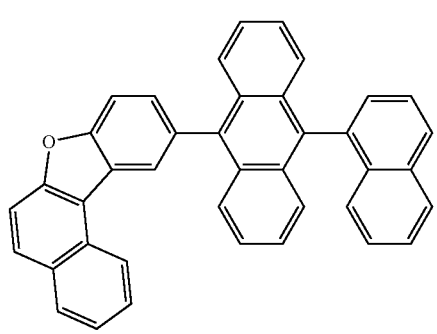

-continued
H74
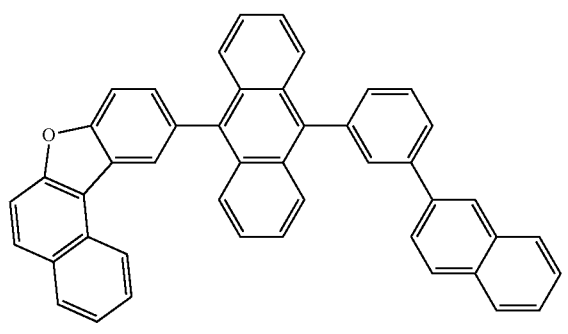
H75
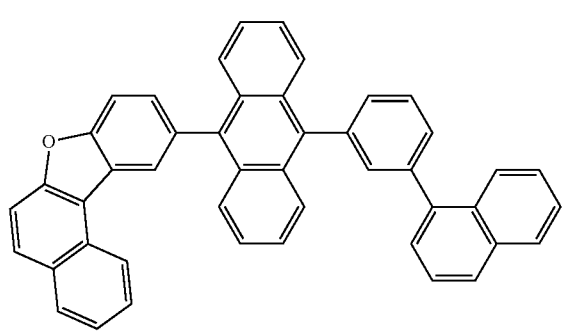
H76
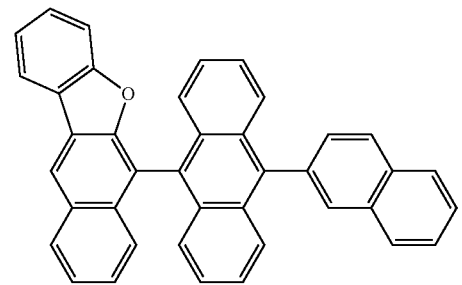
H77
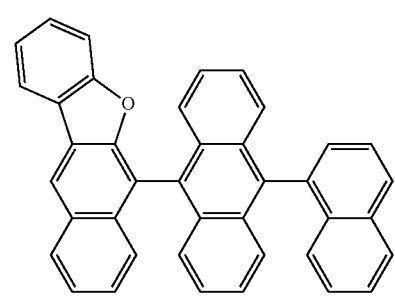
H78
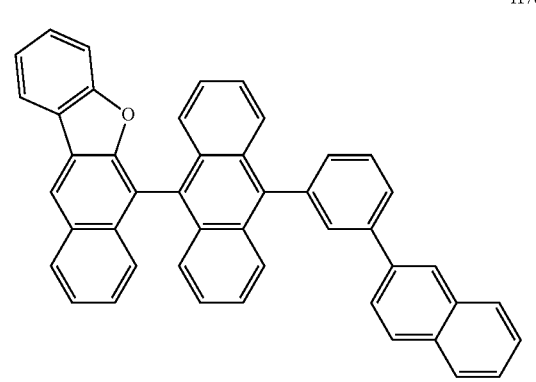
-continued
H79
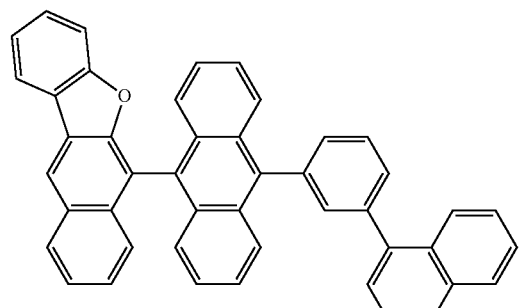
H80
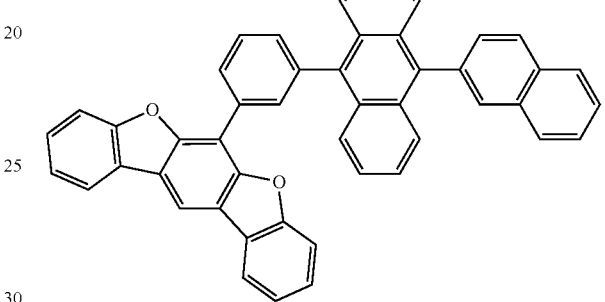
H81
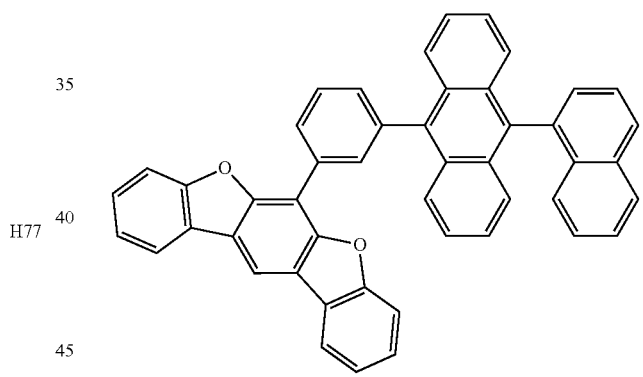
H82
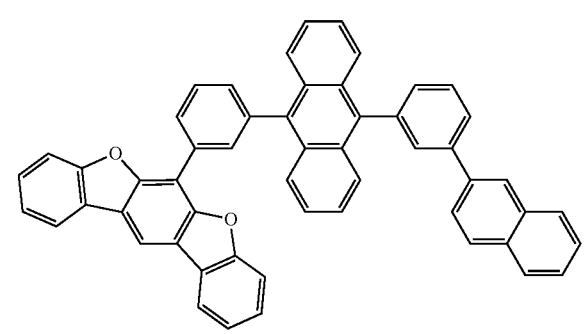

H83
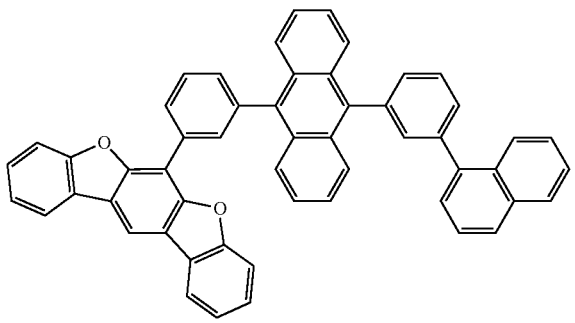
H84
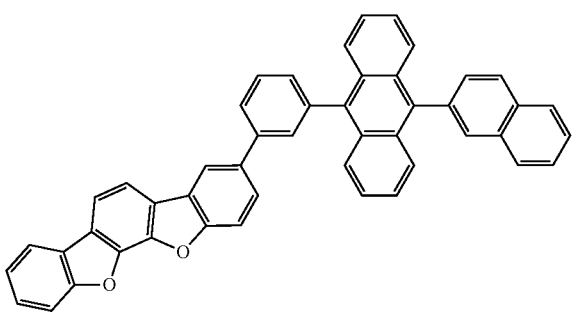
H85
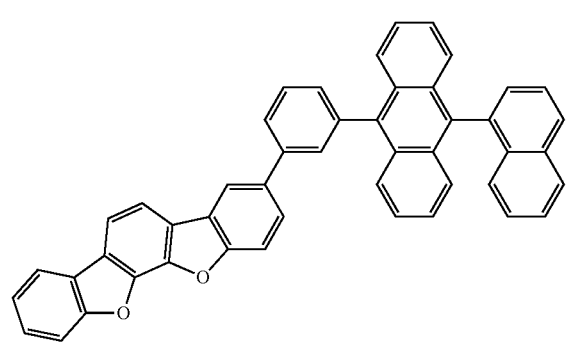
H86
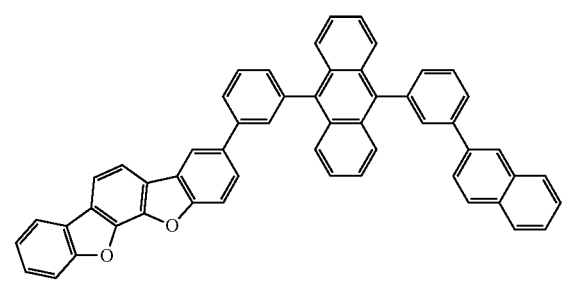
H87
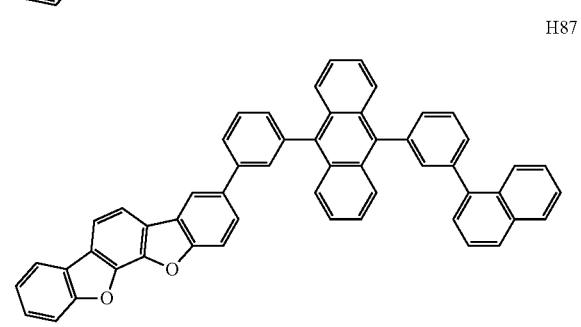
H88
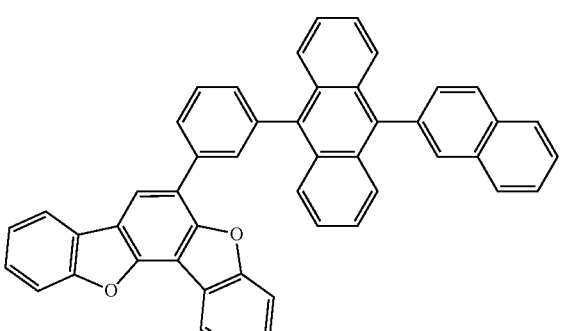
H89
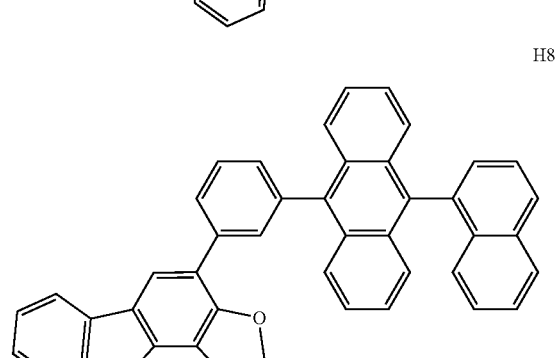
H90
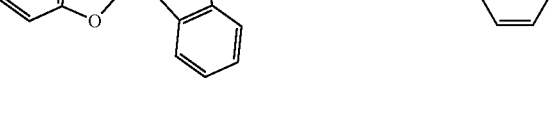
H91
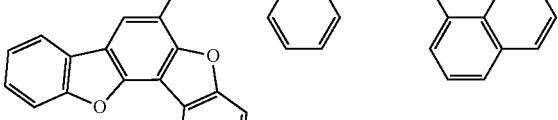

-continued
H92
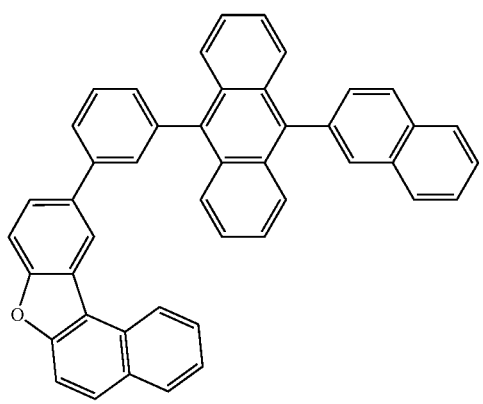
H93
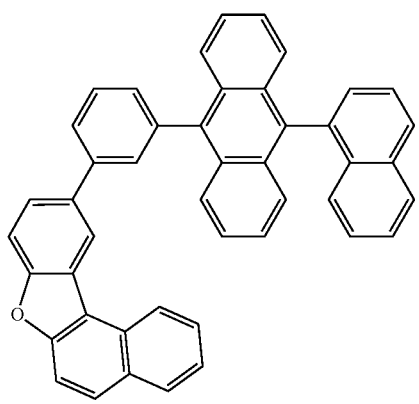
H94
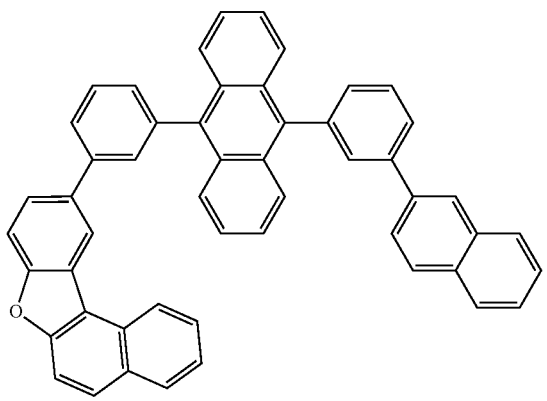
H95
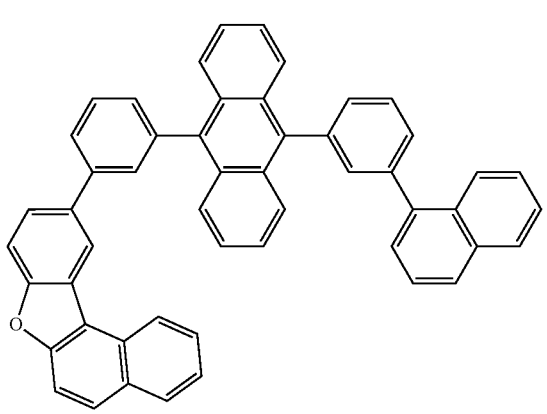
-continued
H96
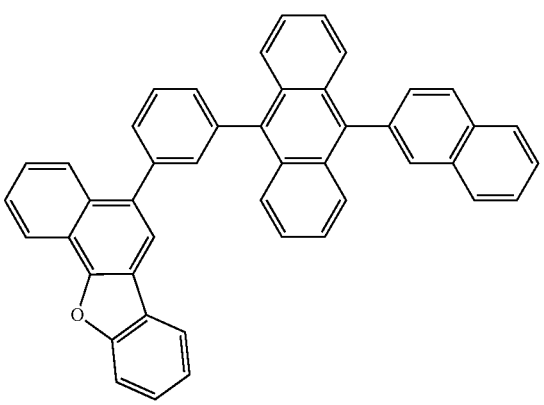
H97
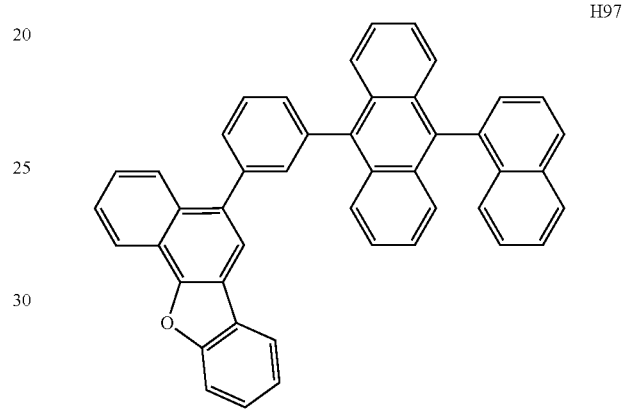
H98
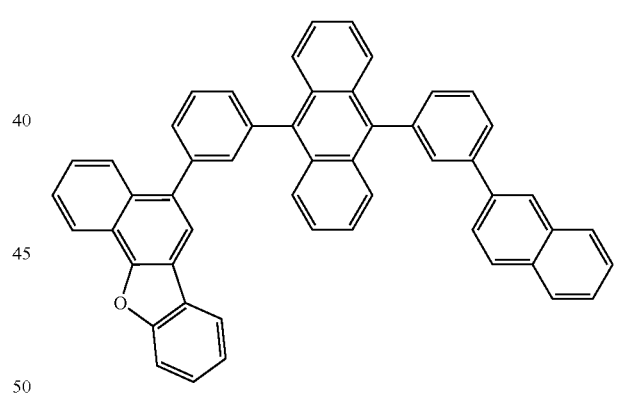
H99
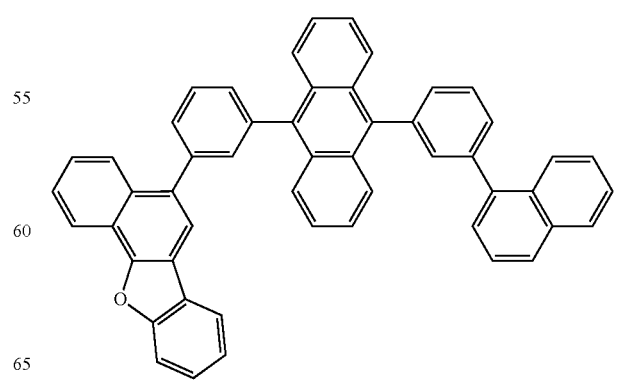

H100
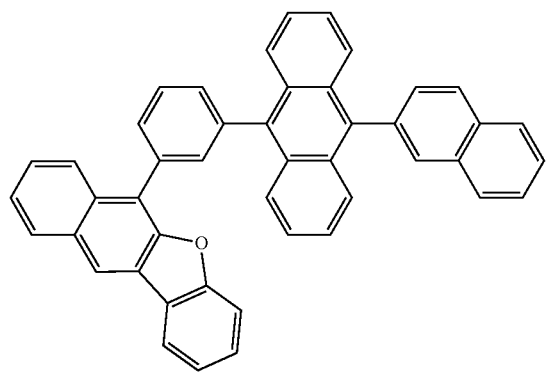
H101
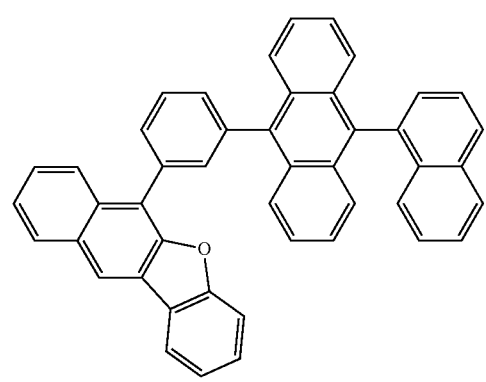
H102
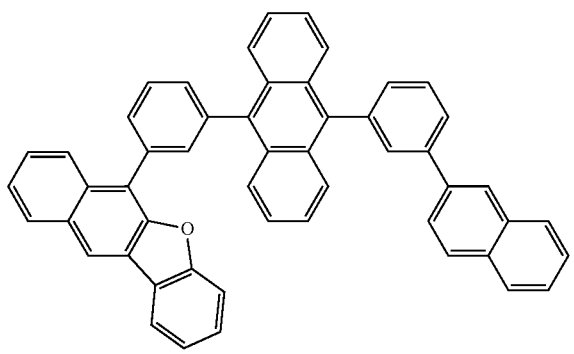
H103
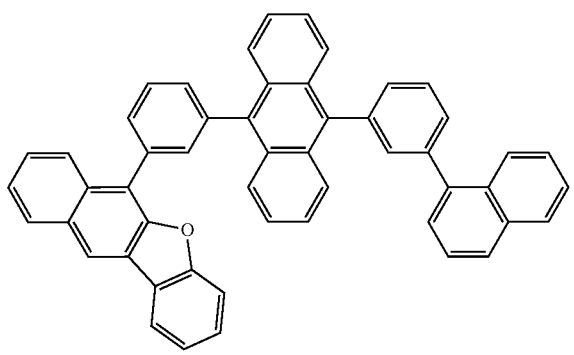
H104
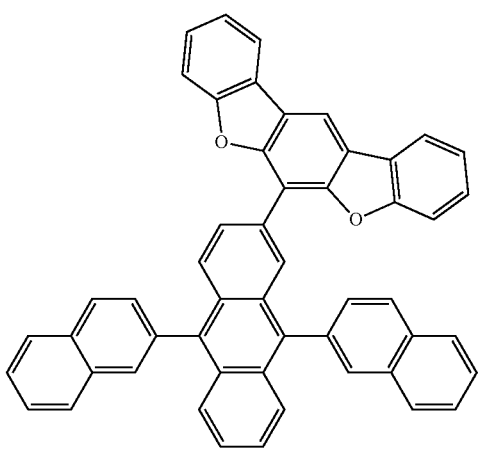
H105
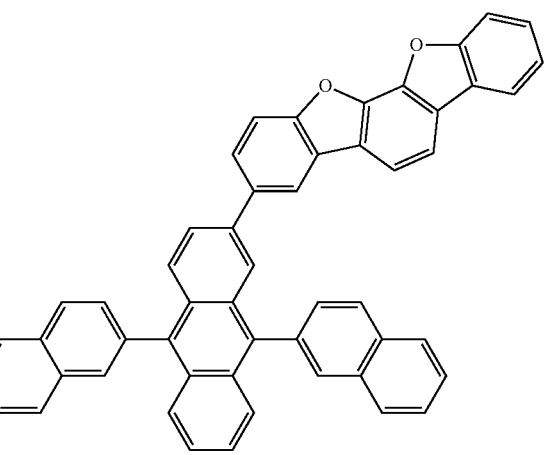
H106
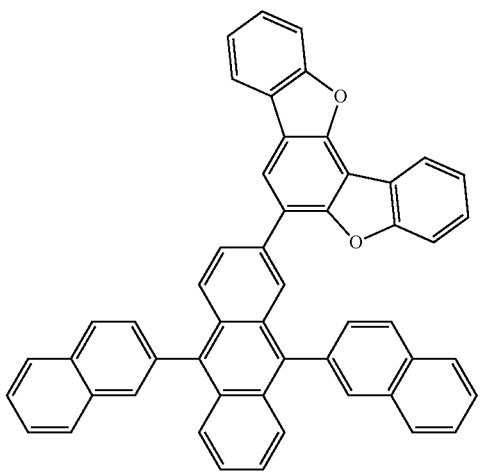

-continued
H107
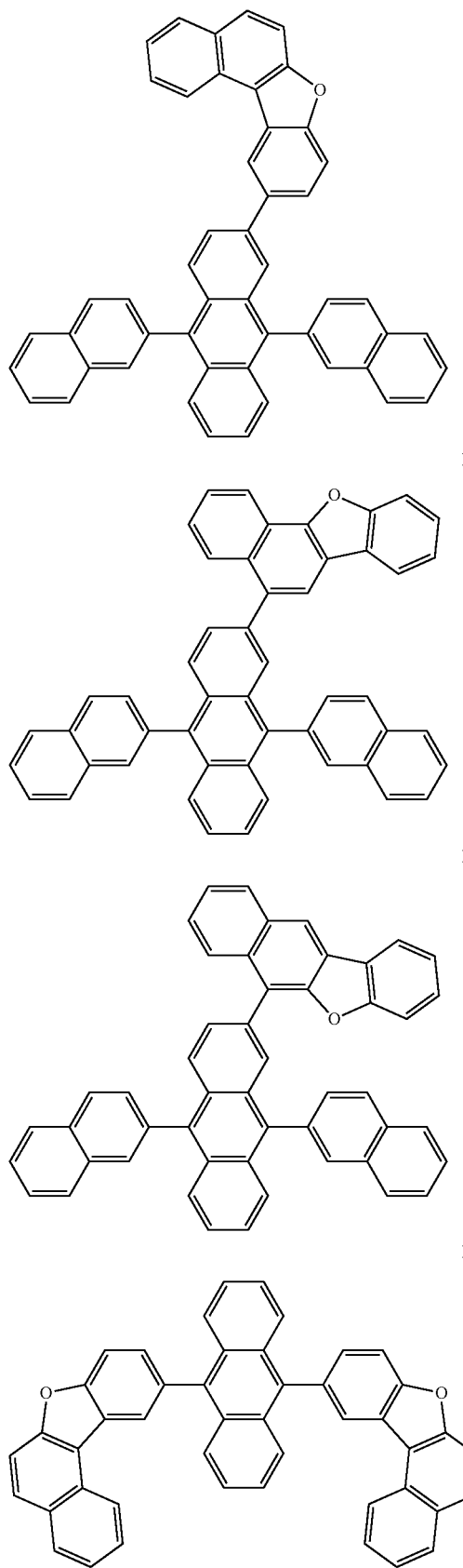
H108
H109
H110
-continued
H111
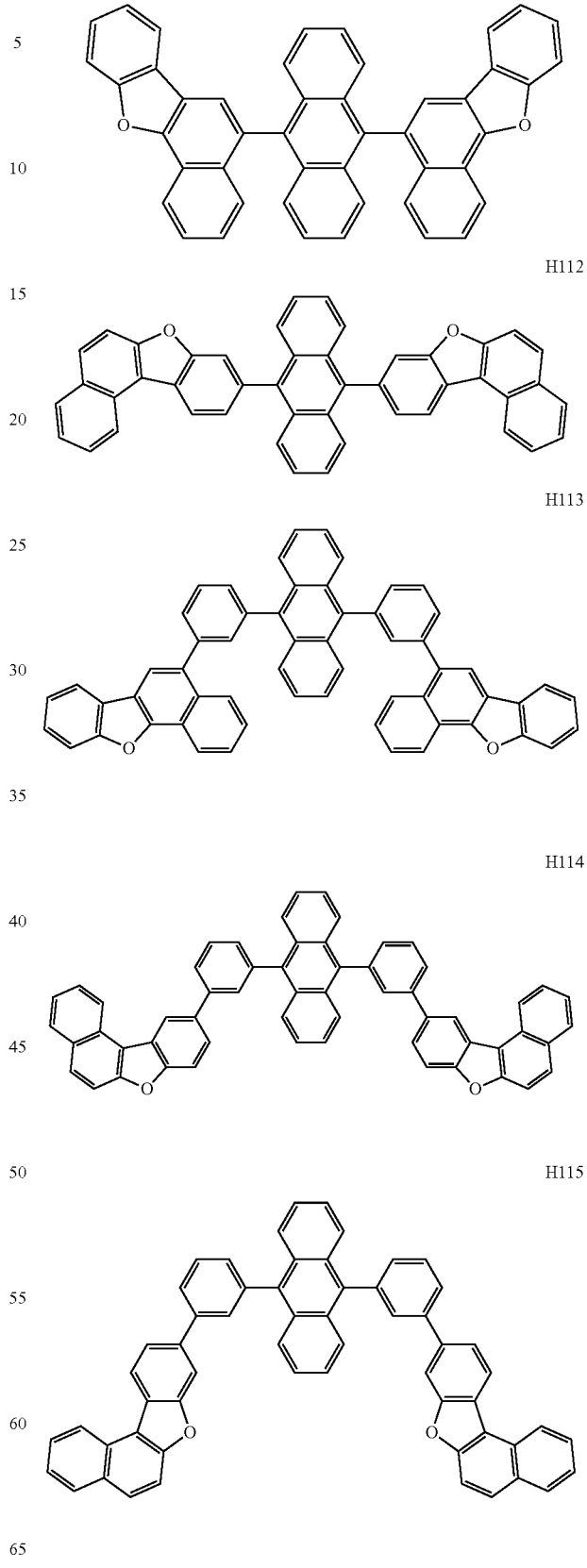
H112
H113
H114
H115

H116
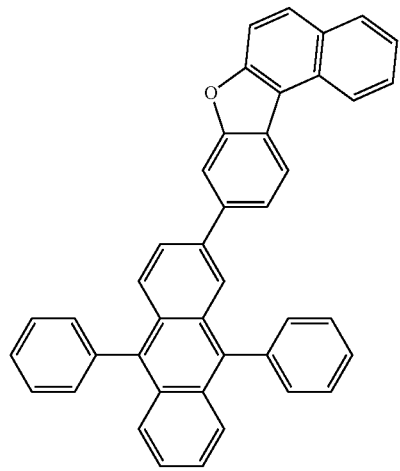
H117
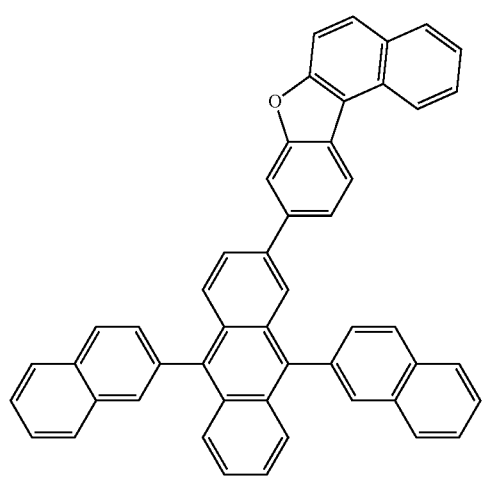
H118
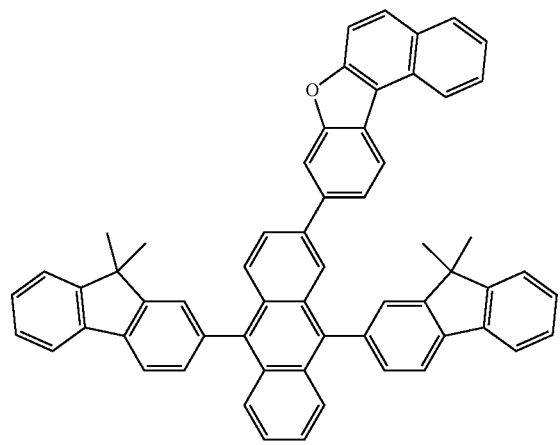
H119
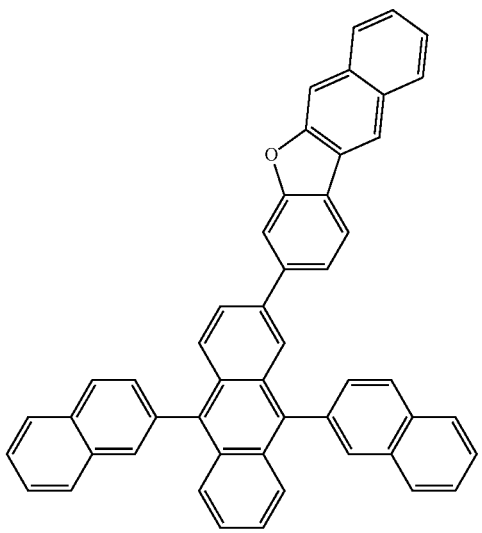
H120
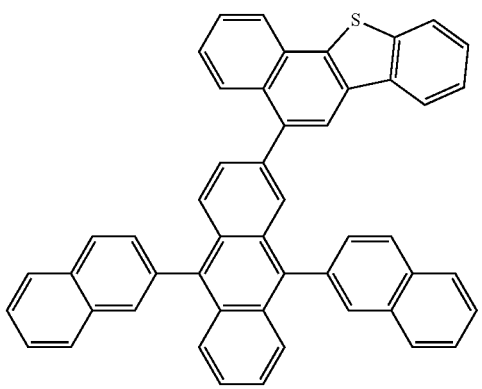
H121
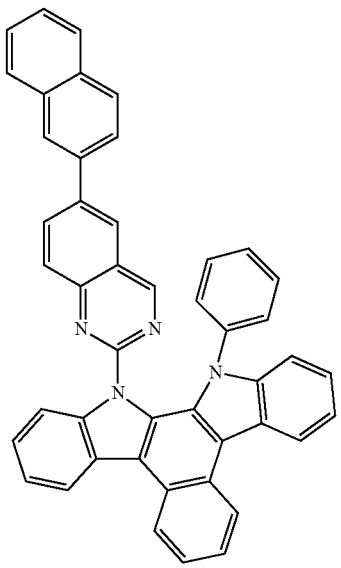

-continued

H122

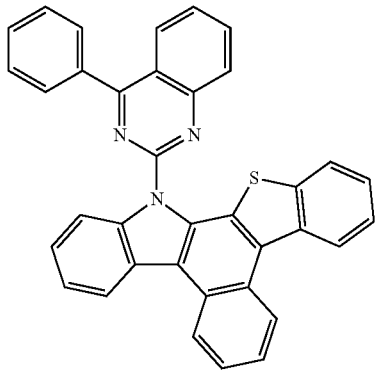

H123

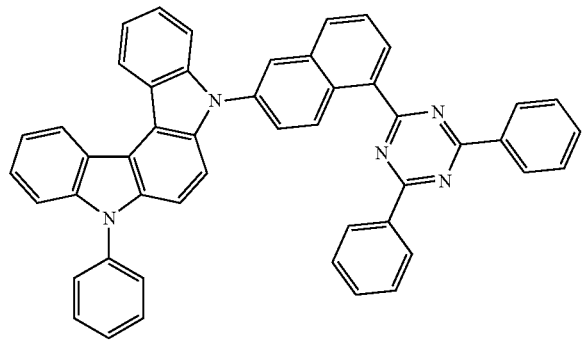

H124

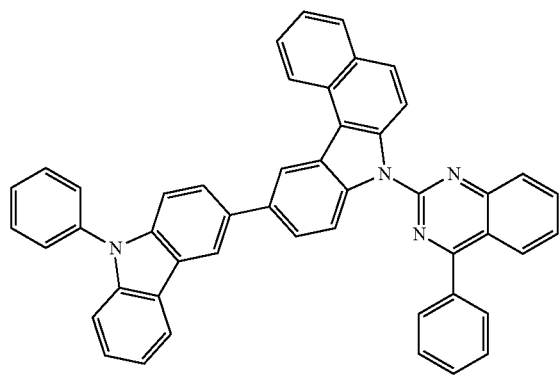

Phosphorescent Dopant

In one or more embodiments, the phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In one or more embodiments, the phosphorescent dopant may include an organometallic compound represented by Formula 401:

$$M(L_{401})_{xc1}(L_{402})_{xc2}$$ Formula 401

-continued

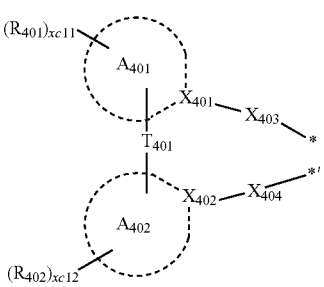

Formula 402

In Formulae 401 and 402,

M may be transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein when xc1 is two or more, two or more of $L_{401}$(s) may be identical to or different from each other, $L_{402}$ may be an organic ligand, and xc2 may be 0, 1, 2, 3, or 4, and when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*' *—C($Q_{411}$)($Q_{412}$)*', *—C($Q_{411}$)=C($Q_{412}$)-*', *—C($Q_{411}$)=*', or *=C=*', $X_{403}$ and $X_{404}$ may each independently be a chemical bond (for example, a covalent bond or a coordination bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ are the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ are the same as described in connection with $Q_1$, xc11 and xc12 may each independently be an integer from 0 to 10, and

* and *' in Formula 402 each indicate a binding site to M in Formula 401.

In one or more embodiments, in Formula 402, i) $X_{401}$ is nitrogen, and $X_{402}$ is carbon, or ii) each of $X_{401}$ and $X_{402}$ is nitrogen.

In one or more embodiments, when xc1 in Formula 401 is 2 or more, two rings $A_{401}$ in two or more of $L_{401}$(s) may be optionally linked to each other via $T_{402}$, which is a linking group, and two rings $A_{402}$ may optionally be linked to each other via $T_{403}$, which is a linking group (see Compounds PD1 to PD4 and PD7). $T_{402}$ and $T_{403}$ are the same as described in connection with $T_{401}$.

$L_{402}$ in Formula 401 may be an organic ligand. In one or more embodiments, $L_{402}$ may include a halogen group, a diketone group (for example, an acetylacetonate group), a carboxylic acid group (for example, a picolinate group), —C(=O), an isonitrile group, —CN group, a phosphorus group (for example, a phosphine group, a phosphite group, etc.), or any combination thereof.

The phosphorescent dopant may include, for example, one of compounds PD1 to PD25, or any combination thereof:

PD1
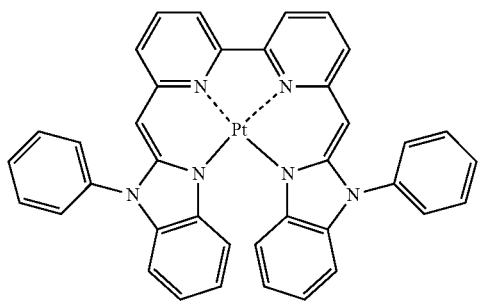

PD2
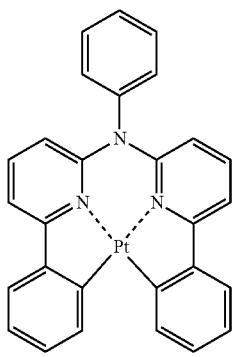

PD3
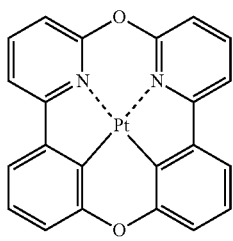

PD4
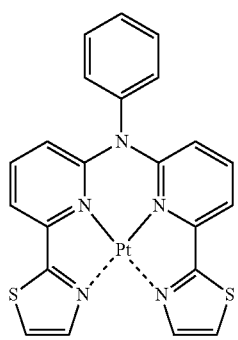

PD5
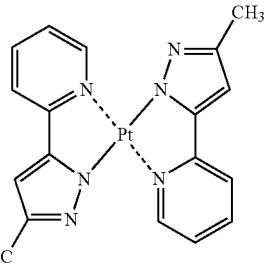

PD6
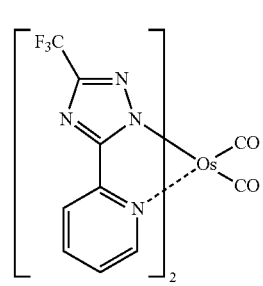

PD7
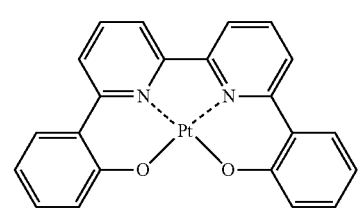

PD8
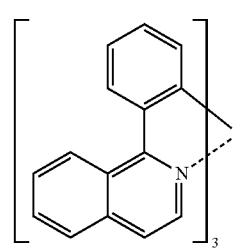

PD9
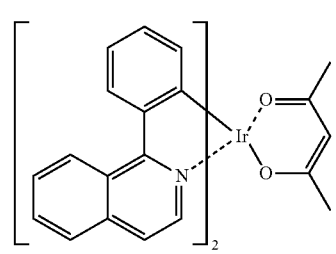

PD10
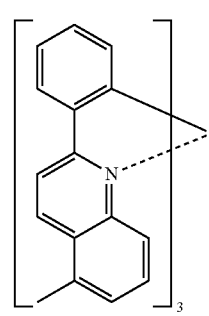

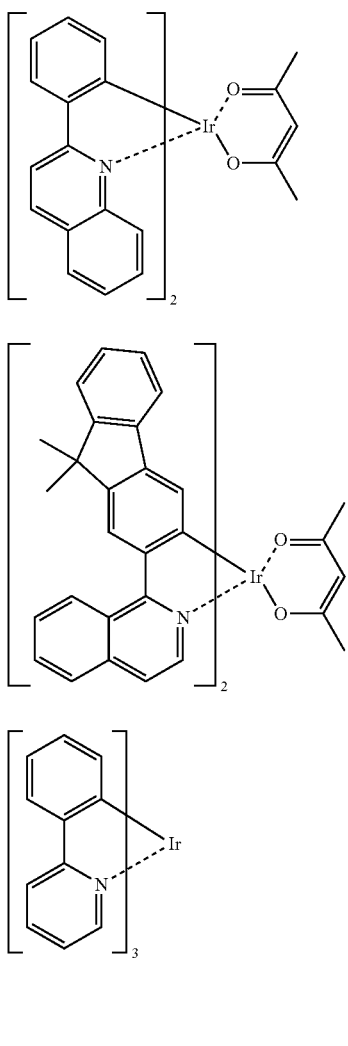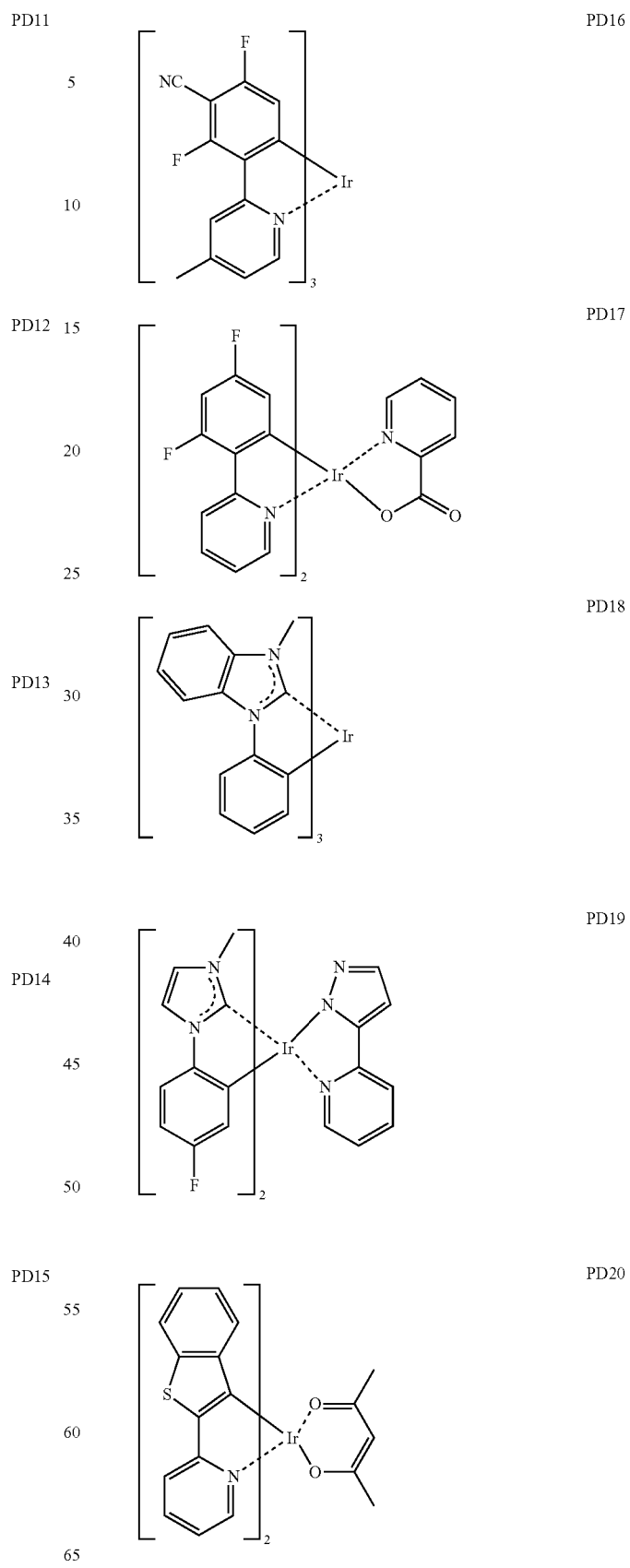

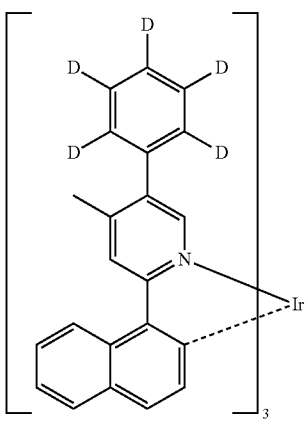

PD21

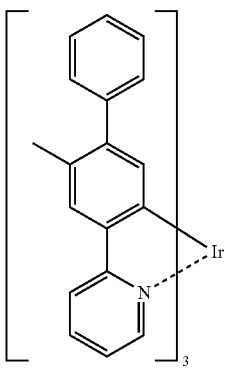

PD22

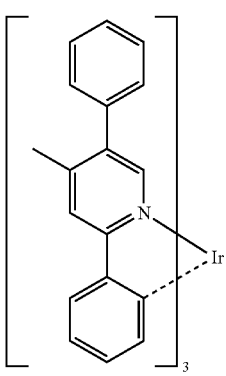

PD23

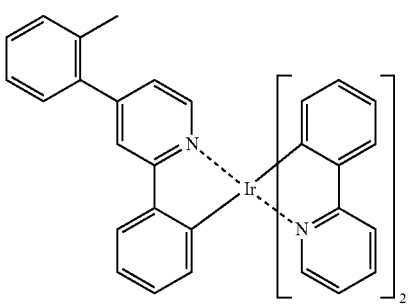

PD24

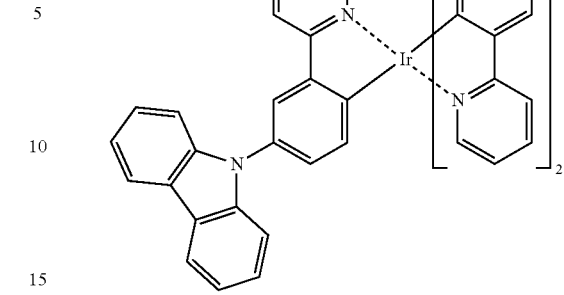

PD25

Fluorescent Dopant

The fluorescent dopant may include an amine group-containing compound, a styryl group-containing compound, or any combination thereof.

In one or more embodiments, the fluorescent dopant may include a compound represented by Formula 501:

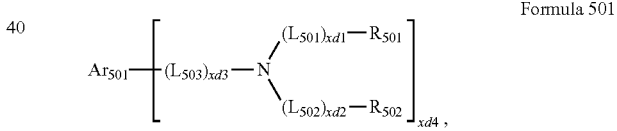

Formula 501 wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In one or more embodiments, $Ar_{501}$ in Formula 501 may be a condensed cyclic group (for example, an anthracene group, a chrysene group, or a pyrene group) in which three or more monocyclic groups are condensed together.

In one or more embodiments, xd4 in Formula 501 may be 2.

In one or more embodiments, the fluorescent dopant may include: one of Compounds FD1 to FD36; DPVBi; DPAVBi; or any combination thereof:

FD1
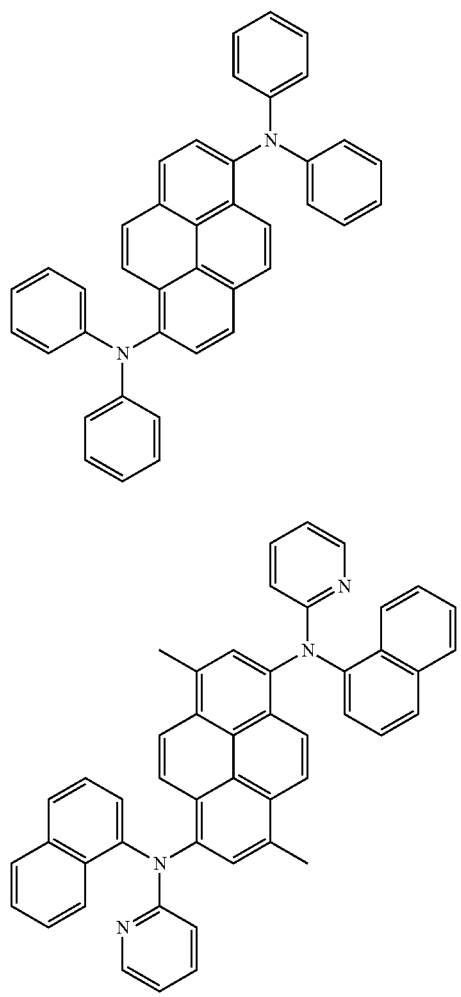
FD2
FD3
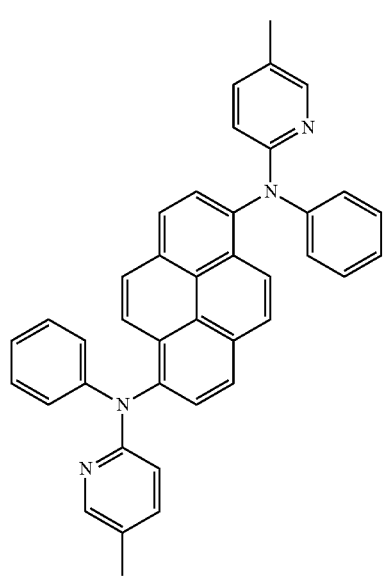
FD4
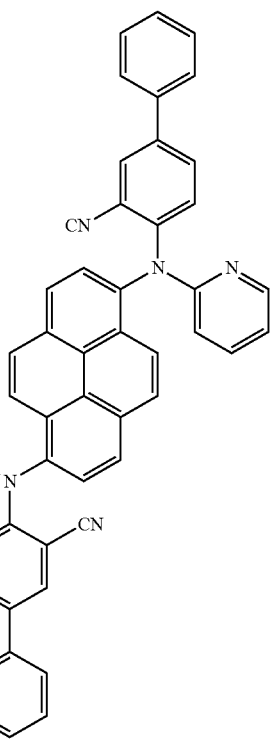
FD5
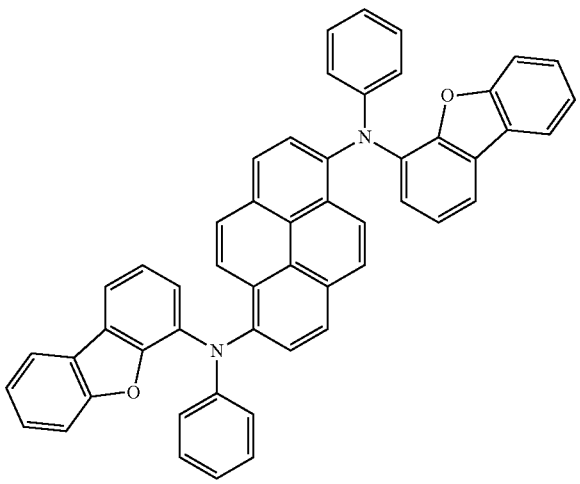

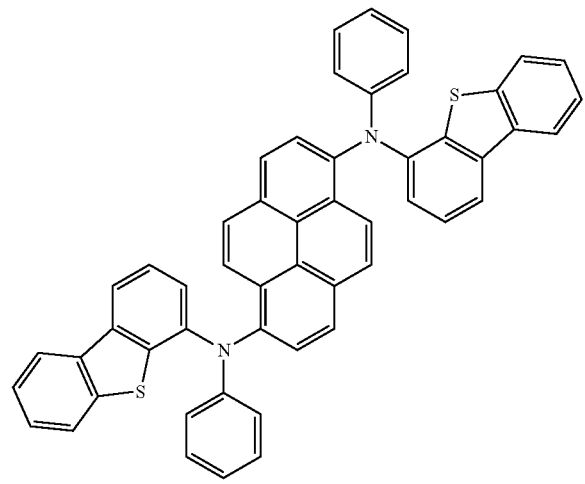
FD6
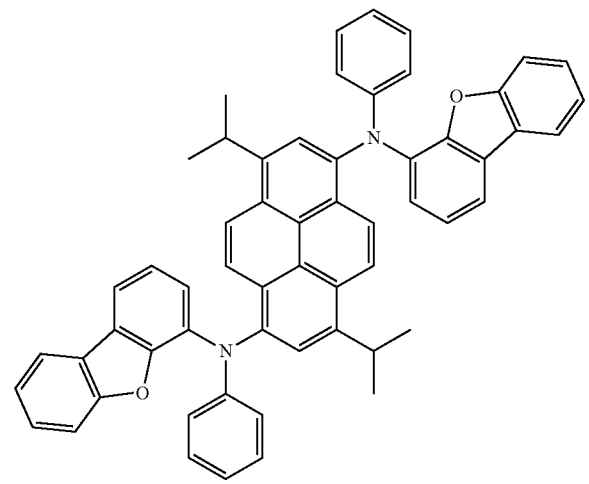
FD9
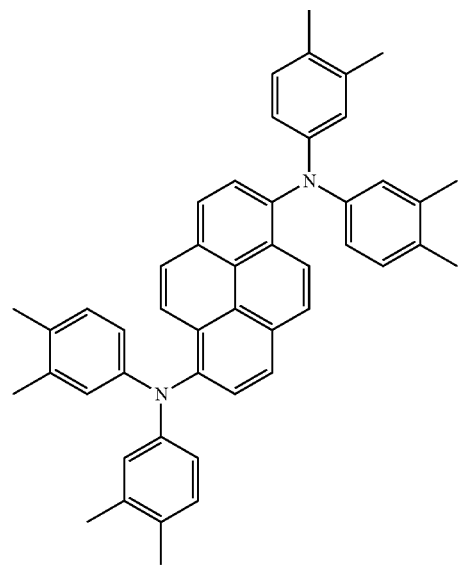
FD7
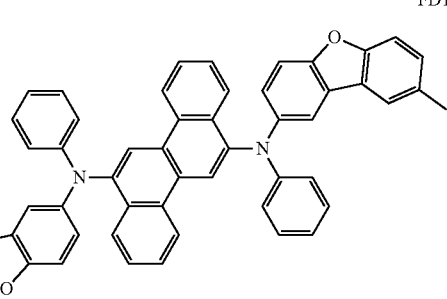
FD10
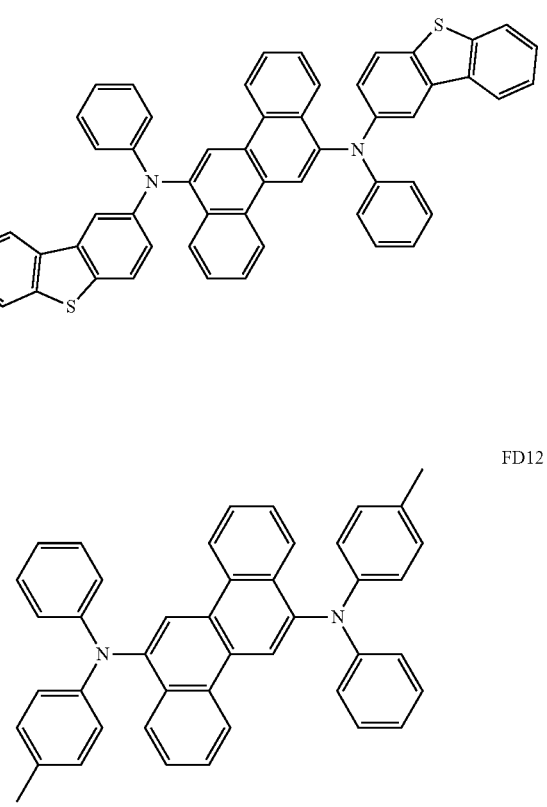
FD11
FD8
FD12

FD13
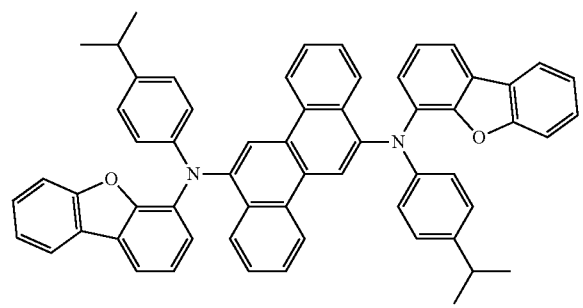
FD14
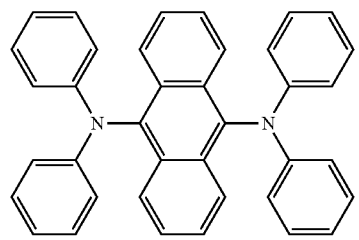
FD15
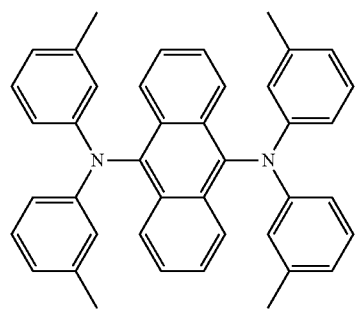
FD16
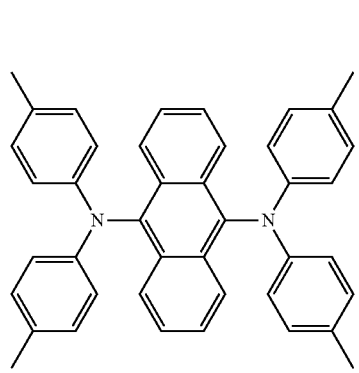
FD17
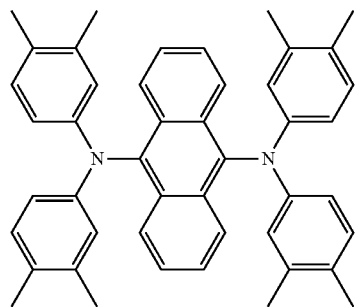
FD18
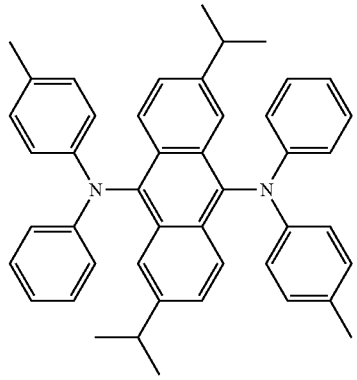
FD19
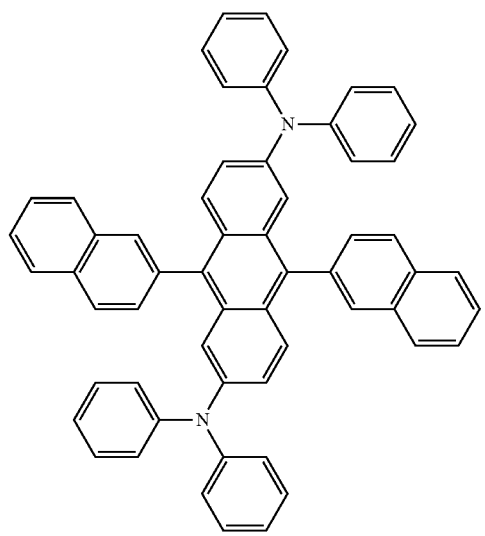
FD20
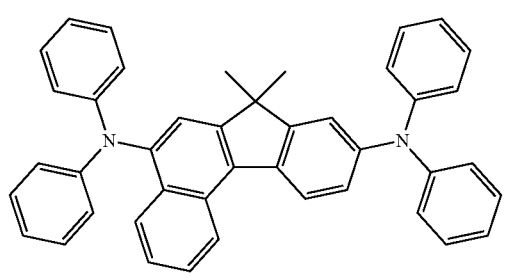
FD21
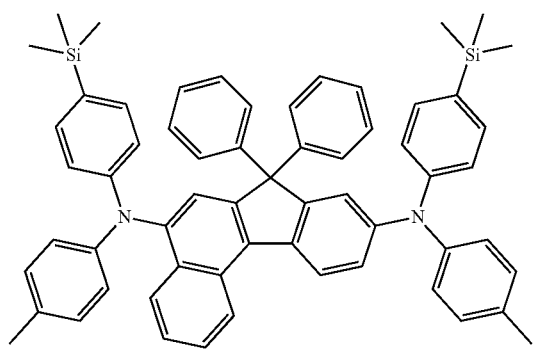

FD22
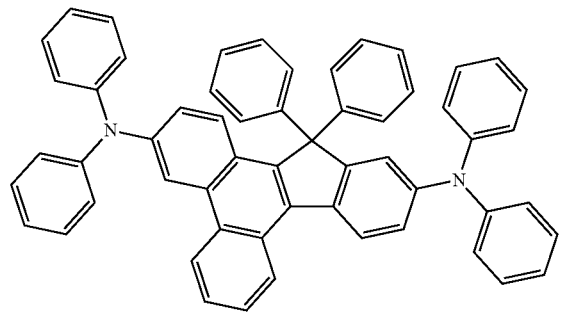
FD23
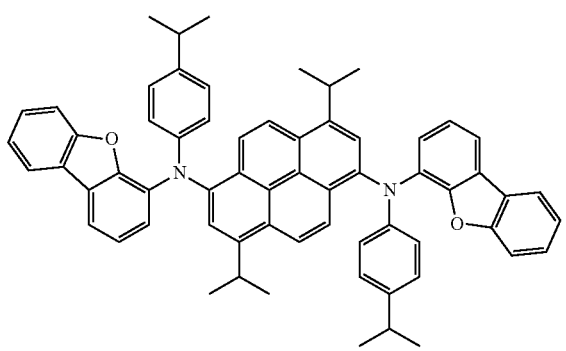
FD24
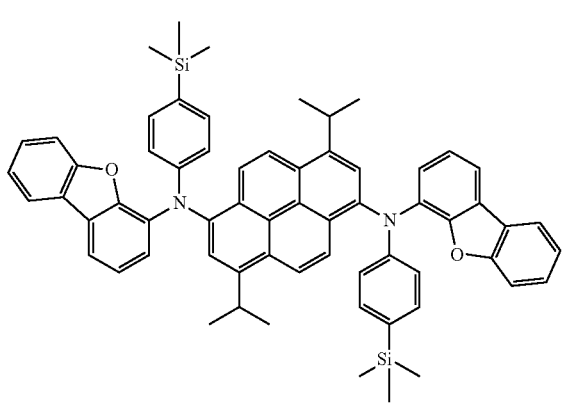
FD25
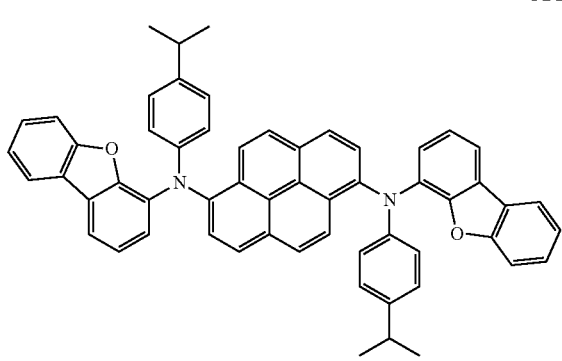
FD26
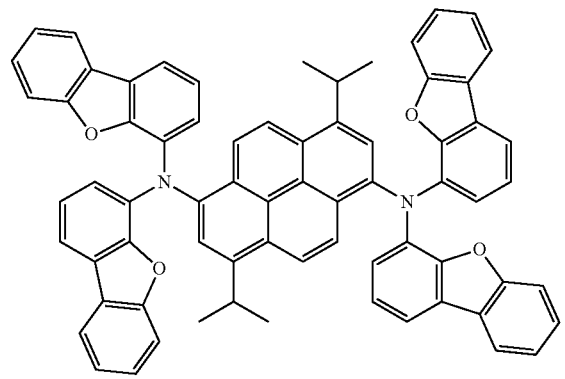
FD27
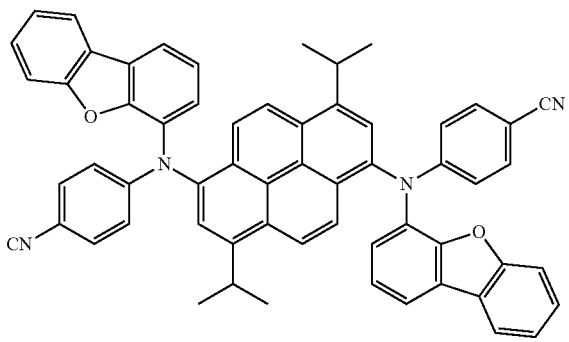
FD28
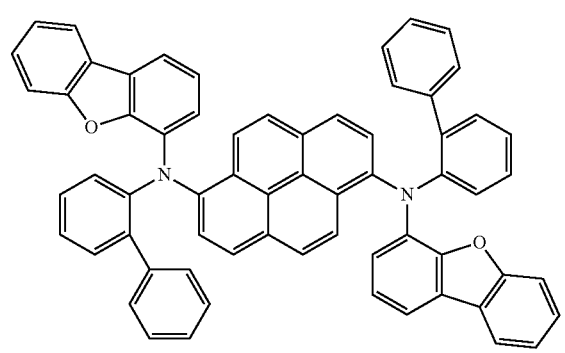
FD29
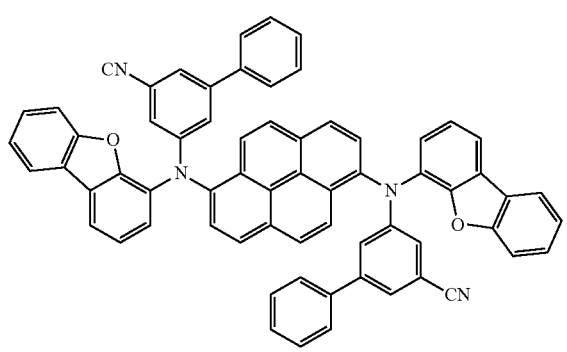

FD30
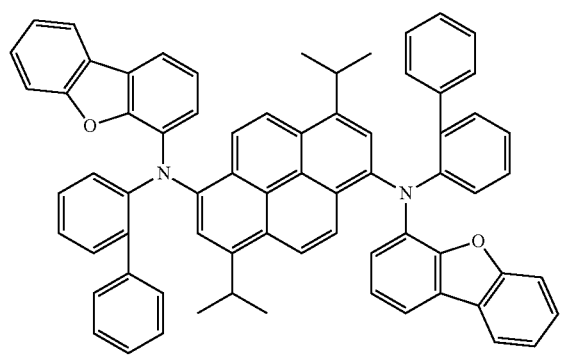
FD31
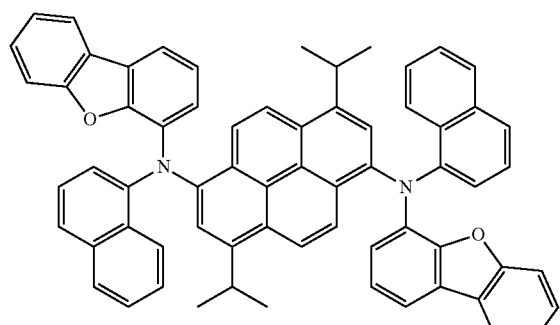
FD32
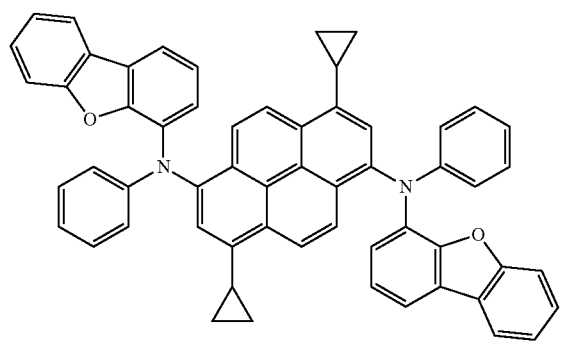
FD33
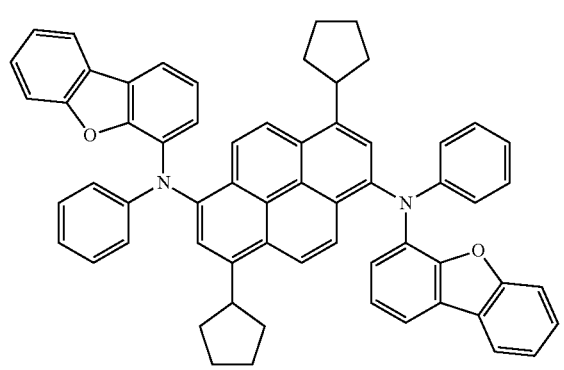
FD34
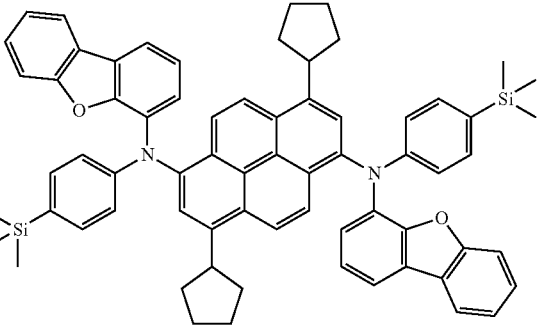
FD35
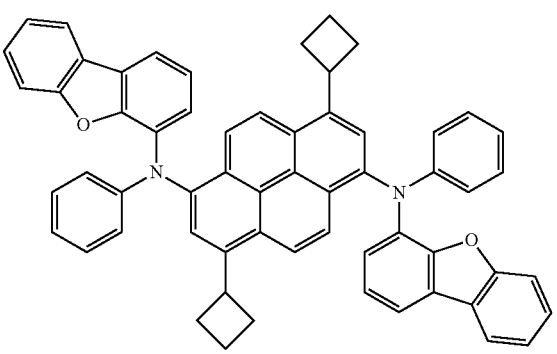
FD36
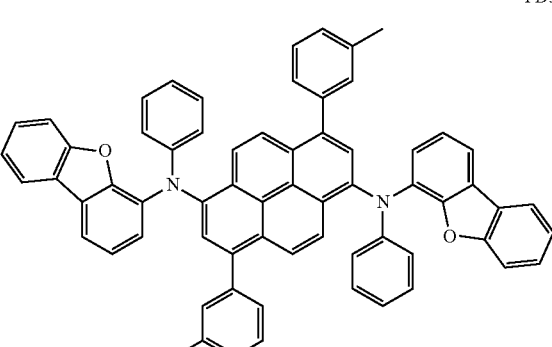
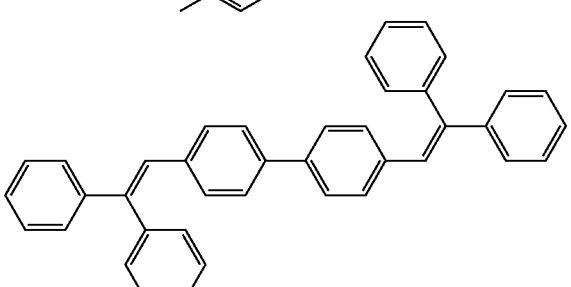
DPVBi
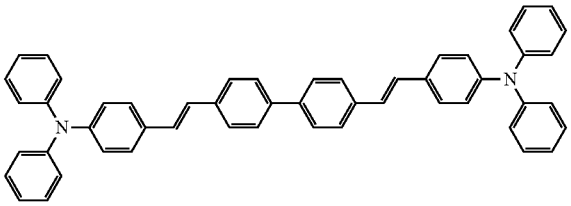
DPAVBi Delayed Fluorescence Material The emission layer 133 may include a delayed fluorescent material.

In the present specification, the delayed fluorescence material may be selected from compounds capable of emitting delayed fluorescence based on a delayed fluorescence emission mechanism.

The delayed fluorescent material included in the emission layer 133 may act as a host or a dopant depending on the kind (e.g., type) of other materials included in the emission layer 133.

In one or more embodiments, the difference between the triplet energy level (eV) of the delayed fluorescence material and the singlet energy level (eV) of the delayed fluorescence material may be greater than or equal to 0 eV and less than or equal to 0.5 eV. When the difference between the triplet energy level (eV) of the delayed fluorescence material and the singlet energy level (eV) of the delayed fluorescence material satisfies the above-described range, up-conversion from the triplet state to the singlet state of the delayed fluorescence materials may effectively occur, and thus, the emission efficiency of the light-emitting device 10 may be improved.

In one or more embodiments, the delayed fluorescence material may include i) a material including at least one electron donor (for example, a π electron-rich $C_3$-$C_{60}$ cyclic group, such as a carbazole group) and at least one electron acceptor (for example, a sulfoxide group, a cyano group, and/or a π electron-deficient nitrogen-containing $C_1$-$C_{60}$ cyclic group), and ii) a material including a $C_8$-$C_{60}$ polycyclic group in which two or more cyclic groups are condensed while sharing boron (B).

In one or more embodiments, the delayed fluorescence material may include at least one of the following compounds DF1 to DF9:

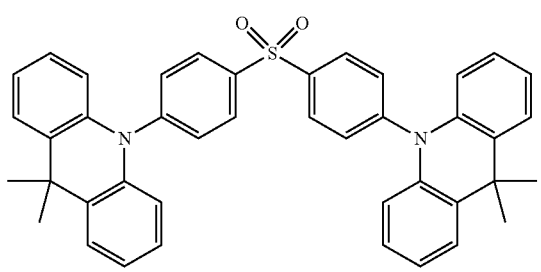

(DMAC-DPS)   DF1

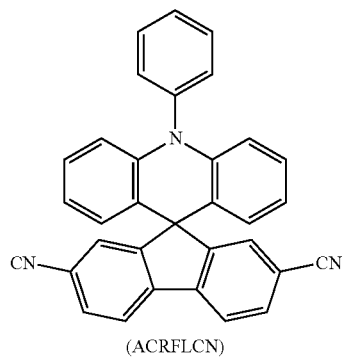

(ACRFLCN)   DF2

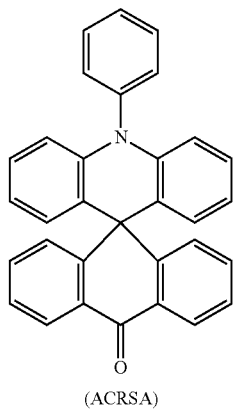

(ACRSA)   DF3

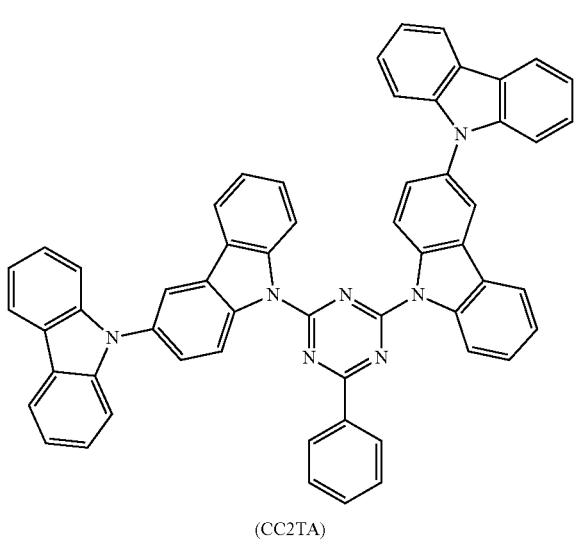

(CC2TA)   DF4

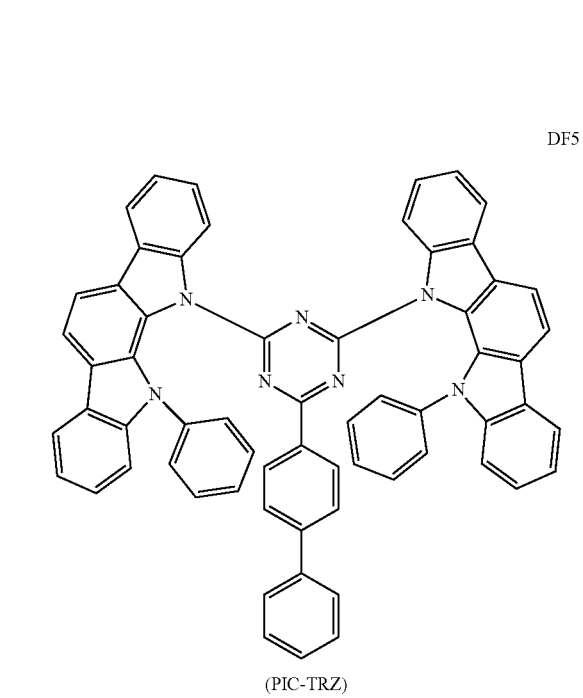

(PIC-TRZ)   DF5

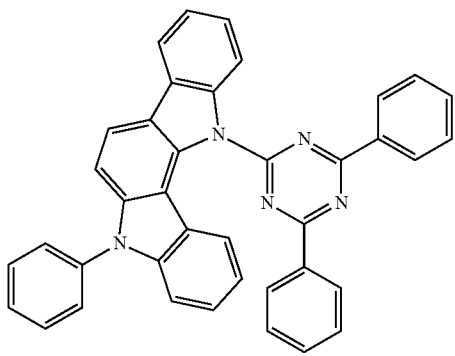

(PIC-TRZ2)

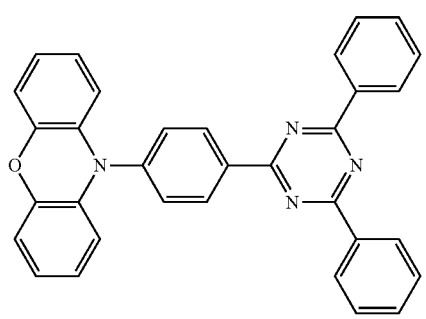

(PXZ-TRZ)

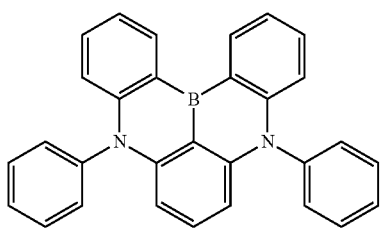

(DABNA-1)

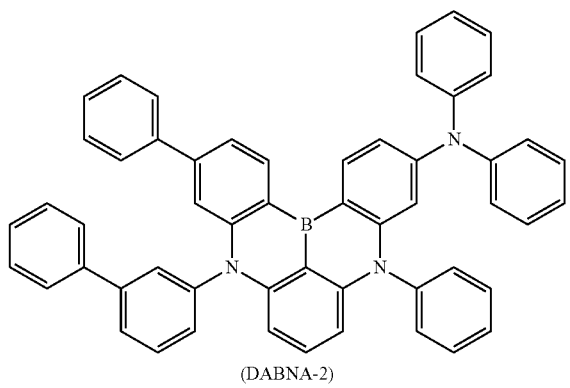

(DABNA-2)

Quantum Dot

In one or more embodiments, the emission layer 133 may include a quantum dot.

In the present specification, a quantum dot refers to a crystal of a semiconductor compound, and may include any material capable of emitting light of various suitable emission wavelengths according to the size of the crystal.

A diameter of the quantum dot may be, for example, in a range of about 1 nm to about 10 nm.

The quantum dot may be synthesized by a wet chemical process, a metal organic chemical vapor deposition process, a molecular beam epitaxy process, or any process similar thereto.

According to the wet chemical process, a precursor material is mixed with an organic solvent to grow a quantum dot particle crystal. When the crystal grows, the organic solvent naturally acts as a dispersant coordinated on the surface of the quantum dot crystal and controls the growth of the crystal so that the growth of quantum dot particles can be controlled through a process which is more easily performed than vapor deposition methods, such as metal organic chemical vapor deposition (MOCVD) and/or molecular beam epitaxy (MBE), and which requires low costs.

The quantum dot may include a Group II-VI semiconductor compound, a Group III-V semiconductor compound, a Group III-VI semiconductor compound, a Group I-III-VI semiconductor compound, a Group IV-VI semiconductor compound, a Group IV element or compound; or any combination thereof.

Examples of the Group II-VI semiconductor compound may include a binary compound, such as CdSe, CdTe, ZnS, ZnSe, ZnTe, ZnO, HgS, HgSe, HgTe, MgSe, and/or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and/or MgZnS; a quaternary compound, such as CdZnSeS, CdZnSeTe, CdZnSTe, CdHgSeS, CdHgSeTe, CdHgSTe, HgZnSeS, HgZnSeTe, and/or HgZnSTe; or any combination thereof.

Examples of the Group III-V semiconductor compound may include a binary compound, such as GaN, GaP, GaAs, GaSb, AlN, AlP, AlAs, AlSb, InN, InP, InAs, InSb, and/or the like; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, and/or the like; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and/or the like; or any combination thereof. In one or more embodiments, the Group III-V semiconductor compound may further include Group II elements. Examples of the Group III-V semiconductor compound further including Group II elements may include InZnP, InGaZnP, InAlZnP, etc.

Examples of the Group III-VI semiconductor compound may include a binary compound, such as GaS, GaSe, $Ga_2Se_3$, GaTe, InS, InSe, $In_2S_3$, $In_2Se_3$, and/or InTe; a ternary compound, such as $InGaS_3$, and/or $InGaSe_3$; or any combination thereof.

Examples of the Group I-III-VI semiconductor compound may include a ternary compound, such as AgInS, $AgInS_2$, CuInS, $CuInS_2$, $CuGaO_2$, $AgGaO_2$, and/or $AgAlO_2$; or any combination thereof.

Examples of the Group IV-VI semiconductor compound may include a binary compound, such as SnS, SnSe, SnTe, PbS, PbSe, PbTe, and/or the like; a ternary compound, such as SnSeS, SnSeTe, SnSTe, PbSeS, PbSeTe, PbSTe, SnPbS, SnPbSe, SnPbTe, and/or the like; a quaternary compound, such as SnPbSSe, SnPbSeTe, SnPbSTe, and/or the like; or any combination thereof.

The Group IV element or compound may include a single element compound, such as Si and/or Ge; a binary compound, such as SiC and/or SiGe; or any combination thereof.

Each element included in a multi-element compound such as the binary compound, ternary compound and/or quaternary compound, may exist in a particle with a uniform concentration or non-uniform concentration.

In one or more embodiments, the quantum dot may have a single structure or a dual core-shell structure. In the case of the quantum dot having a single structure, the concentration of each element included in the corresponding quantum dot is uniform. In one or more embodiments, the material contained in the core and the material contained in the shell may be different from each other.

The shell of the quantum dot may act as a protective layer to prevent or reduce chemical degeneration of the core to maintain semiconductor characteristics and/or as a charging layer to impart electrophoretic characteristics to the quantum dot.

The shell may be a single layer or a multi-layer. The element present at the interface between the core and the shell may have a concentration gradient that decreases toward the center of the quantum dot.

Examples of the shell of the quantum dot may be an oxide of metal, metalloid, and/or non-metal, a semiconductor compound, and any combination thereof.

Examples of the oxide of metal, metalloid, and/or non-metal may include a binary compound, such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, and/or $NiO$; a ternary compound, such as $MgAl_2O_4$, $CoFe_2O_4$, $NiFe_2O_4$, and/or $CoMn_2O_4$; and any combination thereof. Examples of the semiconductor compound may include, as described herein, a Group II-VI semiconductor compound; a Group III-V semiconductor compound; a Group III-VI semiconductor compound; a Group I-III-VI semiconductor compound; a Group IV-VI semiconductor compound; or any combination thereof. In one or more embodiment, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width at half maximum (FWHM) of an emission wavelength spectrum of the quantum dot may be about 45 nm or less, for example, about 40 nm or less, for example, about 30 nm or less, and within these ranges, color purity and/or color gamut (e.g., color reproducibility) may be increased. In addition, because the light emitted through the quantum dot is emitted in all directions, the wide viewing angle can be improved.

In one or more embodiments, the quantum dot may be a spherical particle, a pyramidal particle, a multi-arm particle, a cubic nanoparticle, a nanotube particle, a nanowire particle, a nanofiber particle, and/or a nanoplate particle.

Because the energy band gap can be adjusted by controlling the size of the quantum dot, light having various suitable wavelength bands can be obtained from the quantum dot emission layer. Therefore, by utilizing quantum dots of different sizes, a light-emitting device that emits light of various suitable wavelengths may be implemented. In one or more embodiments, the size of the quantum dot may be selected to emit red, green and/or blue light. In one or more embodiments, the size of the quantum dot may be configured to emit white light by combining light of various suitable colors.

Electron-Transporting Region 135 in Interlayer 130

The electron-transporting region 135 may have: i) a single-layered structure consisting of a single layer consisting of a single material, ii) a single-layered structure including (e.g., consisting of) a single layer including (e.g., consisting of) a plurality of different materials, or iii) a multi-layered structure including a plurality of layers including different materials.

The electron-transporting region 135 may include a buffer layer, a hole-blocking layer, an electron control layer, an electron-transporting layer, an electron injection layer, or any combination thereof.

In one or more embodiments, the electron-transporting region 135 may have an electron-transporting layer/electron injection layer structure, a hole-blocking layer/electron-transporting layer/electron injection layer structure, an electron control layer/electron-transporting layer/electron injection layer structure, or a buffer layer/electron-transporting layer/electron injection layer structure, wherein, for each structure, constituting layers are sequentially stacked from the emission layer 133 in the respective stated order.

In one or more embodiments, the electron-transporting region 135 (for example, the buffer layer, the hole-blocking layer, the electron control layer, and/or the electron-transporting layer in the electron-transporting region 135) may include a metal-free compound including at least one π electron-deficient nitrogen-containing $C_1$-$C_{60}$ cyclic group.

In one or more embodiments, the electron-transporting region 135 may include a compound represented by Formula 601 below:

Formula 601 wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$)($Q_{602}$)($Q_{603}$), —C(=O)($Q_{601}$), —S(=O)$_2$($Q_{601}$), or —P(=O)($Q_{601}$)($Q_{602}$), $Q_{601}$ to $Q_{603}$ are the same as described in connection with $Q_1$, xe21 may be 1, 2, 3, 4, or 5, at least one of $Ar_{601}$, $L_{601}$, or $R_{601}$ may each independently be a π electron-deficient nitrogen-containing $C_1$-$C_{60}$ cyclic group unsubstituted or substituted with at least one $R_{10a}$.

In one or more embodiments, when xe11 in Formula 601 is 2 or more, two or more of $Ar_{601}$(s) may be linked via a single bond.

In one or more embodiments, $Ar_{601}$ in Formula 601 may be a substituted or unsubstituted anthracene group.

In one or more embodiments, the electron-transporting region 135 may include a compound represented by Formula 601-1:

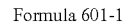

Formula 601-1

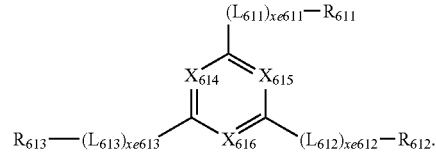

In Formula 601-1, $X_{614}$ may be N or $C(R_{614})$, $X_{615}$ may be N or $C(R_{615})$, $X_{616}$ may be N or $C(R_{616})$, at least one of $X_{614}$ to $X_{616}$ may be N, $L_{611}$ to $L_{613}$ are the same as described in connection with $L_{601}$, xe611 to xe613 are the same as described in connection with xe1, $R_{611}$ to $R_{613}$ are the same as described in connection with $R_{601}$, $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In one or more embodiments, xe1 and xe611 to xe613 in Formulae 601 and 601-1 may each independently be 0, 1, or 2.

The electron-transporting region 135 may include one of Compounds ET1 to ET45, 2,9-dimethyl-4,7-diphenyl-1,10-phenanthroline (BCP), 4,7-diphenyl-1,10-phenanthroline (Bphen), Alq3, BAlq, TAZ, NTAZ, diphenyl(4-(triphenylsilyl)phenyl)-phosphine oxide (TSPO1), or any combination thereof:

ET1

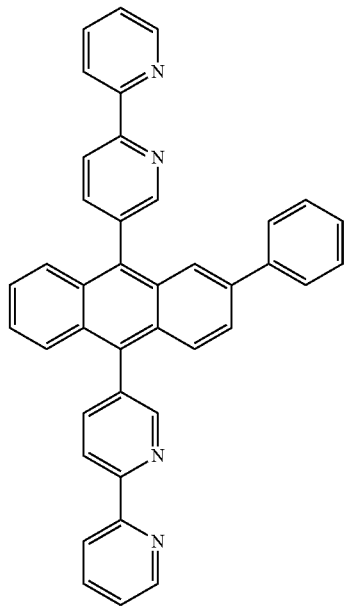

ET2

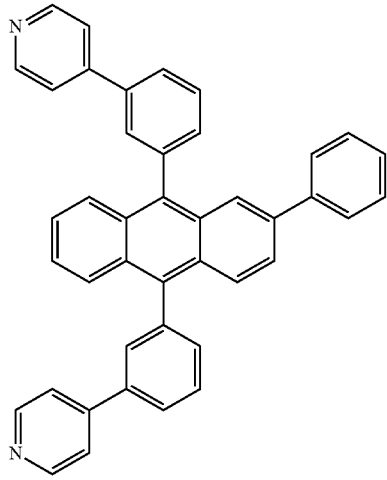

ET3

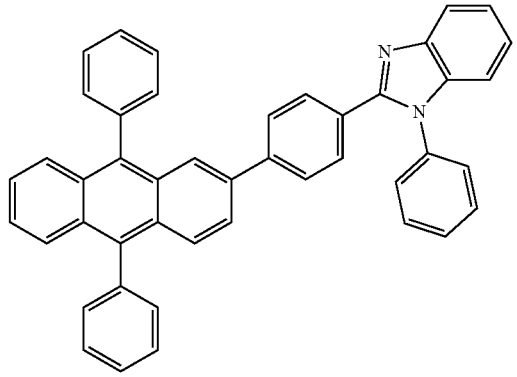

ET4

ET5
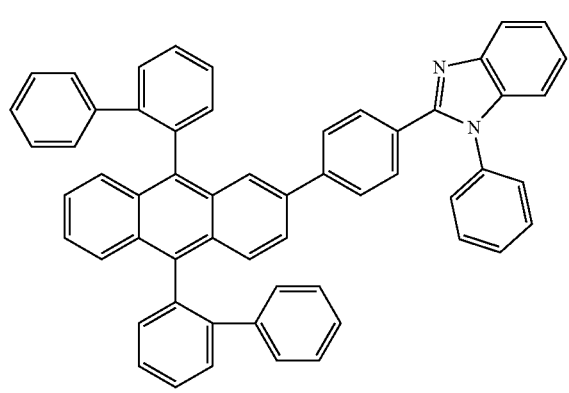
ET8
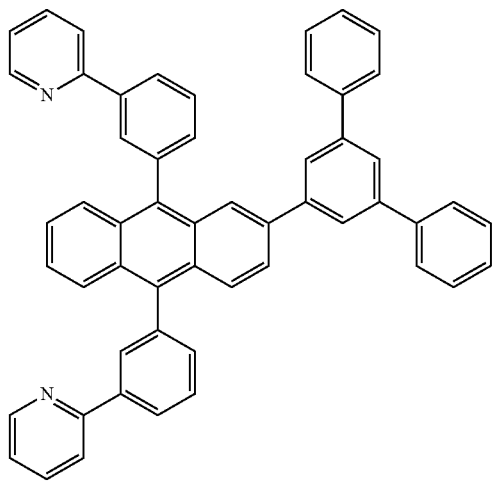
ET6
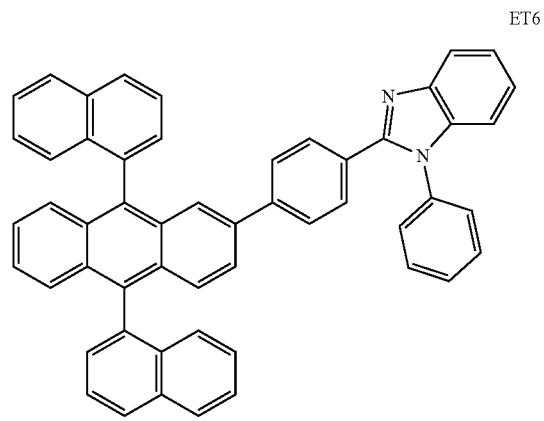
ET7
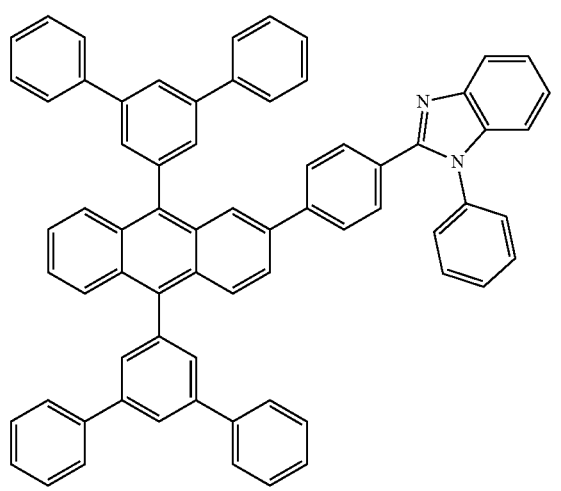
ET9
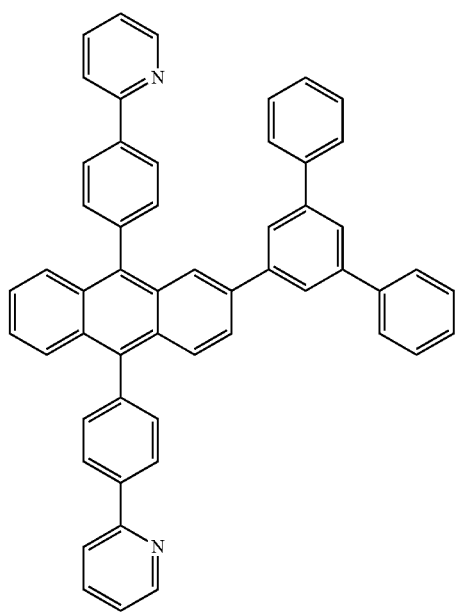

ET10
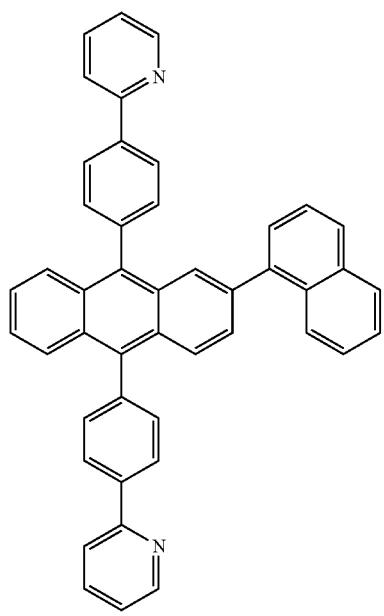
ET11
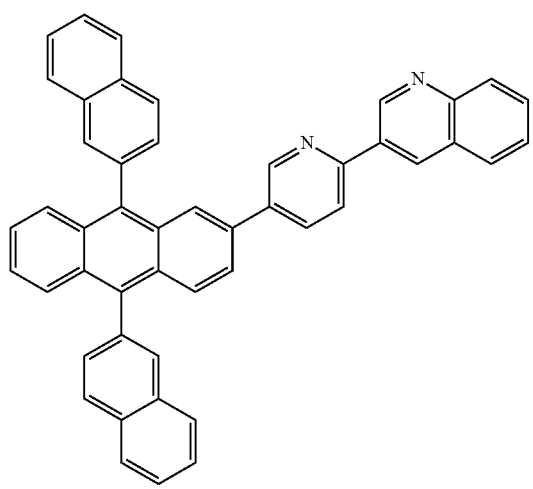
ET12
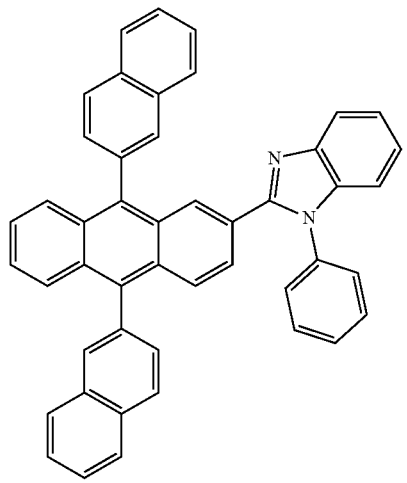
ET13
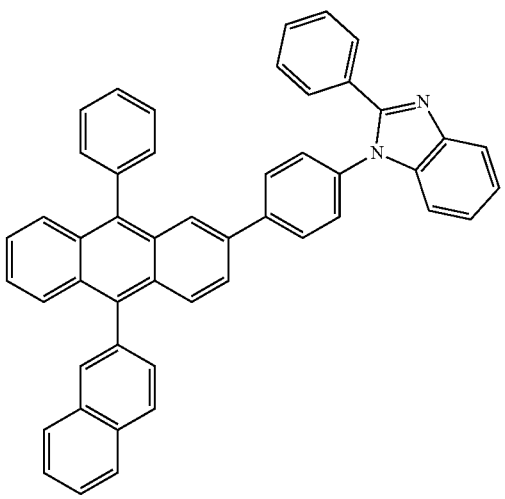
ET14
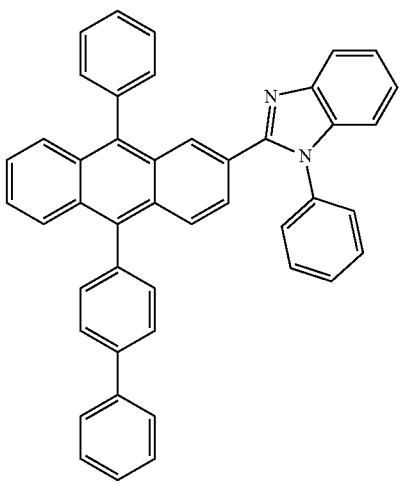
ET15
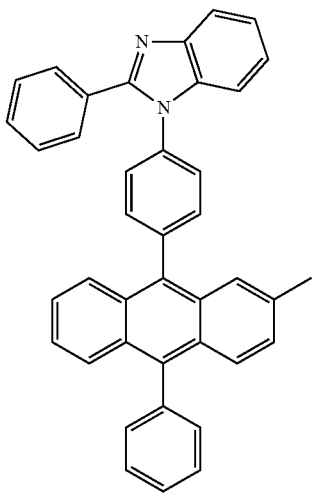

ET16
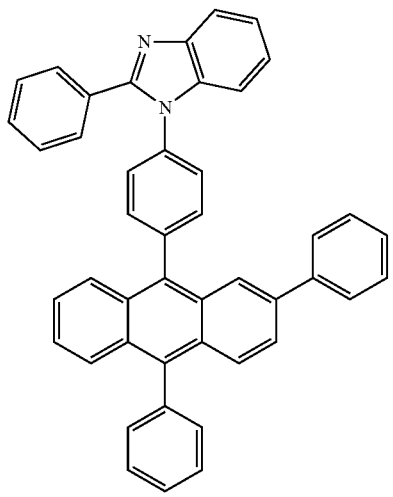
ET17
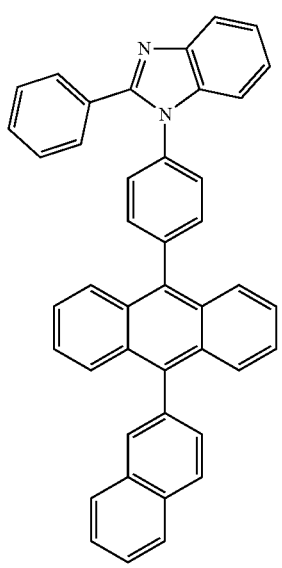
ET18
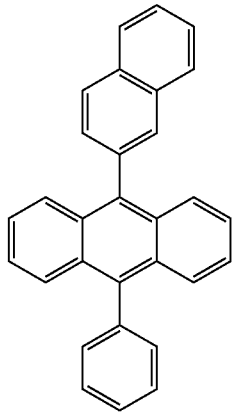
ET19
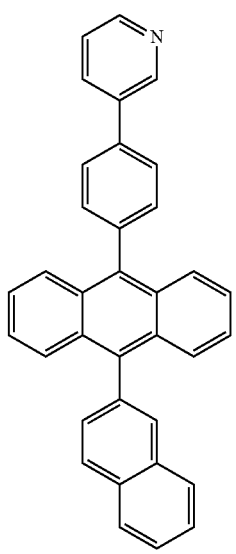
ET20
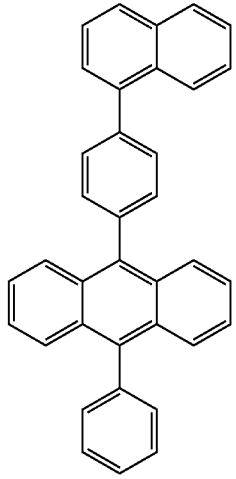
ET21

ET22
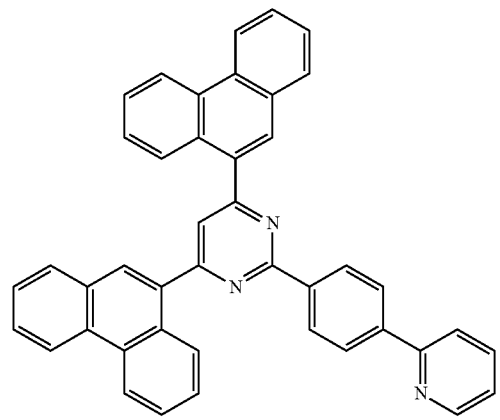
ET23
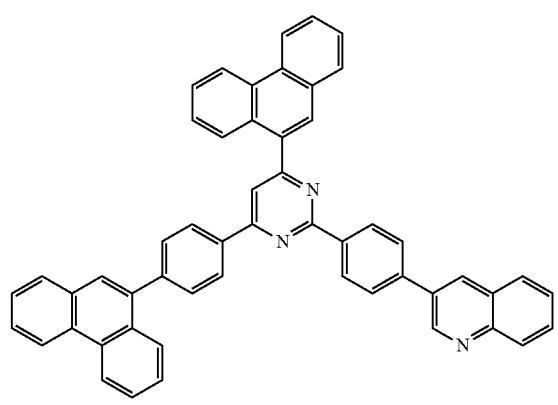
ET24
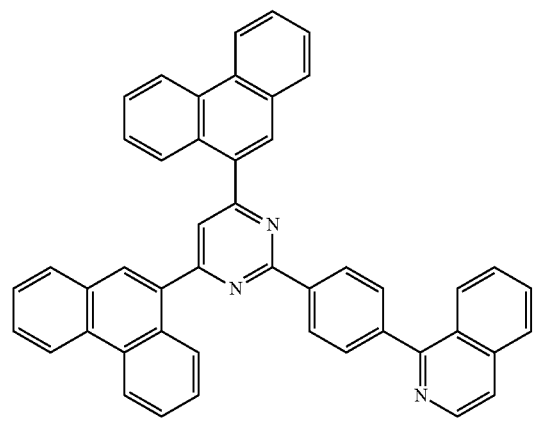
ET25
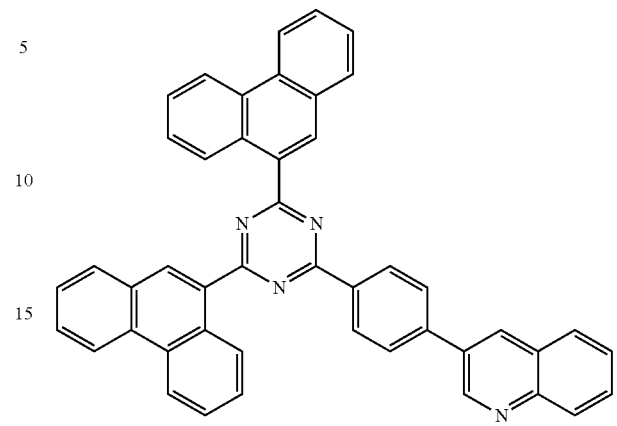
ET26
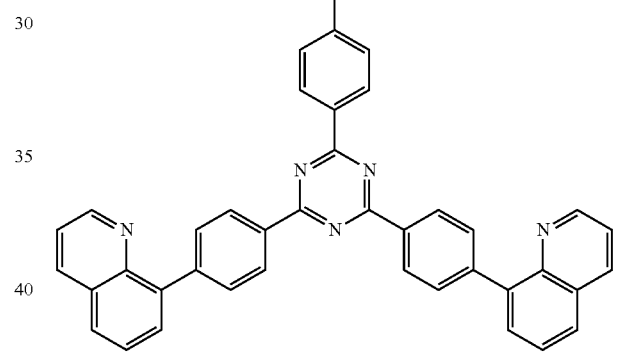
ET27
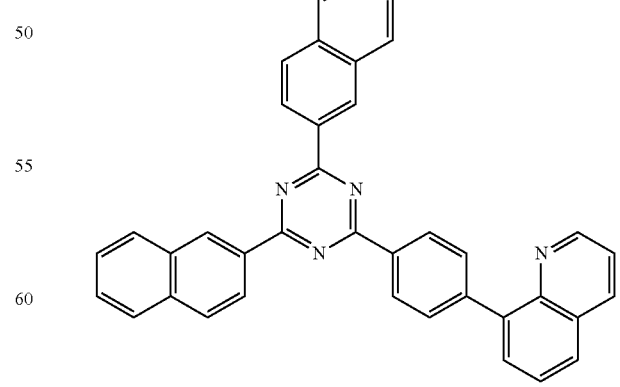

ET28
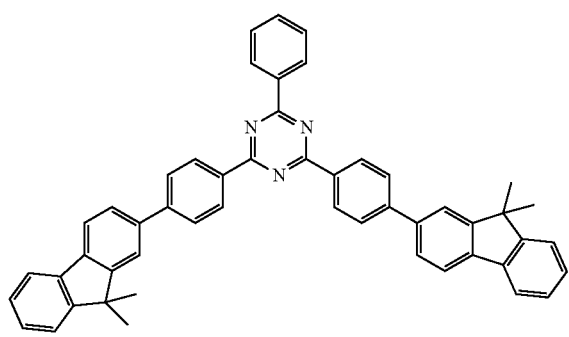
ET29
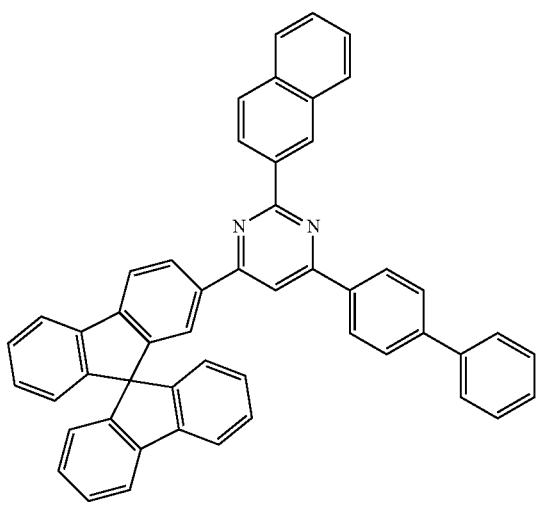
ET30
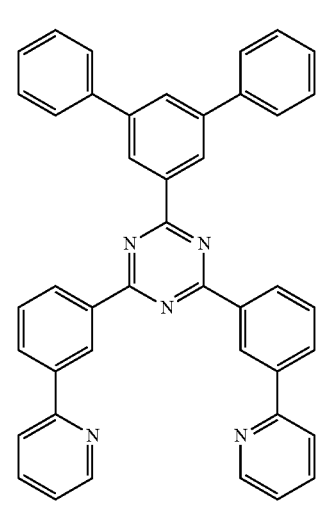
ET31
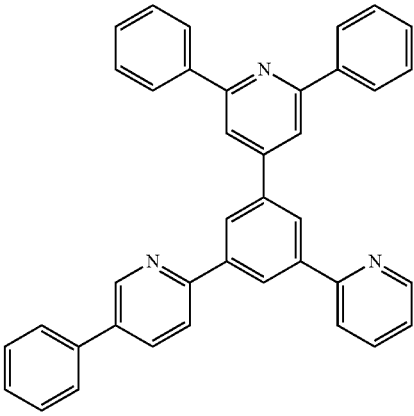
ET32
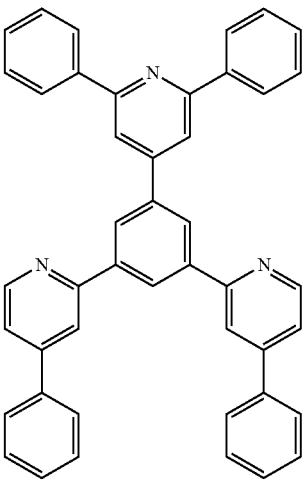
ET33
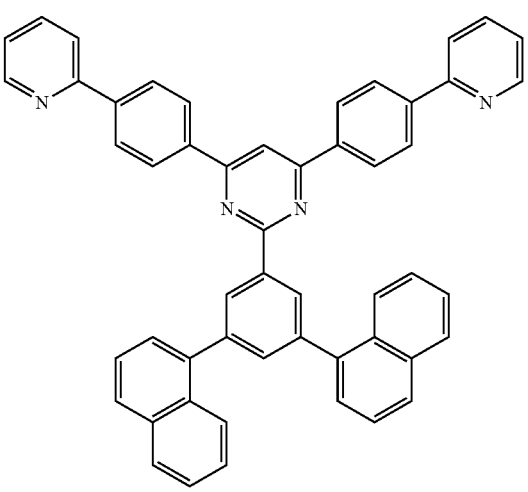

ET34
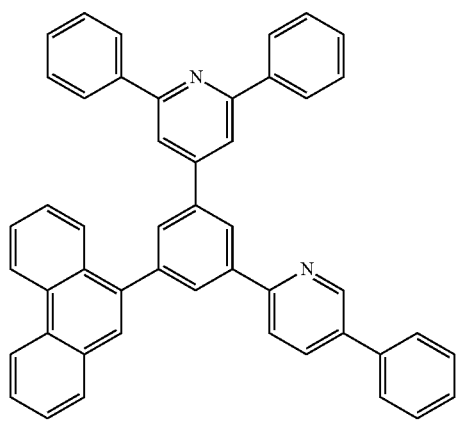
ET35
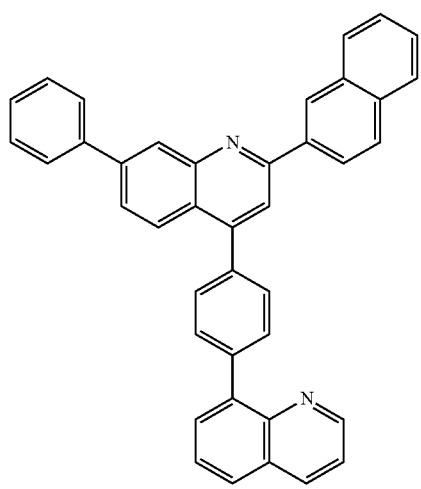
ET36
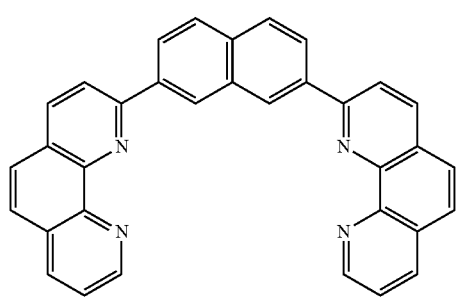
ET37
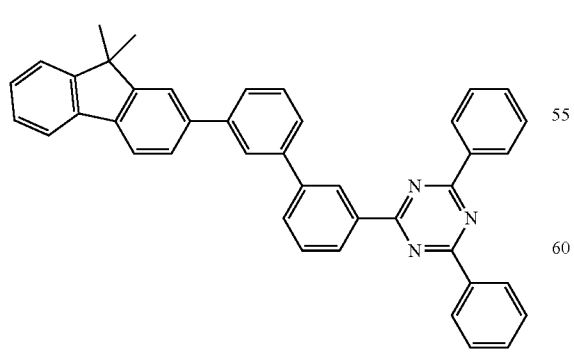
ET38
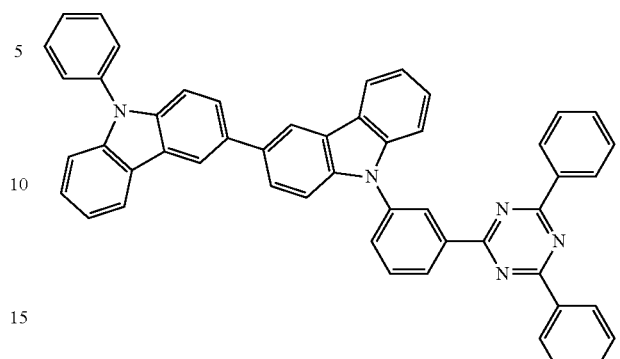
ET39
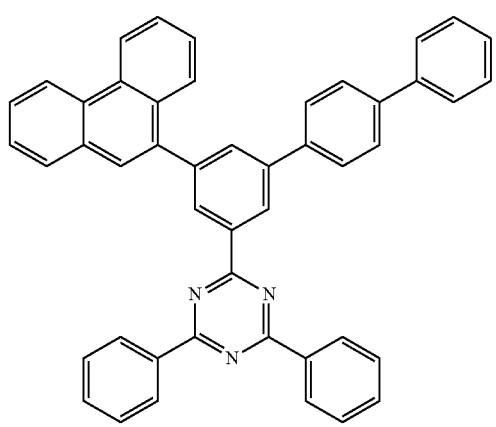
ET40
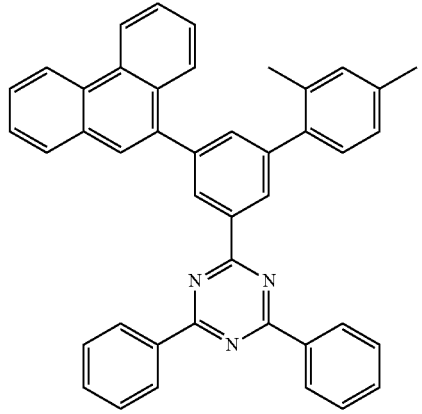

ET41
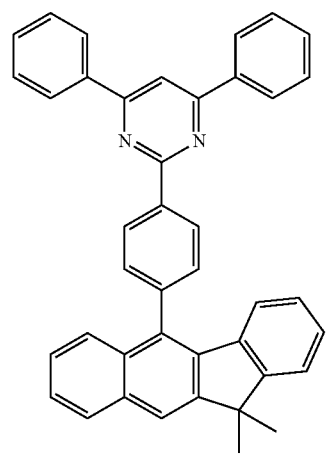
ET44
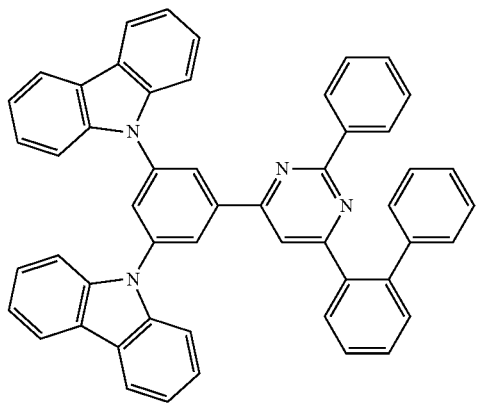
ET42
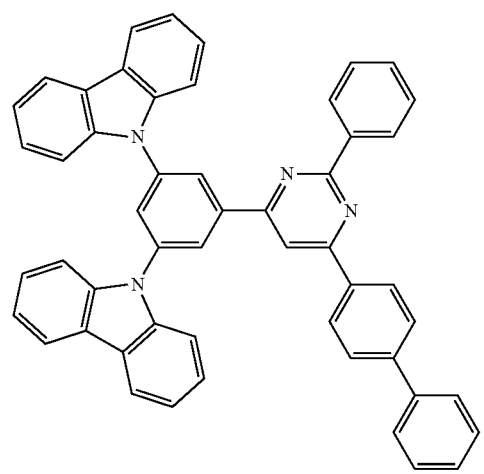
ET45
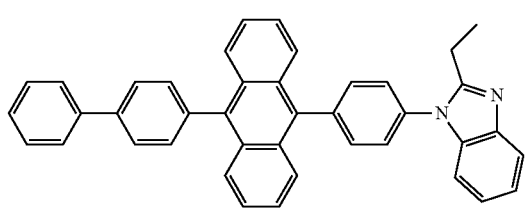
Alq₃
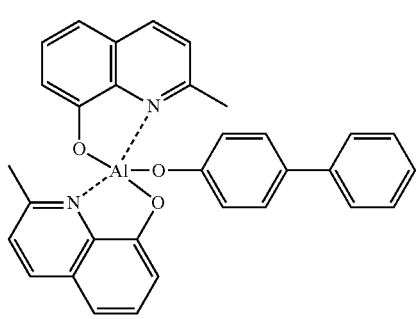
BAlq
ET43
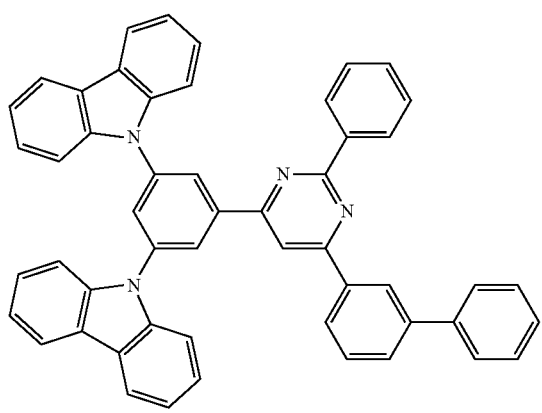
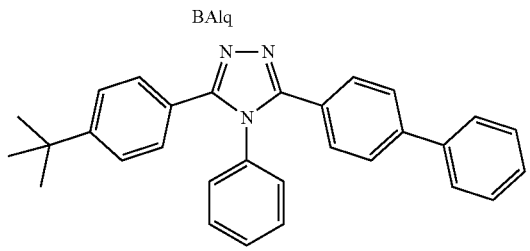
TAZ

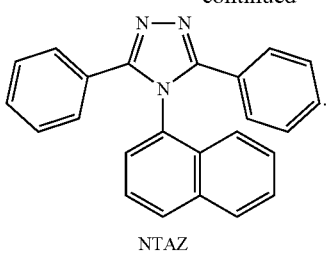

NTAZ

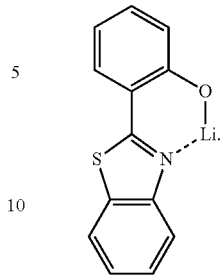

ET-D2

The thickness of the electron-transporting region 135 may be from about 160 Å to about 5,000 Å, for example, about 100 Å to about 4,000 Å. When the electron-transporting region 135 includes a buffer layer, a hole-blocking layer, an electron control layer, an electron-transporting layer, or any combination thereof, the thickness of each of the buffer layer, the hole blocking layer, and the electron control layer may independently be from about 20 Å to about 1000 Å, for example, about 30 Å to about 300 Å, and the thickness of the electron-transporting layer may be from about 100 Å to about 1000 Å, for example, about 150 Å to about 500 Å. When the thicknesses of the buffer layer, hole-blocking layer, electron control layer, and/or electron-transporting layer are within these ranges, satisfactory electron transporting characteristics may be obtained without a substantial increase in driving voltage.

The electron-transporting region 135 (for example, the electron-transporting layer in the electron-transporting region 135) may further include, in addition to the materials described above, a metal-containing material.

The metal-containing material may include an alkali metal complex, alkaline earth metal complex, or any combination thereof. The metal ion of the alkali metal complex may be a Li ion, a Na ion, a K ion, a Rb ion, or a Cs ion, and a metal ion of the alkaline earth metal complex may be a Be ion, a Mg ion, a Ca ion, a Sr ion, or a Ba ion.

A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

In one or more embodiments, the metal-containing material may include a Li complex. The Li complex may include, for example, Compound ET-D1 (LiQ) or ET-D2:

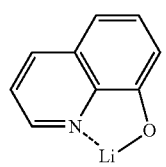

ET-D1

The electron-transporting region 135 may include an electron injection layer that facilitates the injection of electrons from the second electrode 150. The electron injection layer may directly contact the second electrode 150.

The electron injection layer may have: i) a single-layered structure consisting of a single layer consisting of a single material, ii) a single-layered structure including (e.g., consisting of) a single layer including (e.g., consisting of) a plurality of different materials, or iii) a multi-layered structure including a plurality of layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof.

The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may be one or more oxides, halides (for example, fluorides, chlorides, bromides, or iodides), and/or tellurides of the alkali metal, the alkaline earth metal, and the rare earth metal.

The alkali metal-containing compound may include one or more alkali metal oxides, such as $Li_2O$, $Cs_2O$, and/or $K_2O$, alkali metal halides, such as LiF, NaF, CsF, KF, LiI, NaI, CsI, and/or KI, or any combination thereof. The alkaline earth metal-containing compound may include an alkaline earth metal compound (e.g., oxide), such as BaO, SrO, CaO, $Ba_xSr_{1-x}O$ (x is a real number satisfying the condition of 0<x<1), $Ba_xCa_{1-x}O$ (x is a real number satisfying the condition of 0<x<1), and/or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In one or more embodiments, the rare earth metal-containing compound may include lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of ions of the alkali metal, the alkaline earth metal, and the rare earth metal and ii), as a ligand bonded to the metal ion, for example, a hydroxyquinoline, a hydroxyisoquinoline, a hydroxybenzoquinoline, hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenyl benzimidazole, a hydroxyphenylbenzothiazole, a bipyridine, a phenanthroline, a cyclopentadiene, or any combination thereof.

The electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In one or more embodiments, the electron injection layer may further include an organic material (for example, a compound represented by Formula 601).

In one or more embodiments, the electron injection layer may include (e.g., consist of) i) an alkali metal-containing compound (for example, an alkali metal halide), or ii) a) an alkali metal-containing compound (for example, an alkali metal halide); and b) an alkali metal, an alkaline earth metal, a rare earth metal, or any combination thereof. In one or more embodiments, the electron injection layer may be a KI:Yb co-deposited layer, an RbI:Yb co-deposited layer, and/or the like.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth-metal complex, the rare earth metal complex, or any combination thereof may be homogeneously or non-homogeneously dispersed in a matrix including the organic material.

A thickness of the electron injection layer may be in a range of about 1 Å to about 100 Å, and, for example, about 3 Å to about 90 Å. When the thickness of the electron injection layer is within the ranges described above, the electron injection layer may have satisfactory electron injection characteristics without a substantial increase in driving voltage.

Second Electrode 150

The second electrode 150 may be located on the interlayer 130 having the structure according to embodiments of the present disclosure. The second electrode 150 may be a cathode, which is an electron injection electrode, and as the material for the second electrode 150, a metal, an alloy, an electrically conductive compound, or any combination thereof, each having a low work function, may be utilized.

In one or more embodiments, the second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or a combination thereof. The second electrode 150 may be a transmissive electrode, a semi-transmissive electrode, or a reflective electrode.

The second electrode 150 may have a single-layered structure or a multi-layered structure including two or more layers.

Capping Layer

A first capping layer may be located outside the first electrode 110, and/or a second capping layer may be located outside the second electrode 150. In one or more embodiments, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

Light generated in the emission layer 133 of the interlayer 130 of the light-emitting device 10 may be extracted (e.g., emitted) toward the outside through the first electrode 110, which is a semi-transmissive electrode or a transmissive electrode, and the first capping layer, and/or light generated in the emission layer 133 of the interlayer 130 of the light-emitting device 10 may be extracted (e.g., emitted) toward the outside through the second electrode 150, which is a semi-transmissive electrode or a transmissive electrode, and the second capping layer.

The first capping layer and the second capping layer may increase external emission efficiency according to the principle of constructive interference. Accordingly, the light extraction efficiency of the light-emitting device 10 is increased, so that the emission efficiency of the light-emitting device 10 may be improved.

Each of the first capping layer and second capping layer may include a material having a refractive index (at 589 nm) of 1.6 or more.

The first capping layer and the second capping layer may each independently be an organic capping layer including an organic material, an inorganic capping layer including an inorganic material, or a composite capping layer including an organic material and an inorganic material.

At least one selected from the first capping layer and the second capping layer may each independently include carbocyclic compounds, heterocyclic compounds, amine group-containing compounds, porphyrin derivatives, phthalocyanine derivatives, naphthalocyanine derivatives, alkali metal complexes, alkaline earth metal complexes, or any combination thereof. The carbocyclic compound, the heterocyclic compound, and/or the amine group-containing compound may be optionally substituted with a substituent containing O, N, S, Se, Si, F, Cl, Br, I, or any combination thereof. In one or more embodiments, at least one of the first capping layer or the second capping layer may each independently include an amine group-containing compound.

In one or more embodiments, at least one of the first capping layer or the second capping layer may each independently include a compound represented by Formula 201, a compound represented by Formula 202, or any combination thereof.

In one or more embodiments, at least one of the first capping layer or the second capping layer may each independently include one of Compounds HT28 to HT33, one of Compounds CP1 to CP6, p-NPB, or any combination thereof:

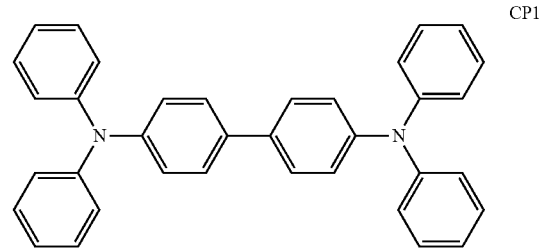

CP1

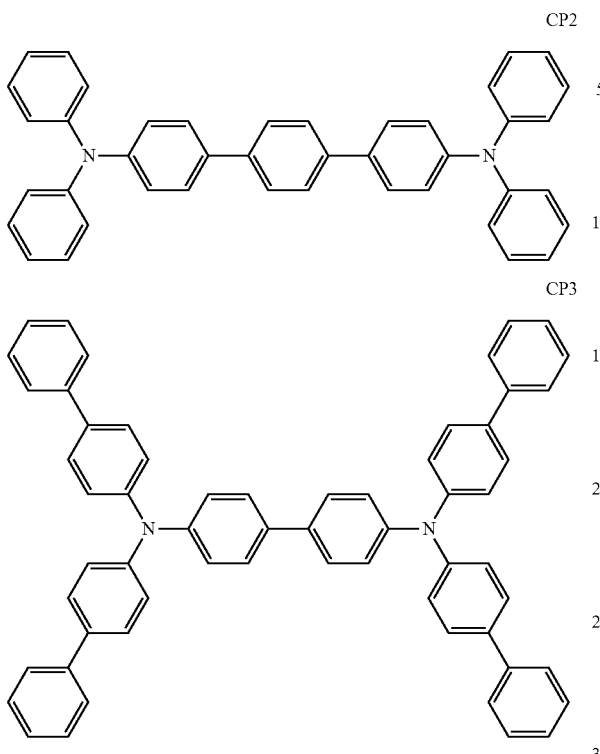

CP2

CP3

CP4

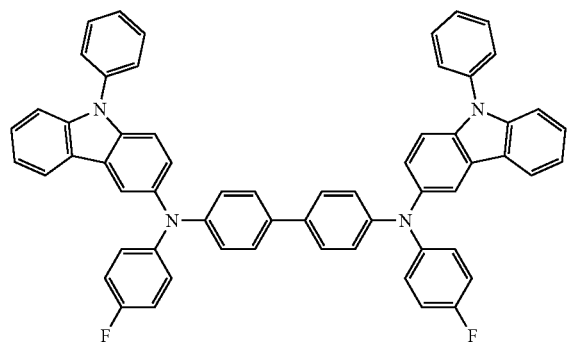

CP5

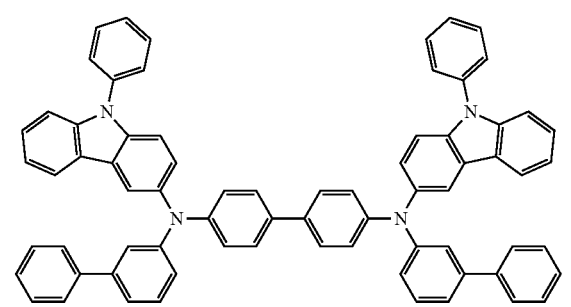

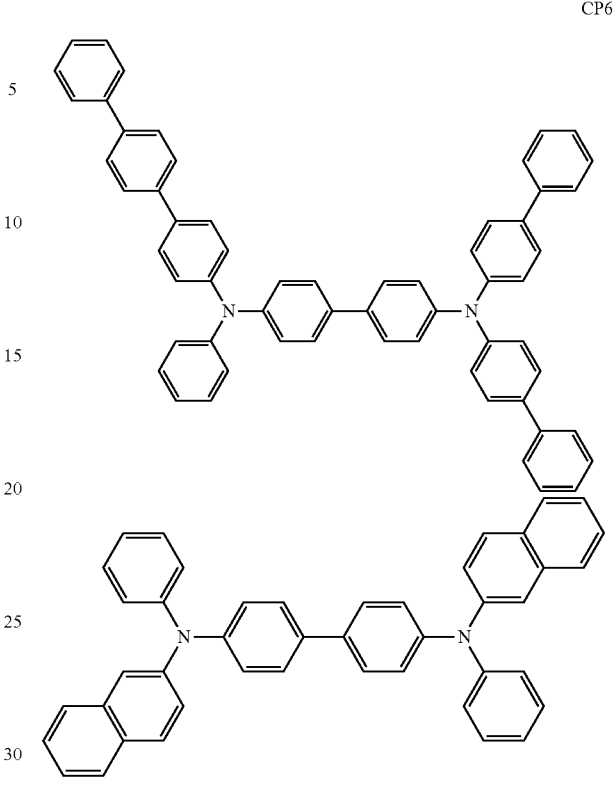

CP6

β-NPB

Electronic Apparatus

The light-emitting device may be included in various suitable electronic apparatuses. In one or more embodiments, the electronic apparatus including the light-emitting device may be a light-emitting apparatus, an authentication apparatus, and/or the like.

The electronic apparatus (for example, light-emitting apparatus) may further include, in addition to the light-emitting device, i) a color filter, ii) a color conversion layer, or iii) a color filter and a color conversion layer. The color filter and/or the color conversion layer may be located in at least one traveling direction of light emitted from the light-emitting device. In one or more embodiments, the light emitted from the light-emitting device may be blue light or white light. The light-emitting device may be the same as described above. In one or more embodiments, the color conversion layer may include quantum dots. The quantum dot may be, for example, a quantum dot-containing material as described herein.

The electronic apparatus may include a first substrate. The first substrate may include a plurality of subpixel areas, the color filter may include a plurality of color filter areas respectively corresponding to the subpixel areas, and the color conversion layer may include a plurality of color conversion areas respectively corresponding to the subpixel areas.

A pixel-defining film may be located among (e.g., between) the subpixel areas to define each of the subpixel areas.

The color filter may further include a plurality of color filter areas and light-shielding patterns located among (e.g., between) the color filter areas, and the color conversion layer may include a plurality of color conversion areas and light-shielding patterns located among (e.g., between) the color conversion areas.

The color filter areas (or the color conversion areas) may include a first area emitting a first color light, a second area emitting a second color light, and/or a third area emitting a third color light, and the first color light, the second color light, and/or the third color light may have different maximum emission wavelengths from one another. In one or more embodiments, the first color light may be red light, the second color light may be green light, and the third color light may be blue light. In one or more embodiments, the color filter areas (or the color conversion areas) may include quantum dots. For example, the first area may include a red quantum dot, the second area may include a green quantum dot, and the third area may not include a quantum dot. The quantum dot is the same as described in the present specification. The first area, the second area, and/or the third area may each further include a scatter (e.g., a scatterer).

In one or more embodiments, the light-emitting device may emit first light, the first area may absorb the first light to emit first first-color light, the second area may absorb the first light to emit second first-color light, and the third area may absorb the first light to emit third first-color light. In this regard, the first first-color light, the second first-color light, and the third first-color light may have different maximum emission wavelengths. For example, the first light may be blue light, the first first-color light may be red light, the second first-color light may be green light, and the third first-color light may be blue light.

The electronic apparatus may further include a thin-film transistor in addition to the light-emitting device as described above. The thin-film transistor may include a source electrode, a drain electrode, and an activation layer, wherein one of the source electrode or the drain electrode may be electrically connected to a corresponding one of the first electrode or the second electrode of the light-emitting device.

The thin-film transistor may further include a gate electrode, a gate insulating film, etc.

The activation layer may include crystalline silicon, amorphous silicon, organic semiconductor, oxide semiconductor, and/or the like.

The electronic apparatus may further include a sealing portion for sealing the light-emitting device. The sealing portion and/or the color conversion layer may be placed between the color filter and the light-emitting device. The sealing portion allows light from the light-emitting device to be extracted to the outside, while simultaneously (or concurrently) preventing or reducing the penetration of ambient air and moisture into the light-emitting device. The sealing portion may be a sealing substrate including a transparent glass substrate and/or a plastic substrate. The sealing portion may be a thin-film encapsulation layer including at least one layer of an organic layer and/or an inorganic layer. When the sealing portion is a thin film encapsulation layer, the electronic apparatus may be flexible.

Various suitable functional layers may be additionally located on the sealing portion, in addition to the color filter and/or the color conversion layer, according to the use of the electronic apparatus. The functional layers may include a touch screen layer, a polarizing layer, and/or the like. The touch screen layer may be a pressure-sensitive touch screen layer, a capacitive touch screen layer, and/or an infrared touch screen layer. The authentication apparatus may be, for example, a biometric authentication apparatus that authenticates an individual by utilizing biometric information of a living body (for example, fingertips, pupils, etc.).

The authentication apparatus may further include, in addition to the light-emitting device, a biometric information collector.

The electronic apparatus may be applied to various suitable displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, and/or endoscope displays), fish finders, various suitable measuring instruments, meters (for example, meters for a vehicle, an aircraft, and/or a vessel), projectors, and the like.

Figure 3:
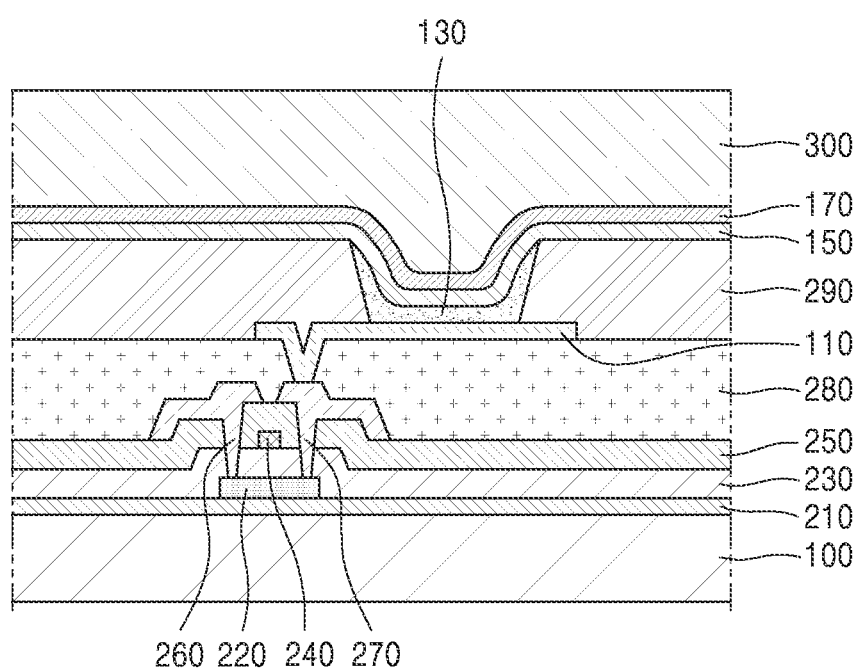
FIG. 3 is a schematic cross-sectional view of a light-emitting apparatus according to an embodiment of the present disclosure.
Figure 4:
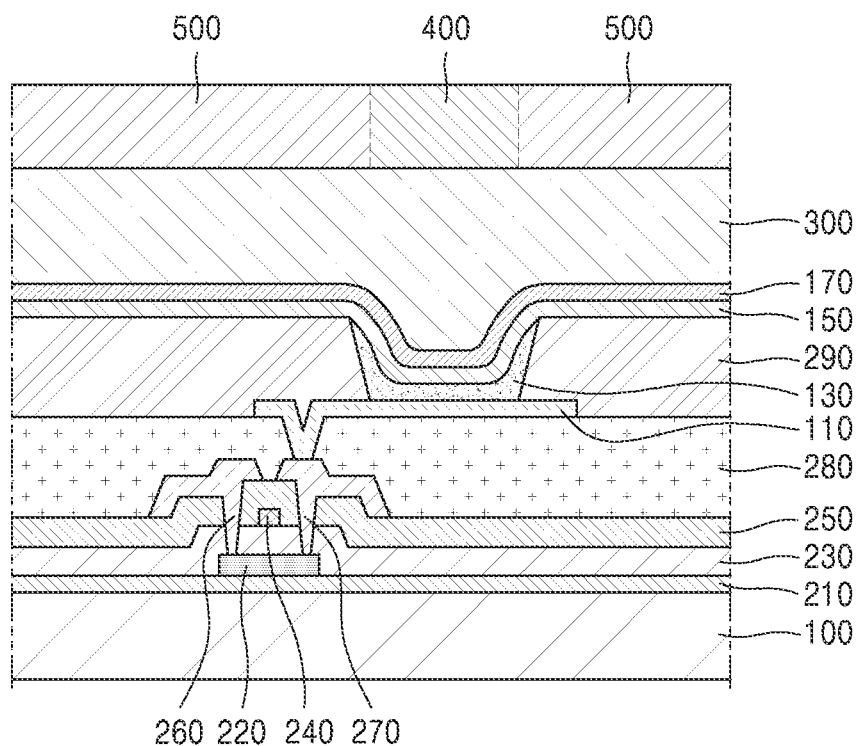
FIG. 4 is a schematic cross-sectional view of a light-emitting apparatus according to an embodiment of the present disclosure.

Description of FIGS. 3 and 4

FIG. 3 is a cross-sectional view showing a light-emitting apparatus according to an embodiment.

The light-emitting apparatus of FIG. 3 includes a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be formed on the substrate 100. The buffer layer 210 may prevent or reduce penetration of impurities through the substrate 100 and may provide a flat surface on the substrate 100.

A TFT may be located on the buffer layer 210. The TFT may include an activation layer 220, a gate electrode 240, a source electrode 260, and a drain electrode 270.

The activation layer 220 may include an inorganic semiconductor such as silicon and/or polysilicon, an organic semiconductor, and/or an oxide semiconductor, and may include a source region, a drain region and a channel region.

A gate insulating film 230 for insulating the activation layer 220 from the gate electrode 240 may be located on the activation layer 220, and the gate electrode 240 may be located on the gate insulating film 230.

An interlayer insulating film 250 is located on the gate electrode 240. The interlayer insulating film 250 may be placed between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the interlayer insulating film 250. The interlayer insulating film 250 and the gate insulating film 230 may be formed to expose the source region and the drain region of the activation layer 220, and the source electrode 260 and the drain electrode 270 may be in contact with the exposed portions of the source region and the drain region of the activation layer 220.

The TFT is electrically connected to a light-emitting device to drive the light-emitting device, and is covered by a passivation layer 280. The passivation layer 280 may include an inorganic insulating film, an organic insulating film, or a combination thereof. A light-emitting device is provided on the passivation layer 280. The light-emitting device may include a first electrode 110, an interlayer 130, and a second electrode 150.

The first electrode 110 may be formed on the passivation layer 280. The passivation layer 280 does not completely cover the drain electrode 270 and exposes a portion of the drain electrode 270, and the first electrode 110 is connected to the exposed portion of the drain electrode 270.

A pixel defining layer 290 containing an insulating material may be located on the first electrode 110. The pixel defining layer 290 exposes a region of the first electrode 110, and an interlayer 130 may be formed in the exposed region of the first electrode 110. The pixel defining layer 290 may be a polyimide and/or polyacrylic organic film. In one or more embodiments, at least some layers of the interlayer 130 may extend beyond the upper portion of the pixel defining layer 290 and may thus be located in the form of a common layer.

The second electrode 150 may be located on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on a light-emitting device to protect the light-emitting device from moisture and/or oxygen. The encapsulation portion 300 may include: an inorganic film including silicon nitride (SiNx), silicon oxide (SiOx), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, and/or the like), an epoxy-based resin (for example, aliphatic glycidyl ether (AGE), and/or the like), or a combination thereof; or a combination of the inorganic film and the organic film.

FIG. 4 is a cross-sectional view showing a light-emitting apparatus according to an embodiment of the present disclosure.

The light-emitting apparatus of FIG. 4 is the same as the light-emitting apparatus of FIG. 3, except that a light-shielding pattern 500 and a functional region 400 are additionally located on the encapsulation portion 300. The functional region 400 may be i) a color filter area, ii) a color conversion area, or iii) a combination of the color filter area and the color conversion area. In one or more embodiments, the light-emitting device included in the light-emitting apparatus of FIG. 4 may be a tandem light-emitting device.

Respective layers included in the hole-transporting region, the emission layer, and the electron-transporting region may be formed in a certain region by utilizing one or more suitable methods selected from vacuum deposition, spin coating, casting, Langmuir-Blodgett (LB) deposition, ink-jet printing, laser-printing, and laser-induced thermal imaging (LITI).

When layers constituting the hole-transporting region 131, the emission layer 133, and layers constituting the electron-transporting region 135 are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

Definition of Terms

The term "$C_3$-$C_{60}$ carbocyclic group" as used herein refers to a cyclic group consisting of carbon atoms only as ring-forming atoms and having three to sixty carbon atoms, and the term "$C_1$-$C_{60}$ heterocyclic group" as used herein refers to a cyclic group that has one to sixty carbon atoms and further has, in addition to carbon, at least one heteroatom as a ring-forming atom. The $C_3$-$C_{60}$ carbocyclic group and the $C_1$-$C_{60}$ heterocyclic group may each independently be a monocyclic group including (e.g., consisting of) one ring or a polycyclic group in which two or more rings are condensed with each other. For example, the number of ring-forming atoms of the $C_1$-$C_{60}$ heterocyclic group may be from 3 to 61.

The "cyclic group" as used herein may include the $C_3$-$C_{60}$ carbocyclic group, and the $C_1$-$C_{60}$ heterocyclic group.

The term "π electron-rich $C_3$-$C_{60}$ cyclic group" as used herein refers to a cyclic group that has three to sixty carbon atoms and does not include *—N=*' as a ring-forming moiety, and the term "π electron-deficient nitrogen-containing $C_1$-$C_{60}$ cyclic group" as used herein refers to a heterocyclic group that has one to sixty carbon atoms and includes *—N=*' as a ring-forming moiety.

For example, the $C_3$-$C_{60}$ carbocyclic group may be i) group T1 or ii) a condensed cyclic group in which two or more groups T1 are condensed with each other (for example, the $C_3$-$C_{60}$ carbocyclic group may be a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, and/or an indenoanthracene group), the $C_1$-$C_{60}$ heterocyclic group may be i) group T2, ii) a condensed cyclic group in which two or more groups T2 are condensed with each other, or iii) a condensed cyclic group in which at least one group T2 and at least one group T1 are condensed with each other (for example, the $C_1$-$C_{60}$ heterocyclic group may be a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be i) group T1, ii) a condensed cyclic group in which two or more groups T1 are condensed with each other, iii) group T3, iv) a condensed cyclic group in which two or more groups T3 are condensed with each other, or v) a condensed cyclic group in which at least one group T3 and at least one group T1 are condensed with each other (for example, π electron-rich $C_3$-$C_{60}$ cyclic group may be the $C_3$-$C_{60}$ carbocyclic group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the π electron-deficient nitrogen-containing $C_1$-$C_{60}$ cyclic group may be i) group T4, ii) a condensed cyclic group in which two or more group T4 are condensed with each other, iii) a condensed cyclic group in which at least one group T4 and at least one group T1 are condensed with each other, iv) a condensed cyclic group in which at least one group T4 and at least one group T3 are condensed with each other, or v) a condensed cyclic group in which at least one group T4, at least one group T1, and at least one group T3 are condensed with one another (for example, the π electron-deficient nitrogen-containing $C_1$-$C_{60}$ cyclic group may be a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group, group T3 may be a furan group, a thiophene group, a 1H-pyrrole group, a silole group, or a borole group, and group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms the "cyclic group", the "$C_3$-$C_{60}$ carbocyclic group", the "$C_1$-$C_{60}$ heterocyclic group", the "π electron-rich $C_3$-$C_{60}$ cyclic group", and/or the "π electron-deficient nitrogen-containing $C_1$-$C_{60}$ cyclic group" as used herein may refer to a group condensed to any suitable cyclic group or a polyvalent group (for example, a divalent group, a trivalent group, a tetravalent group, etc.), depending on the structure of a formula in connection with which the terms are used. In one or more embodiments, "a benzene group" may be a benzo group, a phenyl group, a phenylene group, and/or the like, which may be easily understood by one of ordinary skill in the art according to the structure of a formula including the "benzene group."

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and examples of the divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a divalent non-aromatic condensed heteropolycyclic group.

The term "$C_1$-$C_{60}$ alkyl group" as used herein refers to a linear or branched aliphatic hydrocarbon monovalent group that has one to sixty carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a monovalent hydrocarbon group having at least one carbon-carbon double bond in the middle and/or at the terminus of the $C_2$-$C_{60}$ alkyl group, and examples thereof may include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle and/or at the terminus of the $C_2$-$C_{60}$ alkyl group, and examples thereof may include an ethynyl group and a propynyl group. The term "$C_2$-$C_6$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof may include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and examples thereof may include a cyclopropyl group, a cyclobutyl group, a cyclopentyl group, a cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group that further includes, in addition to carbon atom(s), at least one heteroatom as a ring-forming atom and has 1 to 10 carbon atoms, and examples thereof may include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent cyclic group that has three to ten carbon atoms and at least one carbon-carbon double bond in the ring thereof and no aromaticity, and examples thereof may include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group that has, in addition to a carbon atom, at least one heteroatom as a ring-forming atom, 1 to 10 carbon atoms, and at least one double bond (e.g., carbon-carbon double bond) in the cyclic structure thereof. Examples of the $C_1$-$C_{10}$ heterocycloalkenyl group may include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having six to sixty carbon atoms, and the term "$C_6$-$C_{60}$ arylene group" as used herein refers to a divalent group having a carbocyclic aromatic system having six to sixty carbon atoms. Examples of the $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each independently include two or more rings, the rings may be condensed with each other.

The term "$C_1$-$C_{60}$ heteroaryl group" as used herein refers to a monovalent group having a heterocyclic aromatic system that has, in addition to carbon atom(s), at least one heteroatom as a ring-forming atom, and 1 to 60 carbon atoms. The term "$C_1$-$C_{60}$ heteroarylene group" as used herein refers to a divalent group having a heterocyclic aromatic system that has, in addition to carbon atom(s), at least one heteroatom as a ring-forming atom, and 1 to 60 carbon atoms. Examples of the $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each independently include two or more rings, the rings may be condensed with each other.

The term "monovalent non-aromatic condensed polycyclic group" as used herein refers to a monovalent group having two or more rings condensed to each other, only carbon atoms (for example, having 8 to 60 carbon atoms) as ring-forming atoms, and no aromaticity in its entire molecular structure when considered as a whole. Examples of the monovalent non-aromatic condensed polycyclic group may include an indenyl group, a fluorenyl group, a spiro-bifluorenyl group, a benzofluorenyl group, an indenophenanthrenyl group, and an indeno anthracenyl group. The term "divalent non-aromatic condensed polycyclic group" as used herein refers to a divalent group having the same structure as a monovalent non-aromatic condensed polycyclic group.

The term "monovalent non-aromatic condensed heteropolycyclic group" as used herein refers to a monovalent group having two or more rings condensed to each other, at least one heteroatom other than carbon atoms (for example, having 1 to 60 carbon atoms), as a ring-forming atom, and non-aromaticity in its entire molecular structure when considered as a whole. Examples of the monovalent non-aromatic condensed heteropolycyclic group may include a pyrrolyl group, a thiophenyl group, a furanyl group, an indolyl group, a benzoindolyl group, a naphtho indolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein refers to a divalent group having the same structure as a monovalent non-aromatic condensed heteropolycyclic group.

The term "$C_6$-$C_{60}$ aryloxy group" as used herein refers to a monovalent group represented by —$OA_{102}$ (wherein $A_{102}$ is the $C_6$-$C_{60}$ aryl group), and the term "$C_6$-$C_{60}$ arylthio group" as used herein refers to a monovalent group represented by —$SA_{103}$ (wherein $A_{103}$ is the $C_6$-$C_{60}$ aryl group).

The term "$R_{10a}$" as used herein refers to:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof, a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof, or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

$Q_1$ to $Q_3$, $Q_{11}$ to $Q_{13}$, $Q_{21}$ to $Q_{23}$ and $Q_{31}$ to $Q_{33}$ as used herein may each independently be: hydrogen; deuterium; —F; —Cl; —Br; —I; a hydroxyl group; a cyano group; a nitro group; $C_1$-$C_{60}$ alkyl group; $C_2$-$C_{60}$ alkenyl group; $C_2$-$C_{60}$ alkynyl group; $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "hetero atom" as used herein refers to any atom other than a carbon atom. Examples of the heteroatom may include O, S, N, P, Si, B, Ge, Se, and any combination thereof.

The term "Ph" as used herein refers to a phenyl group, the term "Me" as used herein refers to a methyl group, the term "Et" as used herein refers to an ethyl group, the term "ter-Bu" or "Bu$^t$" as used herein refers to a tert-butyl group, and the term "OMe" as used herein refers to a methoxy group.

The term "biphenyl group" as used herein may refer to "a phenyl group substituted with a phenyl group." In other words, the "biphenyl group" may be a substituted phenyl group having a $C_6$-$C_{60}$ aryl group as a substituent.

The term "terphenyl group" as used herein may refer to "a phenyl group substituted with a biphenyl group". For example, the "terphenyl group" may be a substituted phenyl group having, as a substituent, a $C_6$-$C_{60}$ aryl group substituted with a $C_6$-$C_{60}$ aryl group.

* and *' as used herein, unless defined otherwise, each refer to a binding site to a neighboring atom in a corresponding formula.

Examples

Synthesis Example 1: Synthesis of Ligand 1

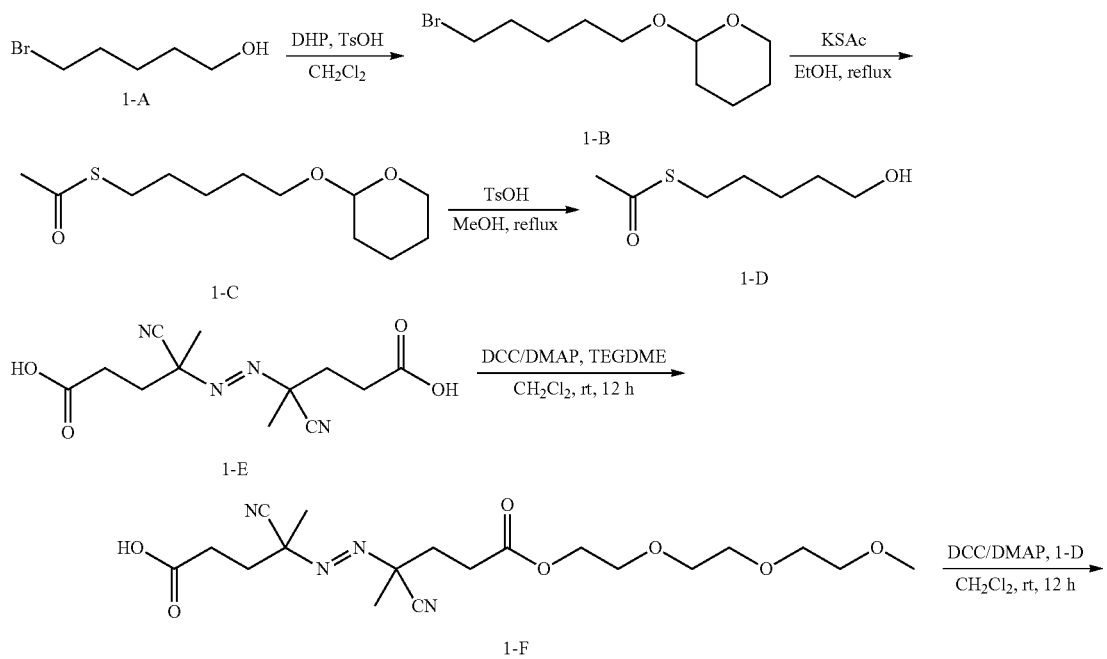

Synthesis Schematic 1

-continued

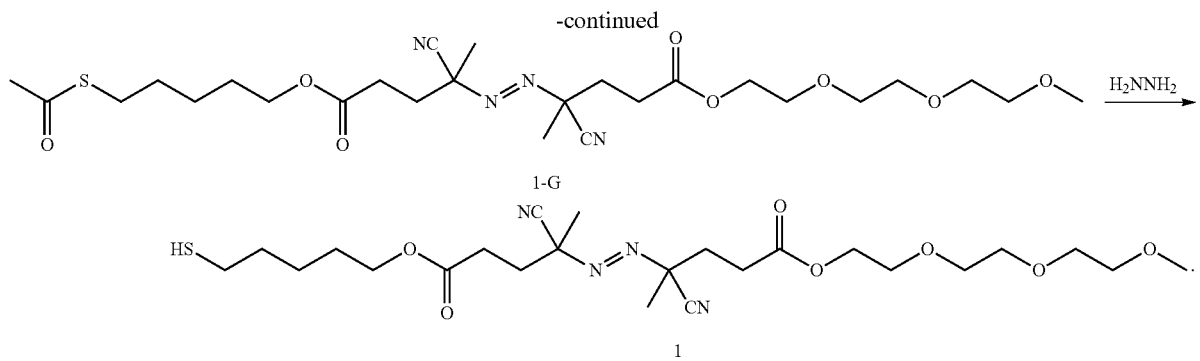

2.90 ml of dihydropyran (DHP), 1.20 ml of p-toluenesulfonic acid (TsOH), and 500 ml of $CH_2Cl_2$ were added to 14.0 g of Intermediate 1-A to obtain 16.5 g of Intermediate 1-B.

14.5 g of potassium thioacetate (KSAc) was added to 16.5 g of the Intermediate 1-B in 500 ml of ethanol (EtOH), and refluxed to obtain 11 g of Intermediate 1-C.

8.00 g of TsOH in 500 ml of methanol (MeOH) was added to 11.0 g of the Intermediate 1-C, and refluxed to obtain 12.5 g of Intermediate 1-D.

11.0 g of dicyclohexycarbodiimide (DCC), 2.70 g of dimethylaminopyridine (DMAP), and 10.0 ml of tetraethylene glycol dimethylether (TEGDME) were added to 14.0 g of Intermediate 1-E, and then, 500 ml of $CH_2Cl_2$ was added thereto, and the resultant mixture was stored for 12 hours at room temperature, thereby obtaining 17.0 g of Intermediate 1-F.

10.0 g of DCC, 4.50 g of DMAP, and 12.5 g of Intermediate 1-D were added to 17.0 g of Intermediate 1-F, ad then, 1000 ml of $CH_2Cl_2$ was added thereto, and the resultant mixture was stored for 12 hours at room temperature to obtain 14 g of Intermediate 1-G.

250 ml of hydrazine was added to 14 g of Intermediate 1-G to obtain 12 g of Ligand 1. NMR of Ligand 1 is as follows:

$^1$H NMR (500 MHz, $CHCl_3$): δ 4.20-4.13 (m, 4H), 3.63-3.40 (m, 15H), 2.53 (d, 2H), 2.35 (t, 4H), 2.13 (m, 2H), 2.0 (t, 4H), 1.79 (s, 6H) 1.60-1.29 (m, 6H)

$^{13}$C NMR (125 MHz, $CHCl_3$): δ173.1, 114.5, 71.6, 70.4, 70.1, 69.3, 66.9, 65.2, 56.5, 33.9, 30.5, 28.2, 25.2, 24.6, 24.4, 23.9.

Synthesis Example 2: Synthesis of Ligand 2

Synthesis Schematic 2

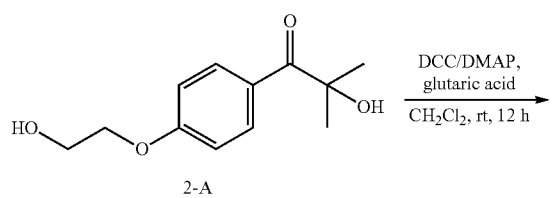

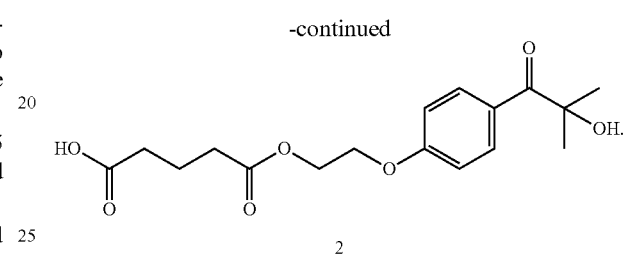

14.6 g of DCC, 6.00 ml of DMAP, and 7.00 ml of glutaric acid were added to 10 g of Intermediate 2-A, and then, 500 ml of $CH_2Cl_2$ was added thereto. The resultant mixture was stored for 12 hours at room temperature to obtain 10 g of Ligand 2. NMR of Ligand 2 is as follows:

$^1$H NMR (500 MHz, DMSO): δ12.01 (s, 1H), 7.94 (d, 4H), 6.99 (d, 4H), 4.42-4.45 (m, 4H) 2.30-2.36 (m, 4H), 2.13 (m, 2H), 1.35 (s, 6H)

$^{13}$C NMR (125 MHz, DMSO): δ198.6, 178.4, 66.8, 129.7, 129.4, 126.7, 81.3, 66.4, 62.3, 33.3, 32.7, 27.9, 19.7.

Synthesis Example 3: Preparation of Quantum Dot-Containing Material 1

0.31 g (0.6 mmol) of Ligand 1 obtained in Synthesis Example 1 was completely dissolved in 5 mL of chloroform, which is a solvent, and 1.5 g of InP ($1^{st}$ exciton peak: 460 nm) was added as a quantum dot thereto, and then reacted for 0.5 hours at room temperature in the nitrogen atmosphere, thereby preparing a quantum dot-containing material 1 in which Ligand 1 was bonded to the surface of the InP quantum dot.

Synthesis Example 4: Preparation of Quantum Dot-Containing Material 2

0.2 g (0.6 mmol) of Ligand 2 obtained in Synthesis Example 2 was dissolved in 5 mL of chloroform, which is a solvent, and 1.5 g of InP ($1^{st}$ exciton peak: 460 nm) was added as a quantum dot thereto, and then reacted for 0.5 hours at a temperature of 60° C. in the nitrogen atmosphere, thereby preparing a quantum dot-containing material 2 in which Ligand 2 was bonded to the surface of the InP quantum dot.

Synthesis Example 5: Preparation of Quantum Dot-Containing Material A

A quantum dot-containing material A was prepared in the same manner as in Synthesis Example 3, except that Ligand A was utilized instead of Ligand 1.

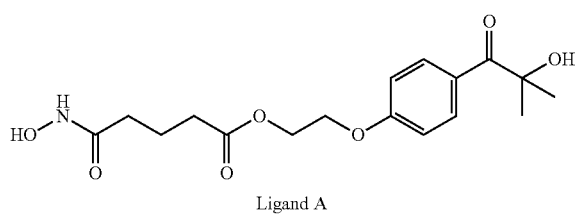 [SMILES: CC(C)(O)C(=O)c1ccc(OCCOC(=O)CCCC(=O)NO)cc1]

Ligand A

Example 1: Preparation of Quantum Dot Dispersed Solution 1.2 g of quantum dot-containing material obtained according to Synthesis Example 3 was dispersed in a mixed solution (a monomer, a dispersant, and a scatterer).

Example 2 and Comparative Example 1

A quantum dot dispersed solution was prepared in the same manner as in Example 1, except that each of the quantum dot-containing materials obtained according to Synthesis Examples 4 and 5 was respectively utilized instead of the quantum dot-containing material obtained in Synthesis Example 3.

Evaluation Example 1: Quantum Efficiency Evaluation

Quantum efficiency (PCE) of each of the solution samples containing the respective quantum dot-containing material of Examples 1 and 2, and Comparative Example 1 was evaluated by utilizing the QE-2100 equipment, and results thereof are shown in FIGS. 5A to 5B and 6A to 6B. (PCE=photoconversion efficiency).

Figure 5A:
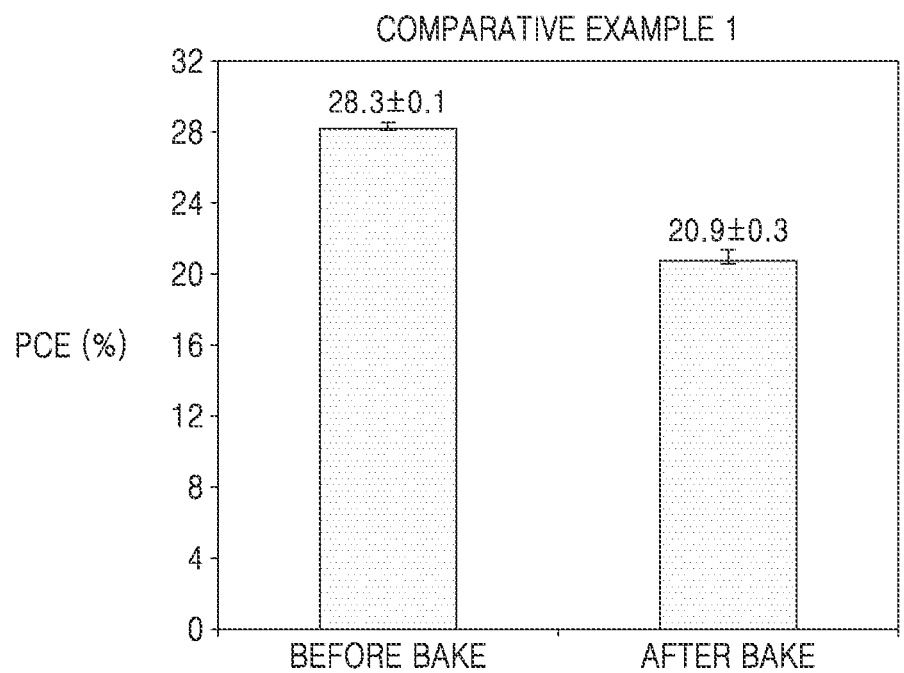
FIG. 5A is a graph showing changes in photoconversion efficiency (PCE) (%) of a thin film formed utilizing quantum dot-containing materials according to Comparative Example 1, before and after baking.
Figure 5B:
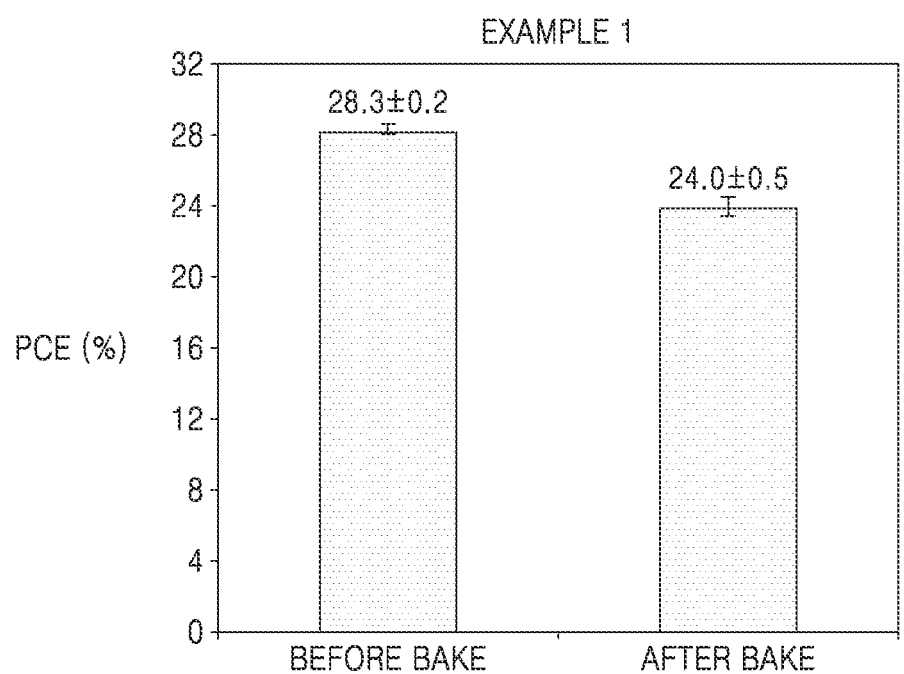
FIG. 5B is a graph showing changes in photoconversion efficiency (PCE) (%) of a thin film formed utilizing quantum dot-containing materials according to Example 1, before and after baking.
Figure 6A:
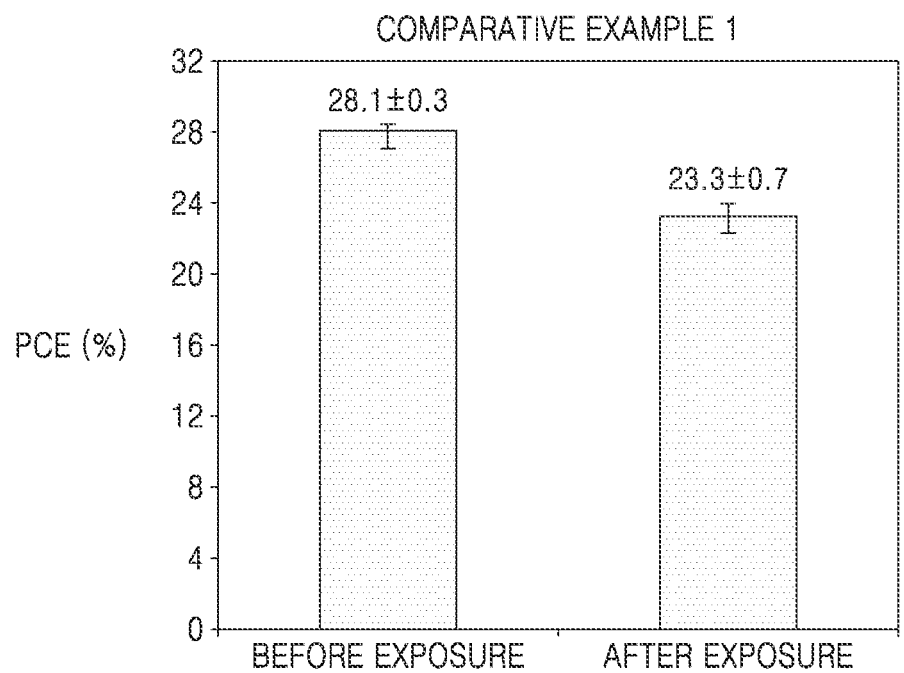
FIG. 6A is a graph showing changes in PCE (%) of a thin film formed utilizing quantum dot-containing materials according to Comparative Example 1, before and after exposure (e.g., exposure to light)
Figure 6B:
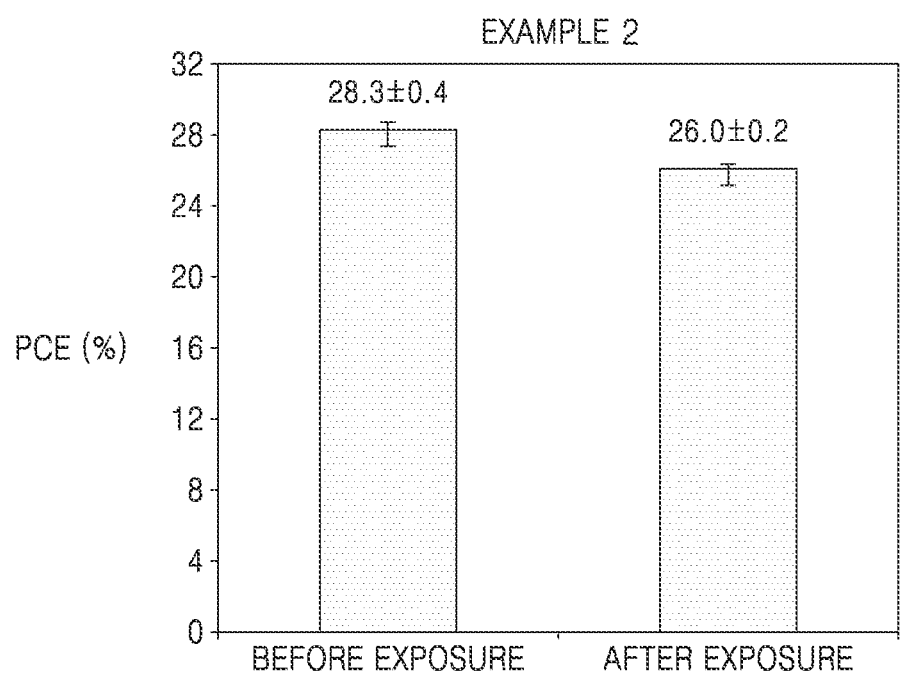
FIG. 6B is a graph showing changes in PCE (%) of a thin film formed utilizing quantum dot-containing materials according to Example 2, before and after exposure (e.g., exposure to light).

FIGS. 5A and 5B are graphs showing changes in PCE (%) of thin films formed utilizing the quantum dot-containing materials according to Comparative Example 1 and Example 1 respectively before and after baking (e.g., heating), and FIGS. 6A and 6B are graphs showing changes in PCE (%) of thin films formed utilizing the quantum dot-containing materials according to Comparative Example 1 and Example 2 respectively before and after exposure (e.g., exposure to light).

Referring to FIGS. 5A and 5B and 6A and 6B, it can be seen that when a thin film is formed, the change in PCE before and after baking and before and after exposure (e.g., exposure to light) was small when Ligand 1 or Ligand 2 is utilized. Therefore, it can be seen that a quantum dot-containing material containing a ligand according to the present disclosure is more resistant to the attack of radicals and thus, the stability thereof is desired (e.g., excellent).

According to the present disclosure, an initiator moiety is introduced to a ligand that is chemically bonded to the surface of a quantum dot, which leads to a simplification in the process, and without any consideration (e.g., without any issues) of miscibility between the initiator and a solvent, the ligand can be bonded to the surface of the quantum dot, thereby inducing the growth of a polymer at the surface of the quantum dot and protecting the quantum dot from the attack by radicals which degrades the efficiency of the quantum dot. Accordingly, the quantum yield of the formed thin film and composition may be increased.

The use of "may" when describing embodiments of the present disclosure refers to "one or more embodiments of the present disclosure".

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various suitable changes in form and details may be made therein without departing from the spirit and scope as defined by the following claims, and equivalents thereof.

What is claimed is:

1. A quantum dot-containing material comprising:
a quantum dot; and
at least one ligand chemically bonded to a surface of the quantum dot and represented by Formula 1:

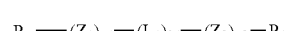

Formula 1

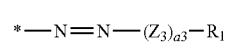

Formula 2-1

Formula 2-2

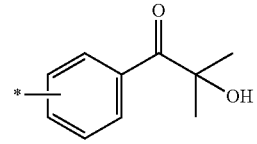

wherein, in Formulae 1, 2-1, and 2-2,
$R_a$ is an anchoring group comprising a moiety represented by —COOH, —PO$_3$H, a dithiolane group, or —SH,
$L_1$ is *—(CH$_2$)$_{n1}$—*' or *—(O—CH$_2$—CH$_2$)$_{n1}$—O—*',
b1 is an integer from 1 to 5,
$P_1$ is a group represented by Formula 2-1 or 2-2, $Z_1$ to $Z_3$ are each independently selected from *—O—*', *—C(=O)—*', *—C(=O)O—*', *—OC(=O)—*', *—O—C(=O)—O—*', *—OCH$_2$—*', *—SCH$_2$—*', *—CH$_2$S—*', *—CF$_2$O—*', *—OCF$_2$—*', *—CF$_2$S—*', *—SCF$_2$—*, *—(CH$_2$)$_{n1}$—*, *—CF$_2$CH$_2$—*', *—CH$_2$CF$_2$—*', *—(CF$_2$)$_{n1}$—*, *—C(CH$_3$)CN—*, *—CH=CH—*', *—CF=CF—*', *—C≡C—*', *—CH=CH—C(=O)O—*', *—OC(=O)—CH=CH—*', *—C(Q$_1$)(Q$_2$)—*', and *—O—(CH$_2$)—O(C=O)—(CH$_2$)$_{n2}$—*', n1 is an integer from 1 to 6, n2 is an integer from 0 to 2, a1 to a3 are each independently an integer from 0 to 6, $R_1$ is *—(CH$_2$)$_{n3}$—CH$_3$, or *—(O—CH$_2$—CH$_2$)$_{n1}$—OH, and n3 is an integer from 0 to 5, wherein $Q_1$ and $Q_2$ are each independently selected from hydrogen, deuterium, -F,-Cl,-Br,-I, a hydroxyl group, a cyano group, a nitro group, an amino group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group, and

* and *' each indicate a binding site to a neighboring atom, and wherein at least one $Z_3$ from among a number of a3 is *—O—*, *—C(=O)—*', *—C(=O)O—*', *—OC(=O)—*', *—O—C(=O)—O—*', *—OCH$_2$—*', *—SCH$_2$—*', *—CH$_2$S—*', *—CF$_2$O—*', *—OCF$_2$—*, *—CF$_2$S—*', *—SCF$_2$—*', *—CF$_2$CH$_2$—*, *—CH$_2$CF$_2$—*', *—(CF$_2$)$_{n1}$—*, *—CH=CH—*', *—CF=CF—*', *—C≡C—*', *—CH=CH—C(=O)O—*, *—OC(=O)—CH=CH—*, *—O—(CH$_2$)—O (C=O)—(CH$_2$)$_{n2}$—*, or *—C(Q$_1$)(Q$_2$)—*', wherein $Q_1$ and $Q_2$ are not a cyano group.

2. The quantum dot-containing material of claim 1, wherein Ra is selected from —COOH, —PO$_3$H, —SH, and a group represented by one of Formulae 3-1 to 3-1

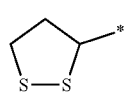

3-2

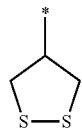

3-3

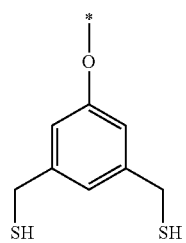

3-4

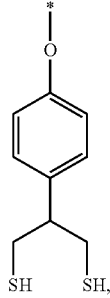

and wherein, in Formulae 3-1 to 3-4,

* indicates a binding site to a neighboring atom.

3. The quantum dot-containing material of claim 1, wherein $Z_1$ is *—(CH$_2$)$_{n1}$—*'.

4. The quantum dot-containing material of claim 1, wherein $Z_2$ and $Z_3$ are each independently *—O—*', *—C(=O)O—*', *—OC(=O)—*', *—(CH$_2$)$_{n1}$—*', or *—C(CH$_3$)CN—*'.

5. The quantum dot-containing material of claim 1, wherein *—(Z$_2$)$_{a2}$—*' and *—(Z$_3$)$_{a3}$—*' are each independently a group represented by one of Formulae 4-1 to 4-4:

4-1

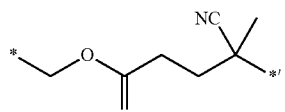

4-2

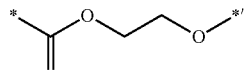

4-3

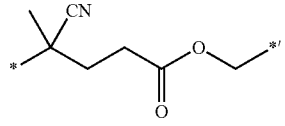

4-4

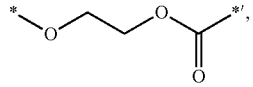

and wherein, in Formulae 4-1 to 4-4,

* and *' each indicate a binding site to a neighboring atom.

6. A quantum dot-containing material comprising:

a quantum dot; and at least one ligand chemically bonded to a surface of the quantum dot, wherein the ligand is represented by Formula 1A or 1B:

Formula 1A

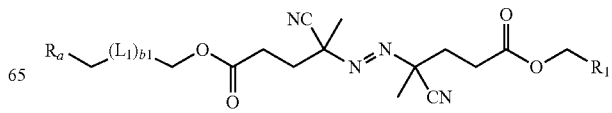

-continued

Formula 1B

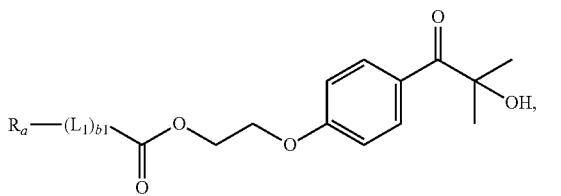

and wherein, in Formulae 1A and 1B, $R_a$, $L_1$, b1, and $R_1$ are the same as described in connection with Formula 1.

7. The quantum dot-containing material of claim 1, wherein the ligand comprises two or more ligands, and the two or more ligands are identical to or different from each other.

8. The quantum dot-containing material of claim 1, wherein the ligand is chemically bonded to the surface of the quantum dot through the anchoring group.

9. The quantum dot-containing material of claim 1, wherein the quantum dot is: a semiconductor nanoparticle; a particle having a core-shell structure comprising a core comprising a first semiconductor and a shell comprising a second semiconductor; or a perovskite compound.

10. The quantum dot-containing material of claim 9, wherein the semiconductor nanoparticle, the first semiconductor, and the second semiconductor each independently comprise a Group 10 compound, a Group 11 compound, a Group 12-16 compound, a Group 13-15 compound, a Group 14-16 compound, a Group 14 compound, a Group Nov. 13, 2016 compound, a Group Nov. 12, 2013-16 compound, or a combination thereof.

11. The quantum dot-containing material of claim 9, wherein the semiconductor nanoparticle, the first semiconductor, and the second semiconductor each independently comprise:

Au, Pd, or Ag;

CdS, CdSe, CdTe, ZnS, ZnSe, ZnTe, ZnO, HgS, HgSe, HgTe, MgS, MgSe;

CdSeS, CdSeTe, CdالسTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnS, MgZnSe; CdZnSeS, CdZnSeTe, CdZnSTe, CdHgSeS, CdHgSeTe, CdHgSTe, HgZnSeS, HgZnSeTe, or HgZnSTe;

GaN, GaP, GaAs, GaSb, AlN, AlP, AlAs, AlSb, InN, InP, InAs, InSb; GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP; GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or InZnP;

SnS, SnSe, SnTe, PbS, PbSe, PbTe; SnSeS, SnSeTe, SnSTe, PbSeS, PbSeTe, PbSTe, SnPbS, SnPbSe, SnPbTe; SnPbSSe, SnPbSeTe, or SnPbSTe;

Si, Ge, SiC, or SiGe;

$AgInS$, $AgInS_2$, $CuInS$, $CuInS_2$, $CuGaO_2$, $AgGaO_2$, or $AgAlO_2$; or any combination thereof.

12. The quantum dot-containing material of claim 1, wherein an average particle diameter (D50) of the quantum dot is from about 2 nm to about 10 nm.

13. A composition comprising:

the quantum dot-containing material of claim 1; and at least one solvent.

14. The composition of claim 13, further comprising a monomer comprising at least one double bond.

15. The composition of claim 13, wherein the composition does not include an initiator.

16. An electronic apparatus comprising the quantum dot-containing material of claim 1.

17. The electronic apparatus of claim 16, further comprising a light-emitting device comprising:

a first electrode, a second electrode facing the first electrode, and an emission layer between the first electrode and the second electrode, wherein the quantum dot-containing material is comprised in the emission layer.

18. The electronic apparatus of claim 16, further comprising a light source, wherein the quantum dot-containing material is located on a path of light emitted from the light source.

19. The electronic apparatus of claim 18, further comprising a color conversion layer, wherein the color conversion layer comprises the quantum dot-containing material.

20. The electronic apparatus of claim 18, wherein the light source is an organic light-emitting device (OLED) or a light-emitting diode (LED).

* * * * *